United States Patent
Han et al.

(10) Patent No.: US 12,116,379 B2
(45) Date of Patent: Oct. 15, 2024

(54) COMPOUND AND ORGANIC LIGHT EMITTING DIODE COMPRISING SAME

(71) Applicant: LG CHEM, LTD., Seoul (KR)

(72) Inventors: Sihyun Han, Daejeon (KR); Sang Young Jeon, Daejeon (KR); Wanpyo Hong, Daejeon (KR); Jin Joo Kim, Daejeon (KR); Sujeong Geum, Daejeon (KR); Kyunghee Kim, Daejeon (KR)

(73) Assignee: LG Chem, Ltd., Seoul (KR)

( * ) Notice: Subject to any disclaimer, the term of this patent is extended or adjusted under 35 U.S.C. 154(b) by 698 days.

(21) Appl. No.: 17/312,365

(22) PCT Filed: Dec. 26, 2019

(86) PCT No.: PCT/KR2019/018486
§ 371 (c)(1),
(2) Date: Jun. 9, 2021

(87) PCT Pub. No.: WO2020/138963
PCT Pub. Date: Jul. 2, 2020

(65) Prior Publication Data
US 2022/0017545 A1 Jan. 20, 2022

(30) Foreign Application Priority Data
Dec. 27, 2018 (KR) ........................ 10-2018-0170802

(51) Int. Cl.
*H10K 85/40* (2023.01)
*C07F 7/08* (2006.01)
*H10K 85/60* (2023.01)
*H10K 50/11* (2023.01)
*H10K 50/15* (2023.01)
*H10K 50/17* (2023.01)
*H10K 101/10* (2023.01)

(52) U.S. Cl.
CPC ........... *C07F 7/0816* (2013.01); *H10K 85/40* (2023.02); *H10K 85/622* (2023.02); *H10K 85/636* (2023.02); *H10K 85/6572* (2023.02); *H10K 50/11* (2023.02); *H10K 50/15* (2023.02); *H10K 50/17* (2023.02); *H10K 2101/10* (2023.02)

(58) Field of Classification Search
None
See application file for complete search history.

(56) References Cited

U.S. PATENT DOCUMENTS

| 2015/0236274 | A1* | 8/2015 | Hatakeyama | ........ H10K 85/322 548/405 |
|---|---|---|---|---|
| 2018/0019415 | A1 | 1/2018 | Nakano et al. | |
| 2018/0094000 | A1 | 4/2018 | Hatakeyama et al. | |
| 2018/0287090 | A1 | 10/2018 | Sato et al. | |
| 2018/0301629 | A1 | 10/2018 | Hatakeyama et al. | |
| 2019/0115538 | A1* | 4/2019 | Lim | ........ H10K 85/626 |
| 2019/0207112 | A1 | 7/2019 | Hatakeyama et al. | |
| 2020/0058885 | A1 | 2/2020 | Hong et al. | |
| 2020/0161552 | A1* | 5/2020 | Joo | ........ C09K 11/06 |
| 2020/0176679 | A1 | 6/2020 | Jeong et al. | |
| 2020/0185626 | A1* | 6/2020 | Yuuki | ........ C07F 7/0814 |
| 2020/0381634 | A1* | 12/2020 | Baek | ........ H10K 85/322 |
| 2021/0317147 | A1 | 10/2021 | Hong et al. | |
| 2021/0403490 | A1* | 12/2021 | Lee | ........ H10K 85/636 |
| 2021/0408390 | A1* | 12/2021 | Lee | ........ H10K 85/658 |
| 2023/0008756 | A1* | 1/2023 | Shin | ........ H10K 99/00 |

FOREIGN PATENT DOCUMENTS

| CN | 112585145 | 3/2021 |
|---|---|---|
| CN | 113015737 | 6/2021 |
| KR | 10-2017-0130434 A | 11/2017 |
| KR | 10-2017-0130435 A | 11/2017 |
| KR | 10-2018-0007727 A | 1/2018 |
| KR | 10-1876763 B1 | 7/2018 |
| KR | 10-2018-0112152 A | 10/2018 |
| KR | 10-2018-0122298 A | 11/2018 |
| KR | 10-2018-0127918 A | 11/2018 |
| WO | 2017/188111 A1 | 11/2017 |

* cited by examiner

*Primary Examiner* — Robert S Loewe
(74) *Attorney, Agent, or Firm* — Bryan Cave Leighton Paisner LLP

(57) ABSTRACT

A compound of Formula 1 and an organic light emitting device including the same.

9 Claims, 1 Drawing Sheet

[Figure 1]
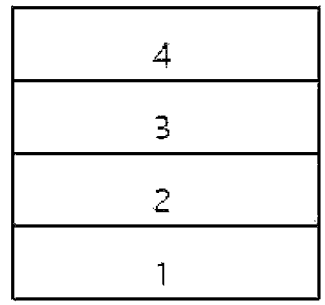
[Figure 2]
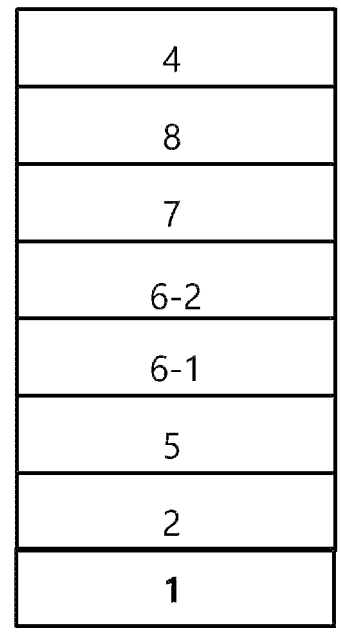

COMPOUND AND ORGANIC LIGHT EMITTING DIODE COMPRISING SAME

CROSS-REFERENCE TO RELATED APPLICATIONS

This application is a U.S. national stage of international Application No. PCT/KR2019/018486 filed Dec. 26, 2019, and which claims priority to and the benefit of Korean Patent Application No. 10-2018-0170802 filed in the Korean Intellectual Property Office on Dec. 27, 2018, the entire contents of which are incorporated herein by reference.

TECHNICAL FIELD

The present specification relates to a compound and an organic light emitting device including the same.

BACKGROUND

An organic light emitting device is a light emitting device using an organic semiconductor material, and requires an exchange of holes and/or electrons between electrodes and organic semiconductor materials. The organic light emitting device can be roughly divided into two-types of light emitting devices as described herein depending on the operation principle thereof. A first organic light emitting device is a light emitting device in which an exciton is formed in an organic material layer by a photon that flows from an external light source to the device, the exciton is separated into electrons and holes, and the electrons and the holes are each transferred to different electrodes and used as an electric current source (voltage source). A second organic light emitting device is a light emitting device in which holes and/or electrons are injected into organic semiconductor material layers forming an interface with an electrode by applying a voltage or current to two or more electrodes, and the device is operated by the injected electrons and holes.

In general, an organic light emitting phenomenon refers to a phenomenon in which electric energy is converted into light energy by using an organic material. An organic light emitting device using the organic light emitting phenomenon typically has a structure including a positive electrode, a negative electrode, and an organic material layer disposed therebetween. Here, the organic material layer has in many cases a multi-layered structure composed of different materials to improve the efficiency and stability of the organic light emitting device, and for example, may be composed of a hole injection layer, a hole transport layer, a light emitting layer, an electron blocking layer, an electron transport layer, an electron injection layer, and the like. In the structure of the organic light emitting device, if a voltage is applied between the two electrodes, holes are injected from the positive electrode into the organic material layer and electrons are injected from the negative electrode into the organic material layer, and when the injected holes and electrons meet each other, an exciton is formed, and light is emitted when the exciton falls back to a ground state. Such an organic light emitting device has been known to have characteristics such as self-emission, high brightness, high efficiency, a low driving voltage, a wide viewing angle, and high contrast.

In an organic light emitting device, materials used as an organic material layer can be classified into a light emitting material and a charge transport material, for example, a hole injection material, a hole transport material, an electron blocking material, an electron transport material, an electron injection material, and the like, depending on the function thereof. The light emitting materials include blue, green, and red light emitting materials according to the light emitting color, and yellow and orange light emitting materials required for implementing an enhanced natural color.

Furthermore, a host/dopant system can be used as a light emitting material for the purpose of enhancing color purity and light emitting efficiency through energy transfer. The principle is that when a small amount of dopant, which has a smaller energy band gap and better light emitting efficiency than those of a host mainly constituting a light emitting layer, is mixed with the light emitting layer, the excitons generated by the host are transported to the dopant to emit light with high efficiency. In this case, it is possible to obtain light with a desired wavelength according to the type of dopant used because the wavelength of the host moves to the wavelength range of the dopant.

In order to fully exhibit the above-described excellent characteristics of the organic light emitting device, a material constituting an organic material layer in a device, for example, a hole injection material, a hole transport material, a light emitting material, an electron blocking material, an electron transport material, an electron injection material, and the like, need to be supported by stable and efficient materials, so that there is a continuous need for developing a new material.

SUMMARY

The present specification describes a compound and an organic light emitting device including the same.

An exemplary embodiment of the present specification provides a compound of Formula 1:

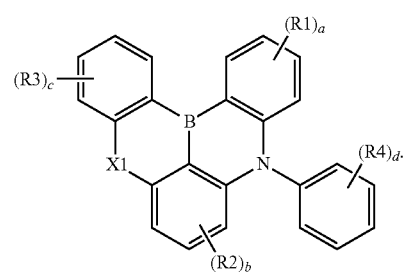

[Formula 1]

In Formula 1,

X1 is NR, O, SiR'R", S, or CR5R6,

R1 to R4 are each independently hydrogen; deuterium; a halogen group; a substituted or unsubstituted alkyl group; a substituted or unsubstituted cycloalkyl group; a substituted or unsubstituted amine group; a substituted or unsubstituted aryl group; or a substituted or unsubstituted heterocyclic group, or can be each independently bonded to an adjacent group to form a substituted or unsubstituted ring, R, R', and R" are each independently a substituted or unsubstituted alkyl group; a substituted or unsubstituted aryl group; or a substituted or unsubstituted heterocyclic group, or can be each independently bonded to an adjacent group to form a substituted or unsubstituted ring, R5 and R6 are each independently a substituted or unsubstituted aryl group, or can be each independently bonded to an adjacent group to form a substituted or unsubstituted ring, a and c are each independently an integer from 0 to 4, b is an integer from 0 to 3, d is an integer from 0 to 5, with the proviso that when a to d are each independently an integer of 2 or higher, substituents in the parenthesis are the same as or different from each other, and with the proviso that X1 is SiR'R", or when X1 is NR, O, S, or CR5R6, R1 to R6 and R are bonded to an adjacent group to form a substituted or unsubstituted ring including Si.

Another exemplary embodiment provides an organic light emitting device including: a first electrode; a second electrode provided to face the first electrode; and an organic material layer having one or more layers provided between the first electrode and the second electrode, in which one or more layers of the organic material layer include the above-described compound.

A compound of Formula 1 may be used as a material for an organic material layer of an organic light emitting device.

An organic light emitting device having high efficiency, low voltage, and long service life characteristics can be manufactured when the compound of Formula 1 is used as a material of the organic material layer.

BRIEF DESCRIPTION OF DRAWINGS

FIG. 1 illustrates a structure of an organic light emitting device according to an exemplary embodiment.

FIG. 2 illustrates a structure of an organic light emitting device according to another exemplary embodiment.

REFERENCE NUMERALS AND SYMBOLS USED HEREIN

1: Substrate
2: Positive electrode
3: Light emitting layer
4: Negative electrode
5: Hole injection layer
6-1: First hole transport layer
6-2: Second hole transport layer
7: Light emitting layer
8: Layer which simultaneously injects and transports electrons

DETAILED DESCRIPTION

Hereinafter, the present specification will be described in more detail.

The present specification is directed to the compound of Formula 1.

When one part "includes" one constituent element in the present specification, unless otherwise specifically described, this does not mean that another constituent element is excluded, but means that another constituent element can be further included.

When one member is disposed "on" another member in the present specification, this includes not only a case where the one member is brought into contact with another member, but also a case where still another member is present between the two members.

Examples of the substituents in the present specification will be described below, but are not limited thereto.

The term "substitution" means that a hydrogen atom bonded to a carbon atom of a compound is changed into another substituent, and a position to be substituted is not limited as long as the position is a position at which the hydrogen atom is substituted, that is, a position at which the substituent can be substituted, and when two or more are substituted, the two or more substituents may be the same as or different from each other.

In the present specification, the term "substituted or unsubstituted" means being substituted with one or two or more substituents selected from the group consisting of deuterium (-D); a halogen group; a nitrile group; a nitro group; an amine group; a hydroxyl group; a silyl group; a boron group; an alkoxy group; an alkyl group; a cycloalkyl group; an aryl group; and a heterocyclic group, being substituted with a substituent to which two or more substituents among the above-exemplified substituents are linked, or having no substituent. For example, "the substituent to which two or more substituents are linked" may be a biphenyl group. That is, the biphenyl group may also be an aryl group, and can be interpreted as a substituent to which two phenyl groups are linked.

Examples of the substituents will be described below, but are not limited thereto.

In the present specification, examples of a halogen group include fluorine (—F), chlorine (—Cl), bromine (—Br) or iodine (—I).

In the present specification, a silyl group can be represented by a formula of —$SiY_aY_bY_c$, and each of $Y_a$, $Y_b$, and $Y_c$ may be independently hydrogen; a substituted or unsubstituted alkyl group; or a substituted or unsubstituted aryl group. Specific examples of the silyl group include a trimethylsilyl group, a triethylsilyl group, a tert-butyldimethylsilyl group, a vinyldimethylsilyl group, a propyldimethylsilyl group, a triphenylsilyl group, a diphenylsilyl group, a phenylsilyl group, and the like, but are not limited thereto.

In the present specification, a boron group can be represented by a formula of —$BY_dY_e$, and each of $Y_d$ and $Y_e$ may be independently hydrogen; a substituted or unsubstituted alkyl group; or a substituted or unsubstituted aryl group. Specific examples of the boron group include a trimethylboron group, a triethylboron group, a tert-butyldimethylboron group, a triphenylboron group, a phenylboron group, and the like, but are not limited thereto.

In the present specification, the alkyl group may be straight-chained or branched, and the number of carbon atoms thereof is not particularly limited, but is preferably 1 to 60. According to an exemplary embodiment, the number of carbon atoms of the alkyl group is 1 to 30. According to another exemplary embodiment, the number of carbon atoms of the alkyl group is 1 to 20. According to still another exemplary embodiment, the number of carbon atoms of the alkyl group is 1 to 10. Specific examples of the alkyl group include a methyl group, an ethyl group, a propyl group, an n-propyl group, an isopropyl group, a butyl group, an n-butyl group, an isobutyl group, a tert-butyl group, a pentyl group, an n-pentyl group, a hexyl group, an n-hexyl group, a heptyl group, an n-heptyl group, an octyl group, an n-octyl group, and the like, but are not limited thereto.

In the present specification, the alkoxy group may be straight-chained, branched, or cyclic. The number of carbon atoms of the alkoxy group is not particularly limited, but is preferably 1 to 20. Specific examples thereof include methoxy, ethoxy, n-propoxy, isopropoxy, i-propyloxy, n-butoxy, isobutoxy, tert-butoxy, sec-butoxy, n-pentyloxy, neo-pentyloxy, isopentyloxy, n-hexyloxy, 3,3-dimethylbutyloxy, 2-ethylbutyloxy, n-octyloxy, n-nonyloxy, n-decyloxy, and the like, but are not limited thereto.

Substituents including an alkyl group, an alkoxy group, and other alkyl group moieties described in the present specification include both a straight-chained form and a branched form.

In the present specification, a cycloalkyl group is not particularly limited, but has preferably 3 to 60 carbon atoms, and according to an exemplary embodiment, the number of carbon atoms of the cycloalkyl group is 3 to 30. According to another exemplary embodiment, the number of carbon atoms of the cycloalkyl group is 3 to 20. According to still another exemplary embodiment, the number of carbon atoms of the cycloalkyl group is 3 to 6. Specific examples thereof include a cyclopropyl group, a cyclobutyl group, a cyclopentyl group, a cyclohexyl group, a cycloheptyl group, a cyclooctyl group, and the like, but are not limited thereto.

In the present specification, an aryl group is not particularly limited, but has preferably 6 to 60 carbon atoms, and may be a monocyclic aryl group or a polycyclic aryl group. According to an exemplary embodiment, the number of carbon atoms of the aryl group is 6 to 39. According to an exemplary embodiment, the number of carbon atoms of the aryl group is 6 to 30. Examples of the monocyclic aryl group include a phenyl group, a biphenyl group, a terphenyl group, a quarterphenyl group, and the like, but are not limited thereto. Examples of the polycyclic aryl group include a naphthyl group, an anthracenyl group, a phenanthrenyl group, a pyrenyl group, a perylenyl group, a triphenyl group, a chrysenyl group, a fluorenyl group, a triphenylenyl group, and the like, but are not limited thereto.

In the present specification, a fluorene group can be substituted, and two substituents can be bonded to each other to form a Spiro structure.

When the fluorene group is substituted, the fluorene group may be a spirofluorene group such as

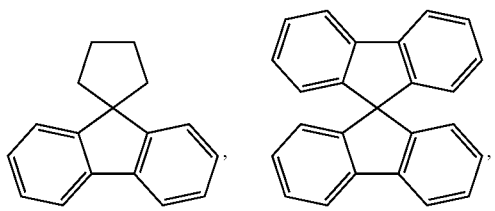

and a substituted fluorene group such as

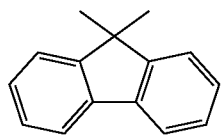

(a 9,9-dimethylfluorene group) and

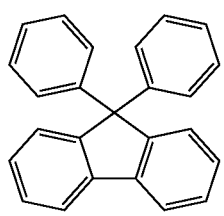 [SMILES: c1ccc(C2(c3ccccc3)c3ccccc3-c3ccccc32)cc1]

(a 9,9-diphenylfluorene group). However, the substituent is not limited thereto.

In the present specification, a heterocyclic group is a cyclic group including one or more of N, O, P, S, Si, and Se as a heteroatom, and the number of carbon atoms thereof is not particularly limited, but is preferably 2 to 60. According to an exemplary embodiment, the number of carbon atoms of the heterocyclic group is 2 to 36. Examples of the heterocyclic group include a pyridine group, a pyrrole group, a pyrimidine group, a quinoline group, a pyridazine group, a furan group, a thiophene group, an imidazole group, a pyrazole group, a dibenzofuran group, a dibenzothiophene group, a carbazole group, a benzocarbazole group, a benzonaphthofuran group, a benzonaphthothiophene group, an indenocarbazole group, an indolocarbazole group, and the like, but are not limited thereto.

In the present specification, the above-described definition of the heterocyclic group can be applied to a heteroaryl group except for an aromatic heteroaryl group.

In the present specification, an amine group may be selected from the group consisting of —NH₂; an alkylamine group; an N-alkylarylamine group; an arylamine group; an N-arylheteroarylamine group; an N-alkylheteroarylamine group; and a heteroarylamine group, and the number of carbon atoms thereof is not particularly limited, but is preferably 1 to 30. Specific examples of the amine group include a methylamine group, a dimethylamine group, an ethylamine group, a diethylamine group, a phenylamine group, a naphthylamine group, a biphenylamine group, an anthracenylamine group, a 9-methyl-anthracenylamine group, a diphenylamine group, an N-phenylnaphthylamine group, a ditolylamine group, an N-phenyltolylamine group, a triphenylamine group, an N-phenylbiphenylamine group, an N-phenylnaphthylamine group, an N-biphenylnaphthylamine group, an N-naphthylfluorenylamine group, an N-phenylphenanthrenylamine group, an N-biphenylphenanthrenylamine group, an N-phenylfluorenylamine group, an N-phenyl terphenylamine group, an N-phenanthrenylfluorenylamine group, an N-biphenylfluorenylamine group, and the like, but are not limited thereto.

In the present specification, an N-alkylarylamine group means an amine group in which an alkyl group and an aryl group are substituted with N of the amine group. In the present specification, an N-arylheteroarylamine group means an amine group in which an aryl group and a heteroaryl group are substituted with N of the amine group.

In the present specification, an N-alkylheteroarylamine group means an amine group in which an alkyl group and a heteroaryl group are substituted with N of the amine group.

In the present specification, an alkyl group, an aryl group, and a heteroaryl group in an alkylamine group; an N-alkylarylamine group; an arylamine group; an N-arylheteroarylamine group; an N-alkylheteroarylamine group, and a heteroarylamine group are each the same as the above-described examples of the alkyl group, the aryl group, and the heteroaryl group.

In the present specification, in a substituted or unsubstituted ring formed by being bonded to an adjacent group, the "ring" means a hydrocarbon ring; or a hetero ring.

The hydrocarbon ring can be an aromatic ring, an aliphatic ring, or a fused ring of the aromatic ring and the aliphatic ring, and may be selected from the examples of the cycloalkyl group or the aryl group, except for the divalent hydrocarbon ring.

The description of the heterocyclic group can be applied to the hetero ring except for a divalent hetero ring.

According to an exemplary embodiment of the present specification, X1 is NR, O, SiR'R", S, or CR5R6.

According to an exemplary embodiment of the present specification, X1 is NR.

According to an exemplary embodiment of the present specification, X1 is O.

According to an exemplary embodiment of the present specification, X1 is S.

According to an exemplary embodiment of the present specification, X1 is SiR'R".

According to an exemplary embodiment of the present specification, X1 is CR5R6.

According to an exemplary embodiment of the present specification, R1 to R4 are each independently hydrogen; deuterium; a halogen group; a substituted or unsubstituted alkyl group having 1 to 60 carbon atoms; a substituted or unsubstituted cycloalkyl group having 3 to 60 carbon atoms; a substituted or unsubstituted amine group; a substituted or unsubstituted aryl group having 6 to 60 carbon atoms; or a substituted or unsubstituted heterocyclic group having 2 to 60 carbon atoms, or may be each independently bonded to an adjacent group to form a substituted or unsubstituted ring.

According to an exemplary embodiment of the present specification, R1 to R4 are each independently hydrogen; deuterium; a halogen group; a substituted or unsubstituted alkyl group having 1 to 30 carbon atoms; a substituted or unsubstituted cycloalkyl group having 3 to 30 carbon atoms; a substituted or unsubstituted amine group; a substituted or unsubstituted aryl group having 6 to 30 carbon atoms; or a substituted or unsubstituted heterocyclic group having 2 to 30 carbon atoms, or may be each independently bonded to an adjacent group to form a substituted or unsubstituted ring.

According to an exemplary embodiment of the present specification, R1 to R4 are each independently hydrogen; deuterium; a halogen group; a substituted or unsubstituted alkyl group having 1 to 15 carbon atoms; a substituted or unsubstituted cycloalkyl group having 3 to 15 carbon atoms; a substituted or unsubstituted amine group; a substituted or unsubstituted aryl group having 6 to 15 carbon atoms; or a substituted or unsubstituted heterocyclic group having 2 to 15 carbon atoms, or may be each independently bonded to an adjacent group to form a substituted or unsubstituted ring.

According to an exemplary embodiment of the present specification, the substituted or unsubstituted amine group is an amine group which is unsubstituted or substituted with at least one selected from the group consisting of an alkyl group having 1 to 15 carbon atoms and an aryl group having 6 to 30 carbon atoms.

According to an exemplary embodiment of the present specification, R, R', and R" are each independently a substituted or unsubstituted alkyl group; a substituted or unsubstituted aryl group; or a substituted or unsubstituted heterocyclic group, or may be each independently each independently bonded to an adjacent group to form a substituted or unsubstituted ring.

According to an exemplary embodiment of the present specification, R, R', and R" are each independently a substituted or unsubstituted alkyl group having 1 to 60 carbon atoms; a substituted or unsubstituted aryl group having 6 to 60 carbon atoms; or a substituted or unsubstituted heterocyclic group having 2 to 60 carbon atoms, or may be each independently bonded to an adjacent group to form a substituted or unsubstituted ring.

According to an exemplary embodiment of the present specification, R, R', and R" are each independently a substituted or unsubstituted alkyl group having 1 to 30 carbon atoms; a substituted or unsubstituted aryl group having 6 to 30 carbon atoms; or a substituted or unsubstituted heterocyclic group having 2 to 30 carbon atoms, or may be each independently bonded to an adjacent group to form a substituted or unsubstituted ring.

According to an exemplary embodiment of the present specification, R, R', and R" are each independently a substituted or unsubstituted alkyl group having 1 to 15 carbon atoms; a substituted or unsubstituted aryl group having 6 to 15 carbon atoms; or a substituted or unsubstituted heterocyclic group having 2 to 15 carbon atoms, or may be each independently bonded to an adjacent group to form a substituted or unsubstituted ring.

According to an exemplary embodiment of the present specification, R, R', and R" are each independently a substituted or unsubstituted alkyl group having 1 to 15 carbon atoms; or a substituted or unsubstituted aryl group having 6 to 15 carbon atoms.

According to an exemplary embodiment of the present specification, R, R', and R" are each independently a substituted or unsubstituted aryl group having 6 to 15 carbon atoms.

According to an exemplary embodiment of the present specification, R5 and R6 are each independently a substituted or unsubstituted aryl group, or may be each independently bonded to an adjacent group to form a substituted or unsubstituted ring.

According to an exemplary embodiment of the present specification, R5 and R6 are each independently a substituted or unsubstituted aryl group having 6 to 60 carbon atoms, or may be each independently bonded to an adjacent group to form a substituted or unsubstituted ring.

According to an exemplary embodiment of the present specification, R5 and R6 are each independently a substituted or unsubstituted aryl group having 6 to 15 carbon atoms, or may be each independently bonded to an adjacent group to form a substituted or unsubstituted ring.

In the present specification, the "adjacent" group may mean a substituent substituted with an atom directly linked to an atom in which the corresponding substituent is substituted, a substituent disposed to be sterically closest to the corresponding substituent, or another substituent substituted with an atom in which the corresponding substituent is substituted. For example, two substituents substituted at the ortho position in a benzene ring and two substituents substituted with the same carbon in an aliphatic ring can be interpreted as groups which are "adjacent" to each other.

According to an exemplary embodiment of the present specification, when R1 to R6, R, R', and R" are each independently bonded to an adjacent group to form a substituted or unsubstituted ring, a direct bond; or any one of the following structures can be formed:

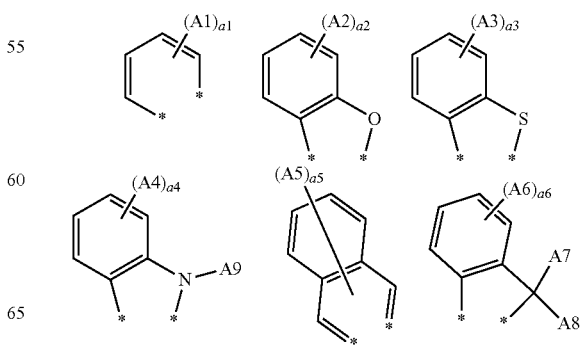

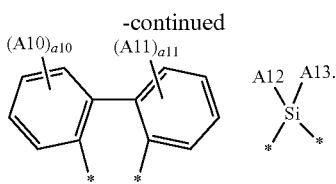
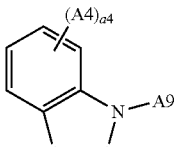
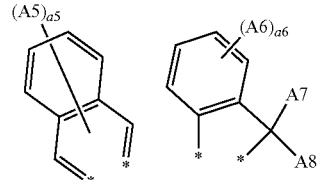

In the above-described structures,

A1 to A8 and A10 to A13 are each independently hydrogen; deuterium; a halogen group; a substituted or unsubstituted alkyl group; a substituted or unsubstituted cycloalkyl group; a substituted or unsubstituted amine group; a substituted or unsubstituted aryl group; or a substituted or unsubstituted heterocyclic group, A9 is hydrogen; deuterium; a halogen group; a substituted or unsubstituted alkyl group; a substituted or unsubstituted cycloalkyl group; a substituted or unsubstituted aryl group; or a substituted or unsubstituted heterocyclic group, a1 to a4, a6, a10, and a11 are each an integer from 0 to 4, a5 is an integer from 0 to 6, and

* denotes a position of a substituent.

According to an exemplary embodiment of the present specification, when a to d are each independently an integer of 2 or higher, substituents in parentheses are the same as or different from each other, and adjacent groups may be bonded to each other to form a substituted or unsubstituted ring. Specifically, a plurality of R1s may be bonded to each other to form a substituted or unsubstituted ring, a plurality of R2s may be bonded to each other to form a substituted or unsubstituted ring, and a plurality of R3s or R4s may be bonded to each other to form a substituted or unsubstituted ring, and adjacent R1 and R4 may be bonded to each other to form a substituted or unsubstituted ring, adjacent R2 and R4 may be bonded to each other to form a substituted or unsubstituted ring, or adjacent R1 and R3 may be bonded to each other to form a substituted or unsubstituted ring.

According to an exemplary embodiment of the present specification, when a and d are each independently an integer of 2 or higher, substituents in parentheses are the same as or different from each other, and adjacent groups may be bonded to each other to form a substituted or unsubstituted ring. That is, a plurality of R1s may be bonded to each other to form a substituted or unsubstituted ring, or a plurality of R4s may be bonded to each other to form a substituted or unsubstituted ring, and adjacent R1 and R4 may be bonded to each other to form a substituted or unsubstituted ring.

According to an exemplary embodiment of the present specification, when R1s are bonded to each other or R4s are bonded to each other to form a ring, or adjacent R1 and R4 are bonded to each other to form a substituted or unsubstituted ring, a direct bond or any one substituted or unsubstituted ring of the following structures can be formed:

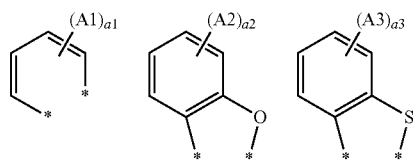

Definitions of the substituents of the above structures are the same as described earlier in this application.

According to an exemplary embodiment of the present specification, when R1s are bonded to each other or R4s are bonded to each other to form a substituted or unsubstituted ring, or adjacent R1 and R4 are bonded to each other to form a ring, a direct bond or any one substituted or unsubstituted ring of the following structures can be formed:

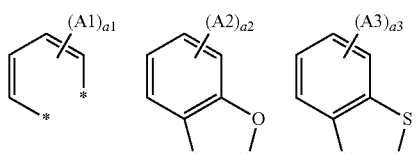

Definitions of the substituents in the above structures are the same as described earlier in this application.

According to an exemplary embodiment of the present specification, the compound of Formula 1 includes at least one Si.

According to an exemplary embodiment of the present specification, in the compound of Formula 1, X1 is SiR'R", or when X1 is not SiR'R", R1 to R6 and R are each independently bonded to an adjacent group to form a substituted or unsubstituted ring including Si. Specifically, X1 is SiR'R", or when X1 is NR, O, S, or CR5R6, R1 to R6 and R are each independently bonded to an adjacent group to form a substituted or unsubstituted ring including Si.

According to an exemplary embodiment of the present specification, in the compound of Formula 1, X1 is SiR'R", or when X1 is not SiR'R", R1 and R4 are bonded to each other to form a substituted or unsubstituted ring including Si. Specifically, X1 is SiR'R", or when X1 is NR, O, S, or CR5R6, adjacent groups of R1 and R4 are bonded to each other to form a substituted or unsubstituted ring including Si.

According to an exemplary embodiment of the present specification, Formula 1 is represented by the following Formula 2 or 3:

[Formula 2]

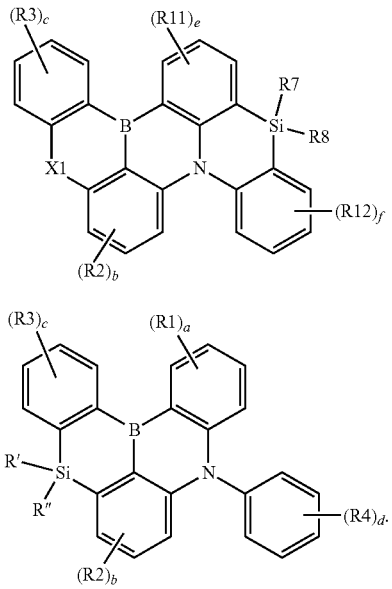

[Formula 3]

In Formulae 2 and 3,

R7 and R8 are each independently a substituted or unsubstituted alkyl group; a substituted or unsubstituted aryl group; or a substituted or unsubstituted heterocyclic group, or may be each independently bonded to an adjacent group to form a substituted or unsubstituted ring, R11 and R12 are each independently hydrogen; deuterium; a halogen group; a substituted or unsubstituted alkyl group; a substituted or unsubstituted cycloalkyl group; a substituted or unsubstituted amine group; a substituted or unsubstituted aryl group; or a substituted or unsubstituted heterocyclic group, or may be each independently bonded to an adjacent group to form a substituted or unsubstituted ring, e is an integer from 0 to 3, f is an integer from 0 to 4, and X1, R1 to R4, R', R", and a to d are the same as in Formula 1.

According to an exemplary embodiment of the present specification, R7 and R8 are each independently a substituted or unsubstituted alkyl group having 1 to 60 carbon atoms; a substituted or unsubstituted aryl group having 6 to 60 carbon atoms; or a substituted or unsubstituted heterocyclic group having 2 to 60 carbon atoms.

According to an exemplary embodiment of the present specification, R7 and R8 are each independently a substituted or unsubstituted alkyl group having 1 to 30 carbon atoms; a substituted or unsubstituted aryl group having 6 to 30 carbon atoms; or a substituted or unsubstituted heterocyclic group having 2 to 30 carbon atoms.

According to an exemplary embodiment of the present specification, R7 and R8 are each independently a substituted or unsubstituted alkyl group having 1 to 15 carbon atoms; a substituted or unsubstituted aryl group having 6 to 15 carbon atoms; or a substituted or unsubstituted heterocyclic group having 2 to 15 carbon atoms.

According to an exemplary embodiment of the present specification, R7 and R8 are each independently a substituted or unsubstituted aryl group having 6 to 15 carbon atoms.

According to an exemplary embodiment of the present specification, R11 and R12 are each independently hydrogen; deuterium; a halogen group; a substituted or unsubstituted alkyl group having 1 to 60 carbon atoms; a substituted or unsubstituted cycloalkyl group having 3 to 60 carbon atoms; a substituted or unsubstituted amine group; a substituted or unsubstituted aryl group having 6 to 60 carbon atoms; or a substituted or unsubstituted heterocyclic group having 2 to 60 carbon atoms, or may be each independently bonded to an adjacent group to form a substituted or unsubstituted ring.

According to an exemplary embodiment of the present specification, R11 and R12 are each independently hydrogen; deuterium; a halogen group; a substituted or unsubstituted alkyl group having 1 to 30 carbon atoms; a substituted or unsubstituted cycloalkyl group having 3 to 30 carbon atoms; a substituted or unsubstituted amine group; a substituted or unsubstituted aryl group having 6 to 30 carbon atoms; or a substituted or unsubstituted heterocyclic group having 2 to 30 carbon atoms, or may be each independently bonded to an adjacent group to form a substituted or unsubstituted ring.

According to an exemplary embodiment of the present specification, R11 and R12 are each independently hydrogen; deuterium; a halogen group; a substituted or unsubstituted alkyl group having 1 to 15 carbon atoms; a substituted or unsubstituted cycloalkyl group having 3 to 15 carbon atoms; a substituted or unsubstituted amine group; a substituted or unsubstituted aryl group having 6 to 15 carbon atoms; or a substituted or unsubstituted heterocyclic group having 2 to 15 carbon atoms, or may be each independently bonded to an adjacent group to form a substituted or unsubstituted ring.

According to an exemplary embodiment of the present specification, X1 of Formula 2 is NR, O, or S.

According to an exemplary embodiment of the present specification, X1 of Formula 2 is SiR'R", and R' and R" are each independently a substituted or unsubstituted alkyl group; a substituted or unsubstituted aryl group; or a substituted or unsubstituted heterocyclic group.

According to an exemplary embodiment of the present specification, X1 of Formula 2 is SiR'R", and R' and R" are each independently a substituted or unsubstituted aryl group.

According to an exemplary embodiment of the present specification, X1 of Formula 2 is CR5R6, and R5 and R6 are each independently a substituted or unsubstituted aryl group, or may be each independently bonded to an adjacent group to form a substituted or unsubstituted ring.

According to an exemplary embodiment of the present specification, X1 of Formula 2 is CR5R6, and R5 and R6 are each independently a substituted or unsubstituted aryl group, or may be each independently bonded to an adjacent group to form a ring:

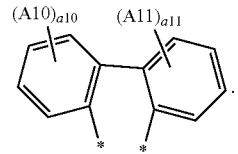

Here, A10 and A11 are each independently hydrogen; deuterium; a halogen group; a substituted or unsubstituted alkyl group; a substituted or unsubstituted cycloalkyl group; a substituted or unsubstituted amine group; a substituted or unsubstituted aryl group; or a substituted or unsubstituted heterocyclic group, a10 and a11 are each an integer from 0 to 4, and denotes a position where a substituent is substituted.

According to an exemplary embodiment of the present specification, R1 and R4 in Formula 3 are not bonded to each other to form a ring.

According to an exemplary embodiment of the present specification, Formula 1 may be represented by any one of the following compounds:

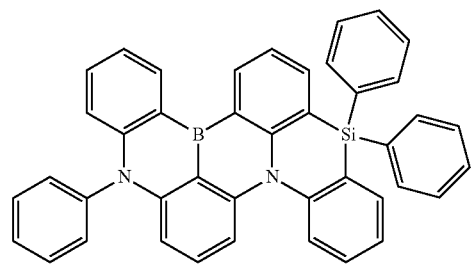

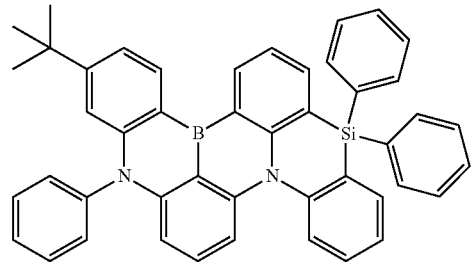

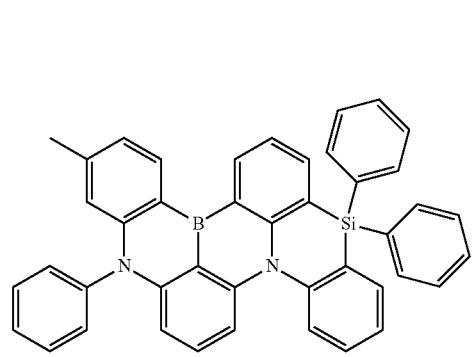

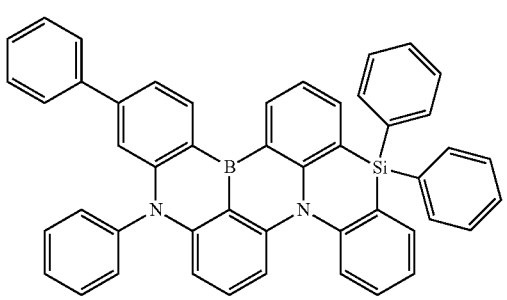

-continued

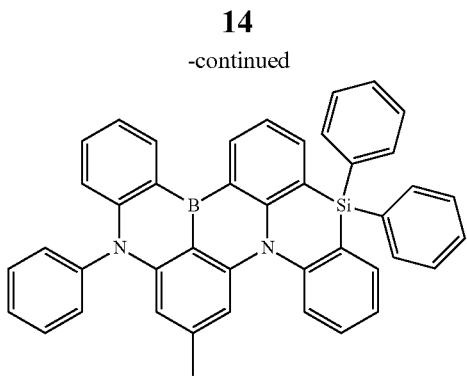

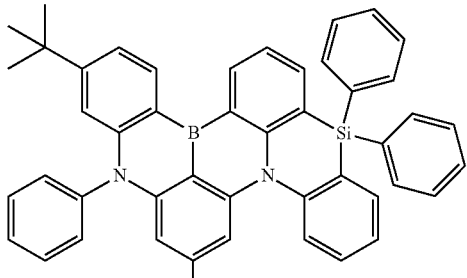

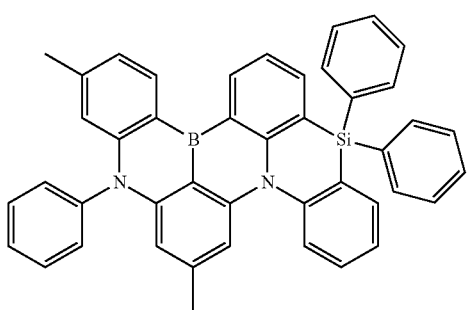

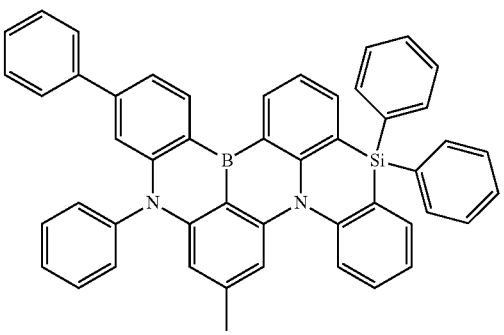

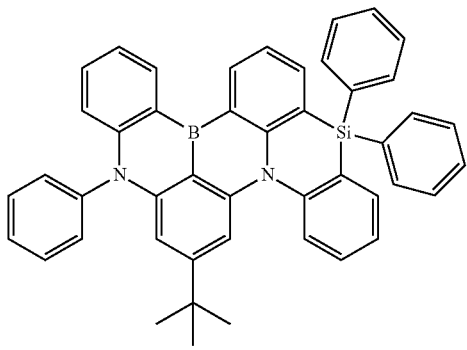

-continued
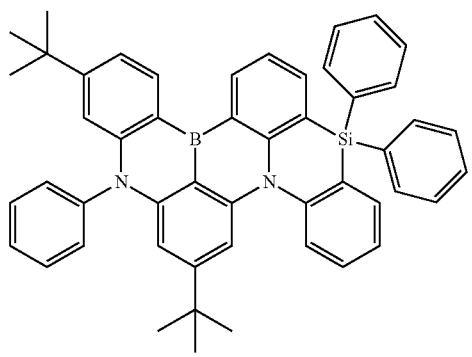
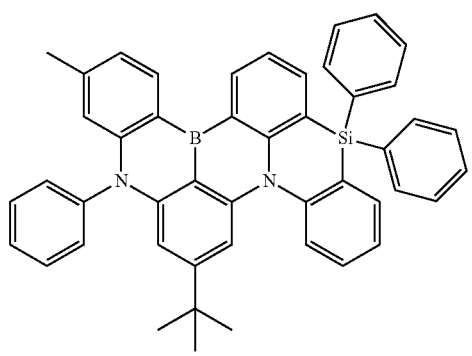
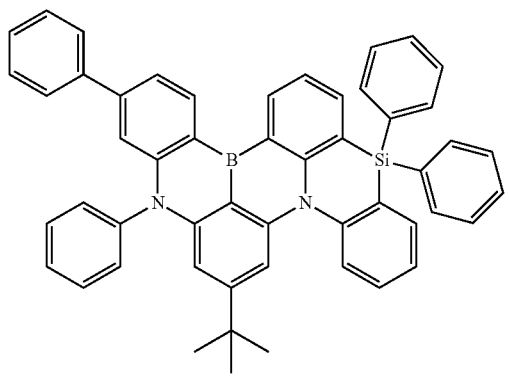
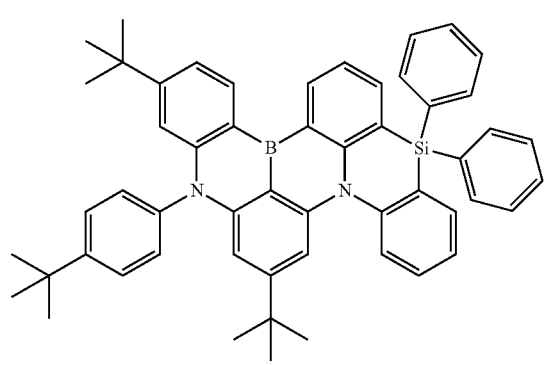
-continued
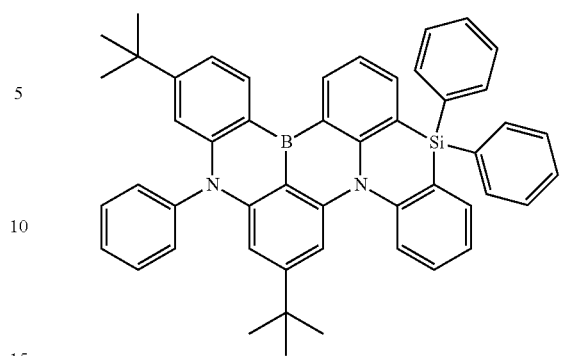
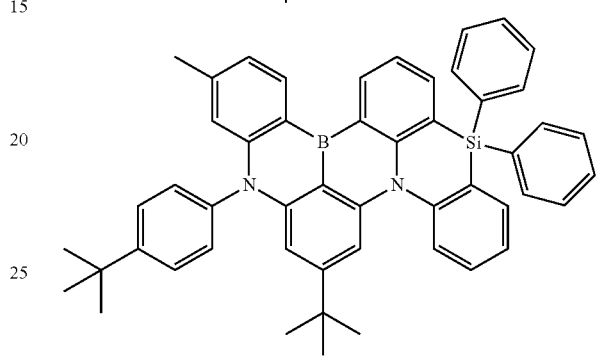
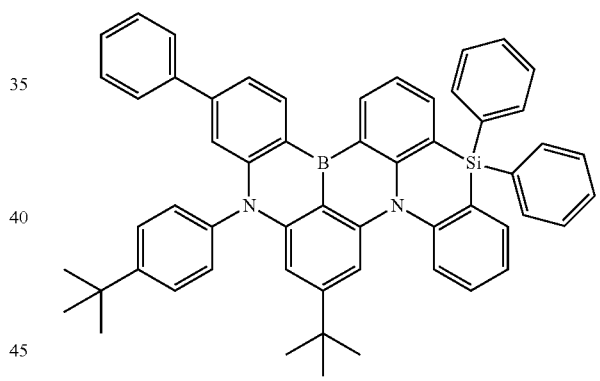
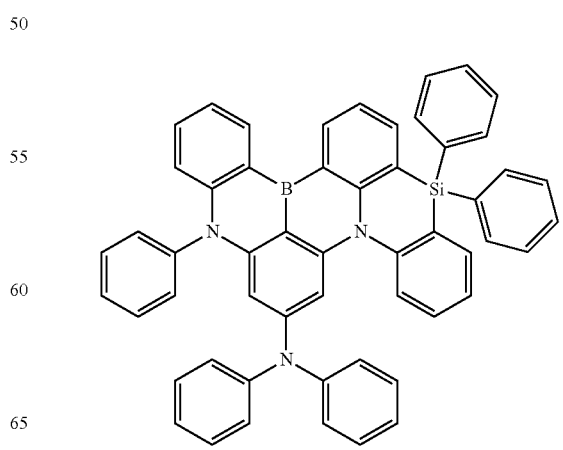

-continued
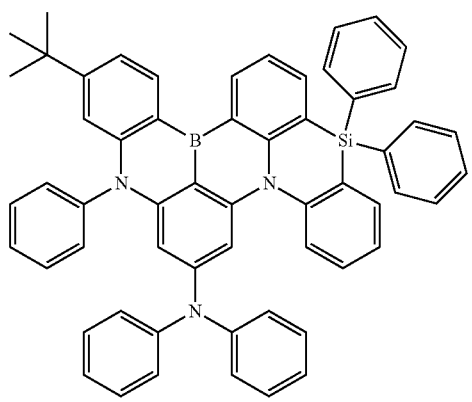
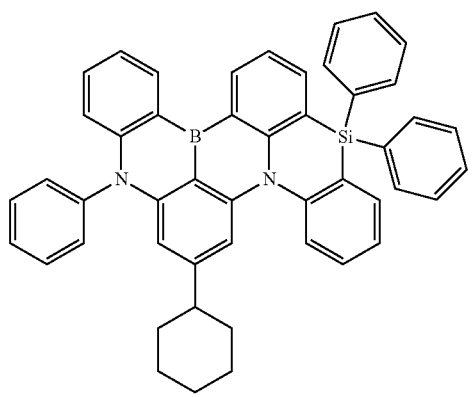
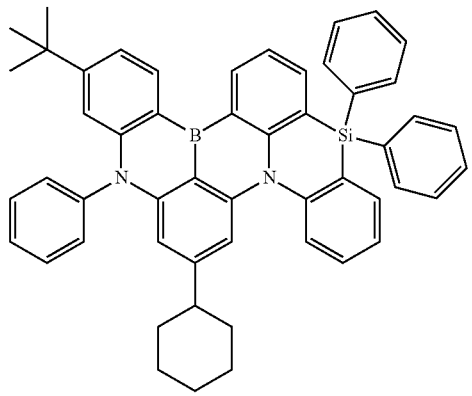
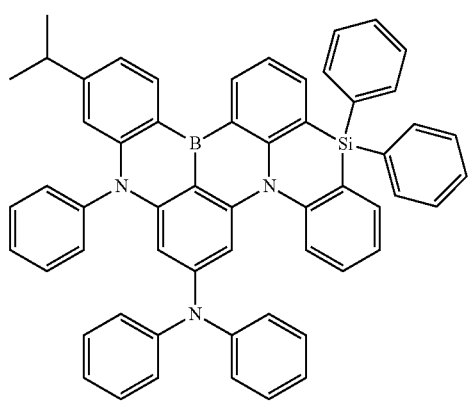
-continued
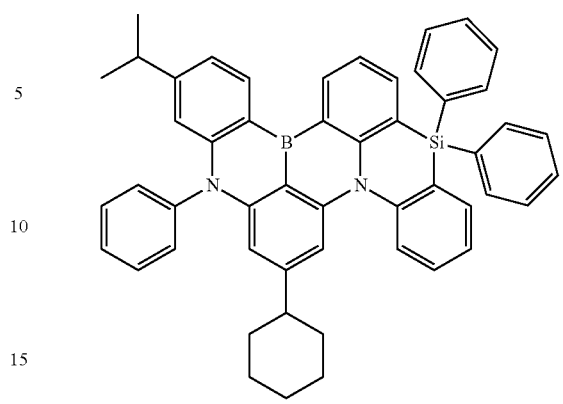
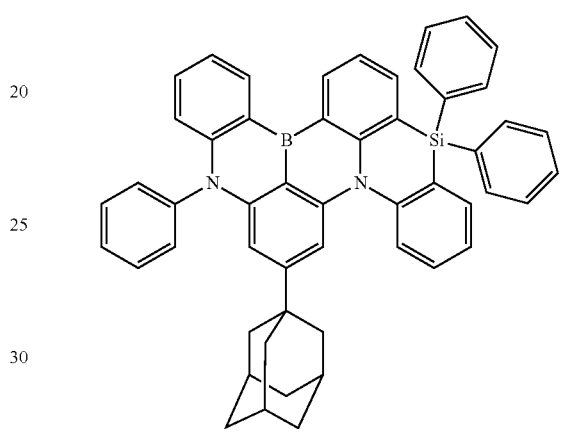
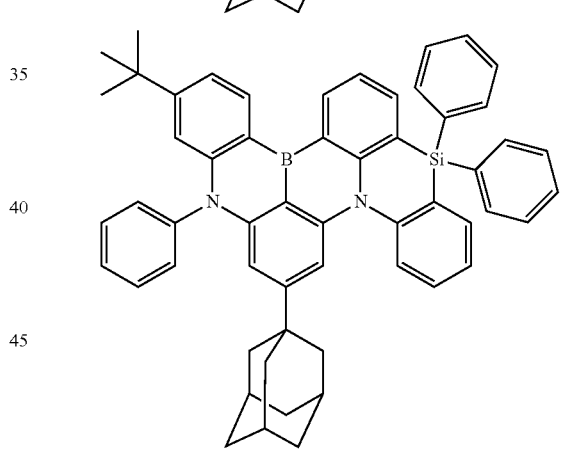
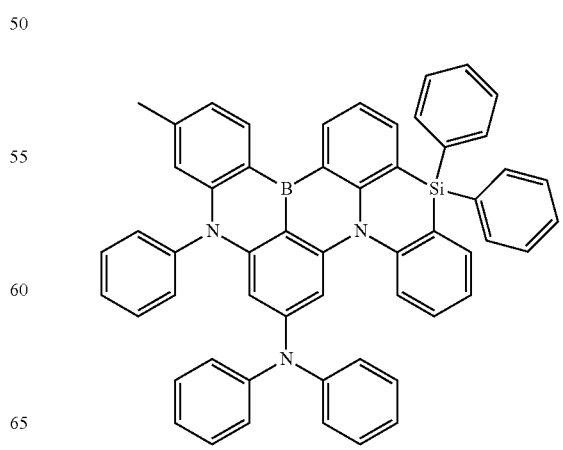

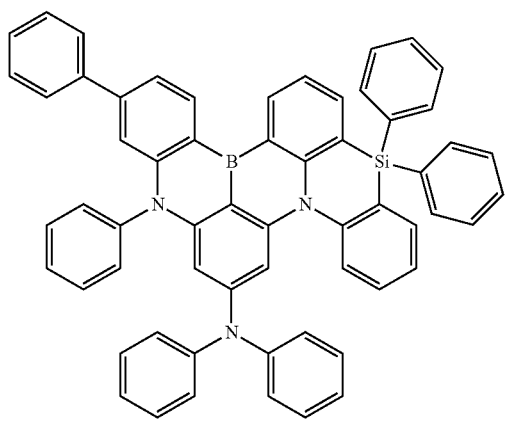
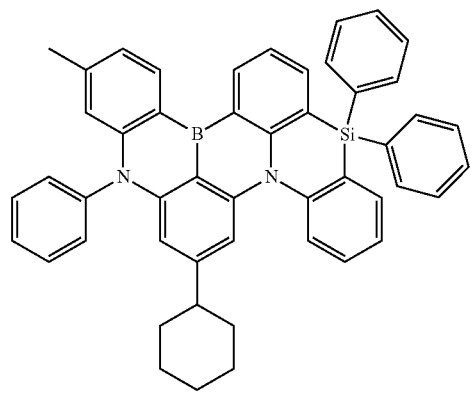
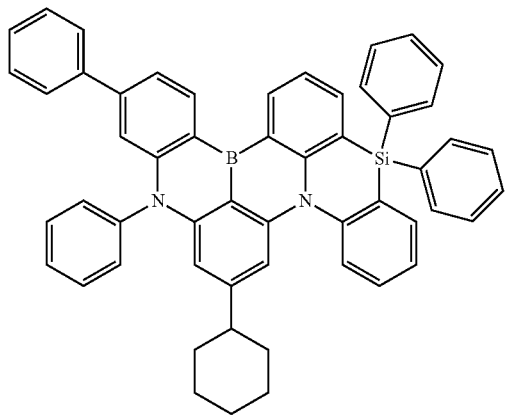
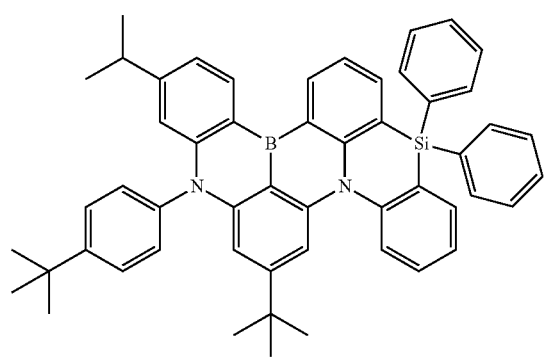
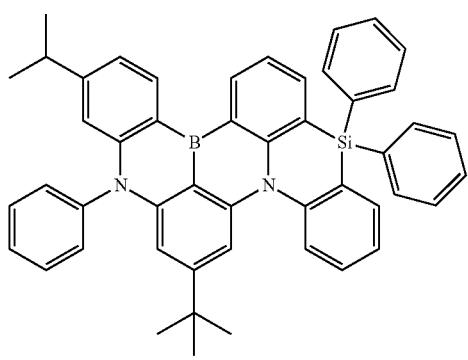
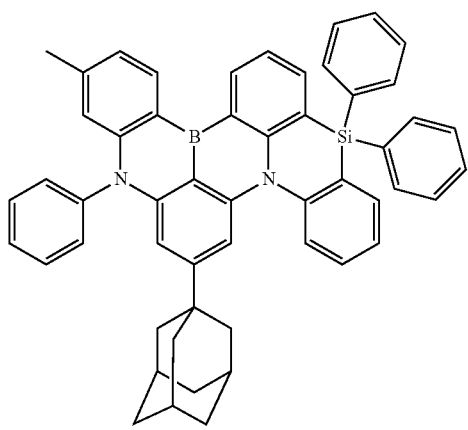
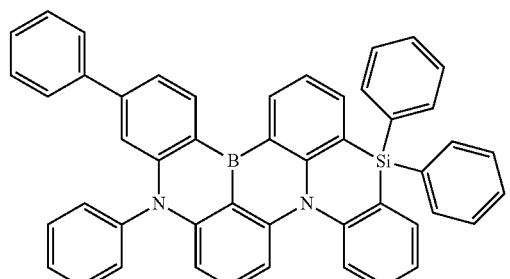
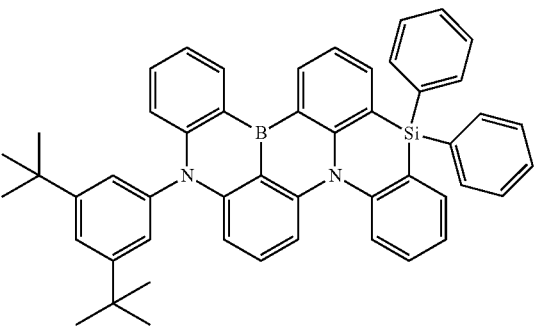

-continued
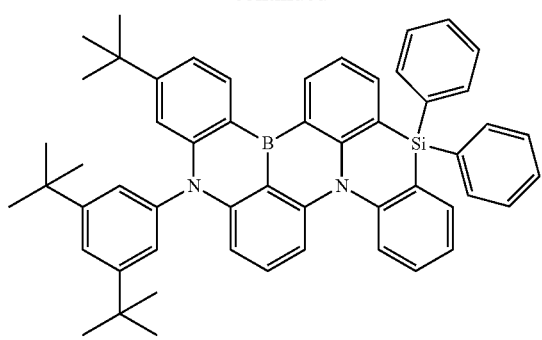
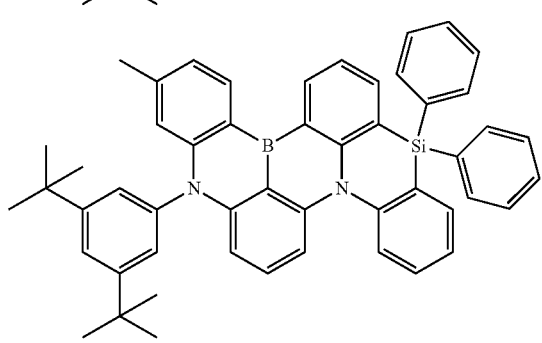
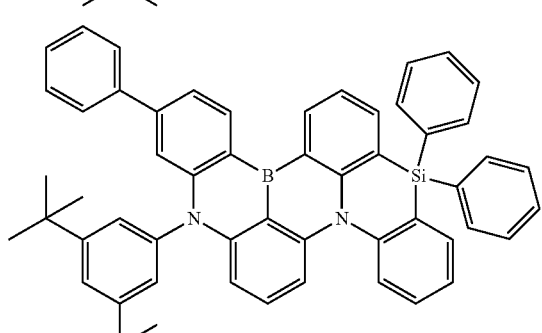
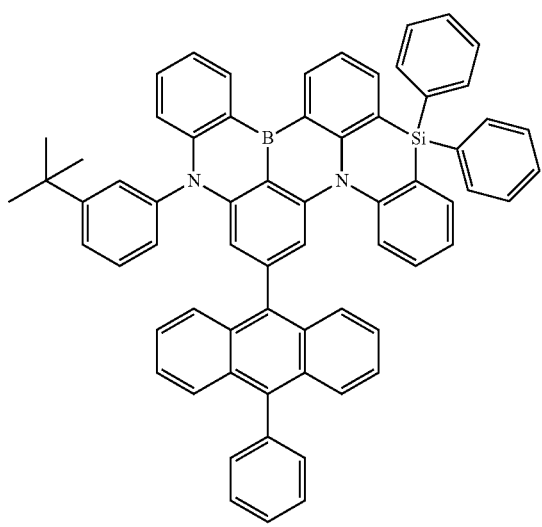
-continued
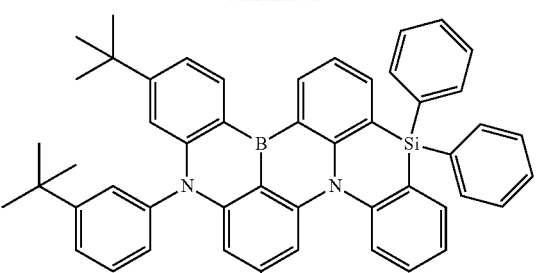
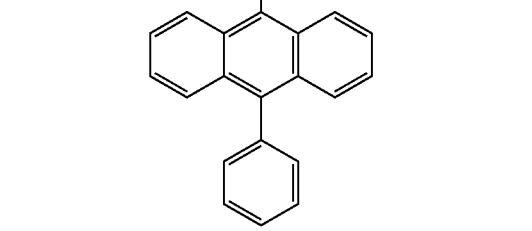
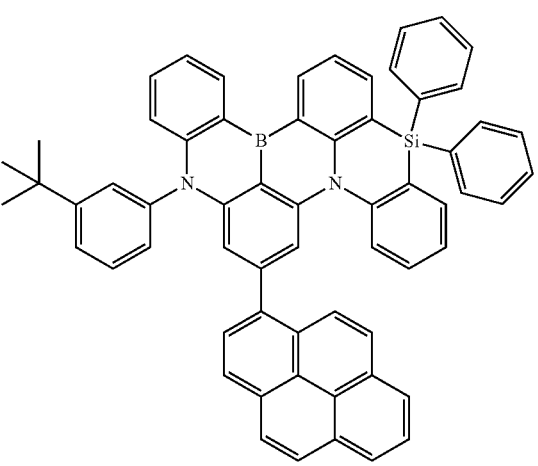
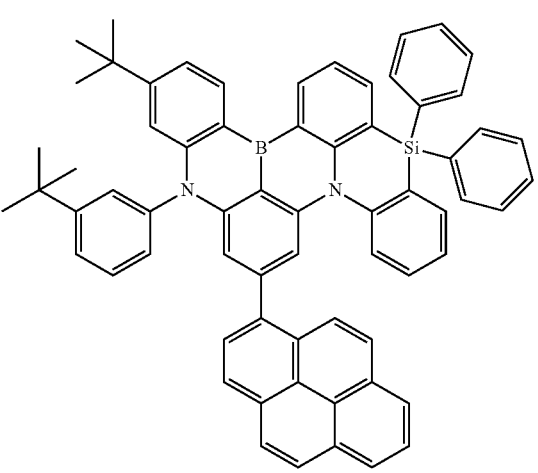

-continued
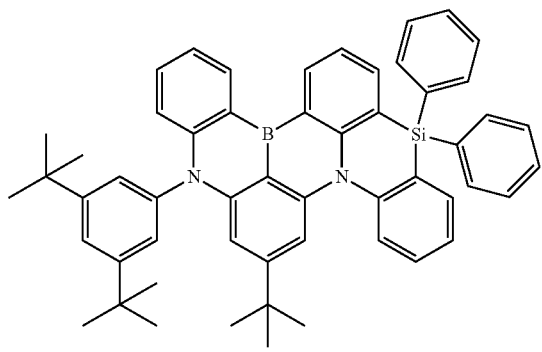
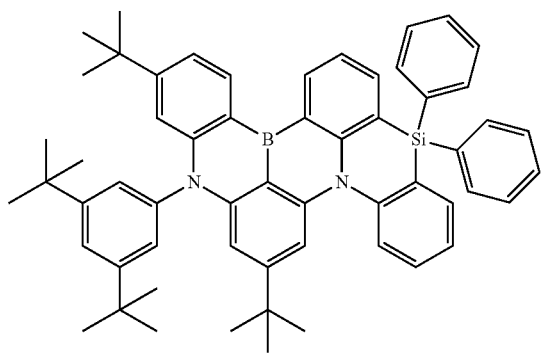
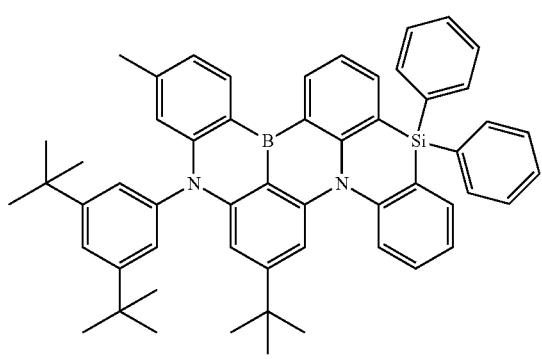
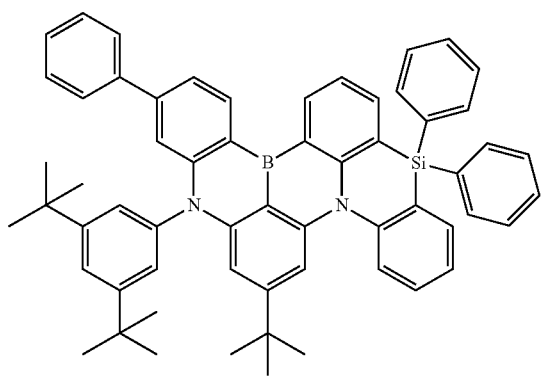
-continued
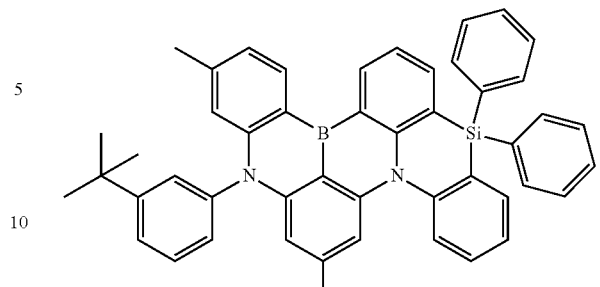
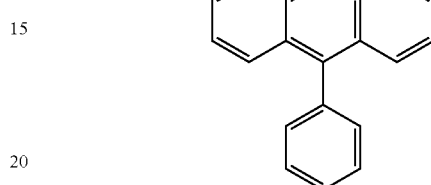
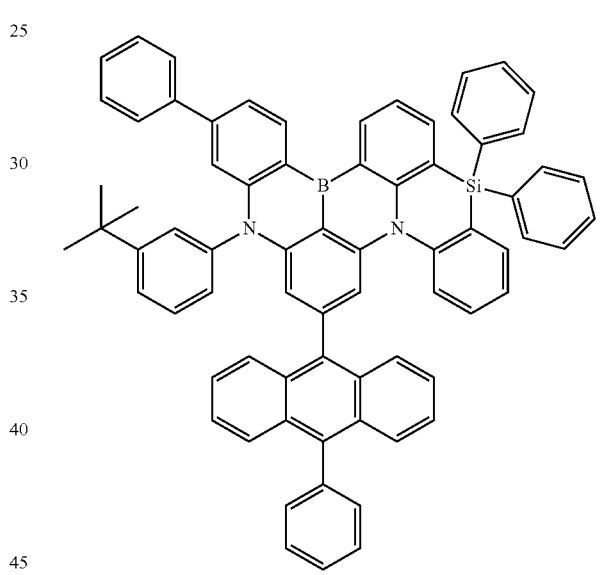
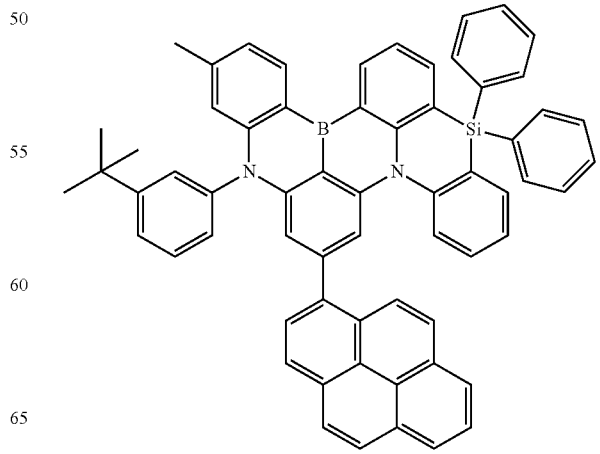

-continued
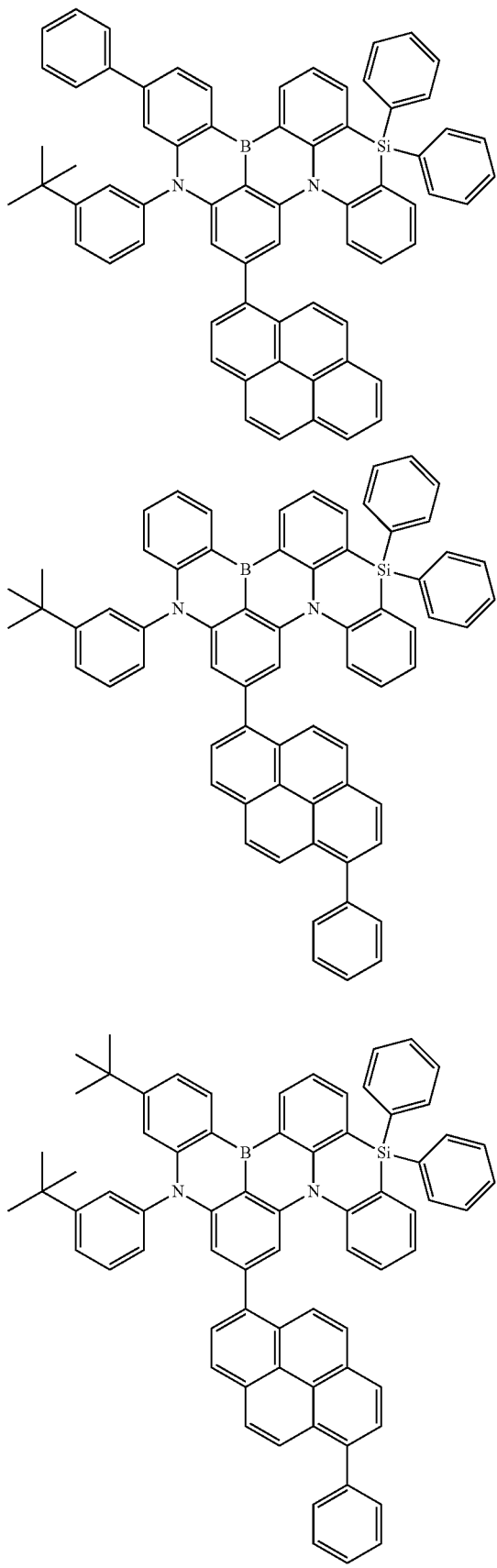
-continued
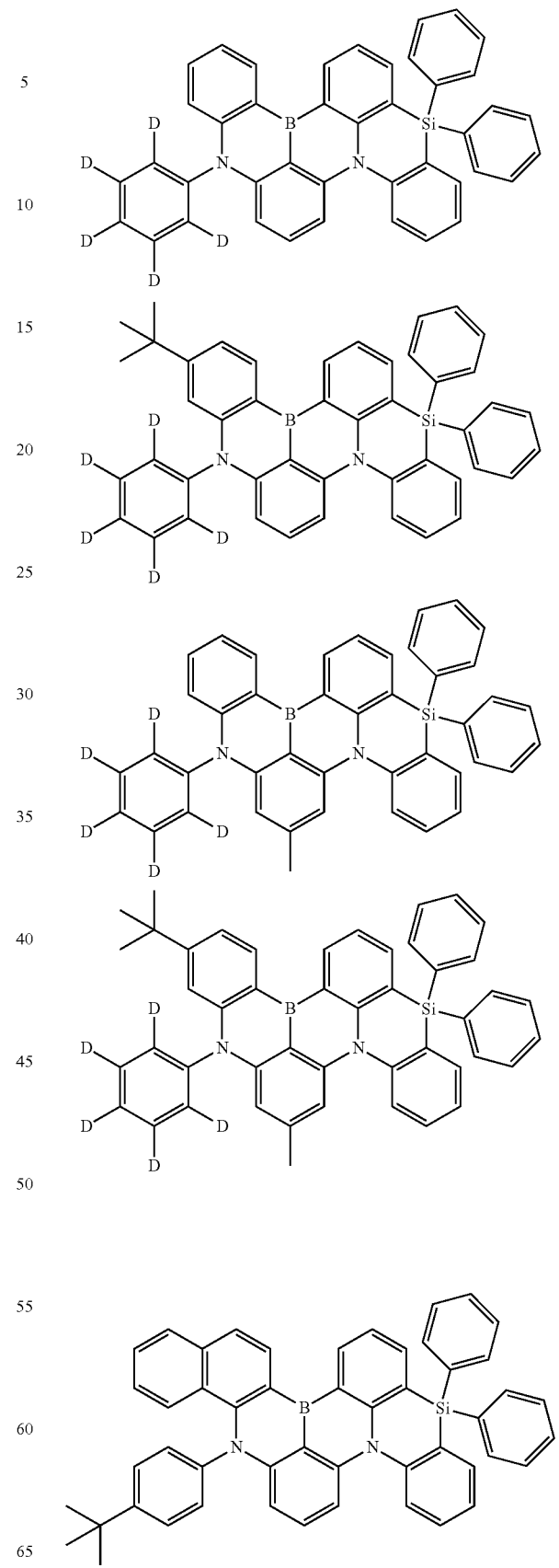

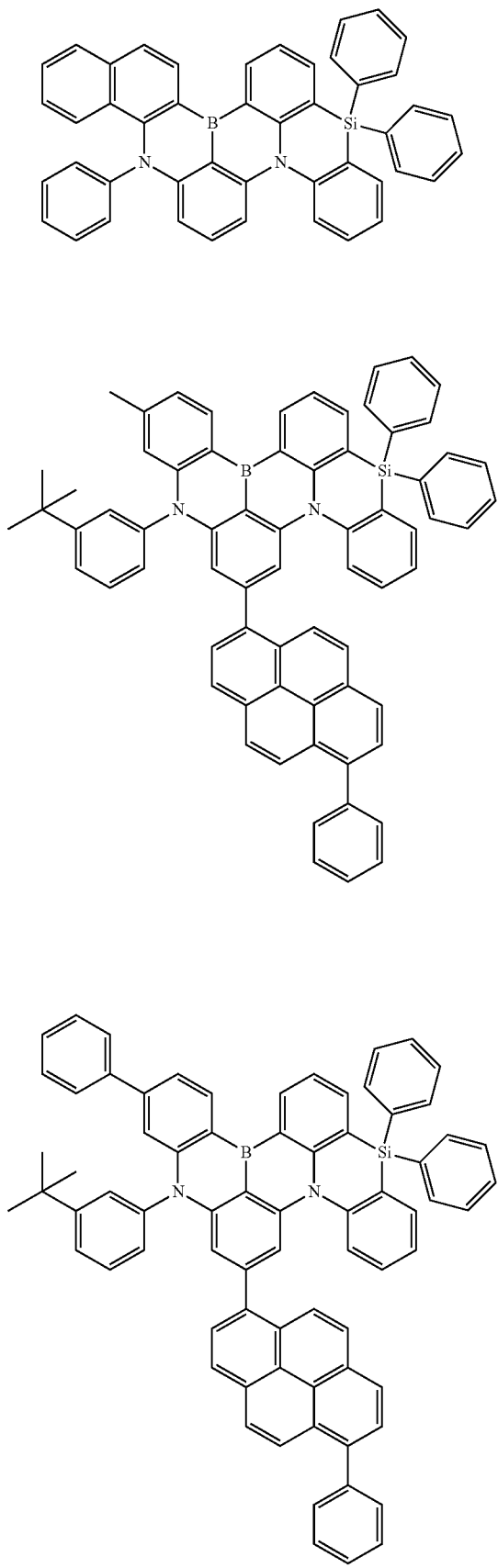
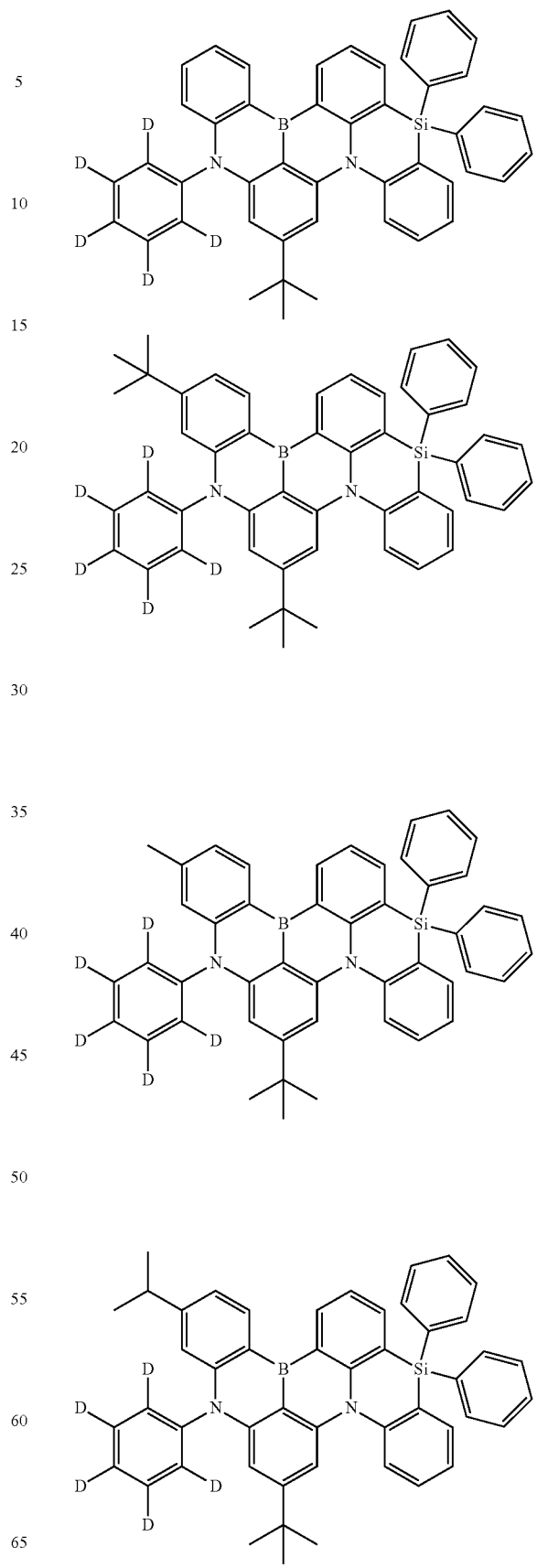

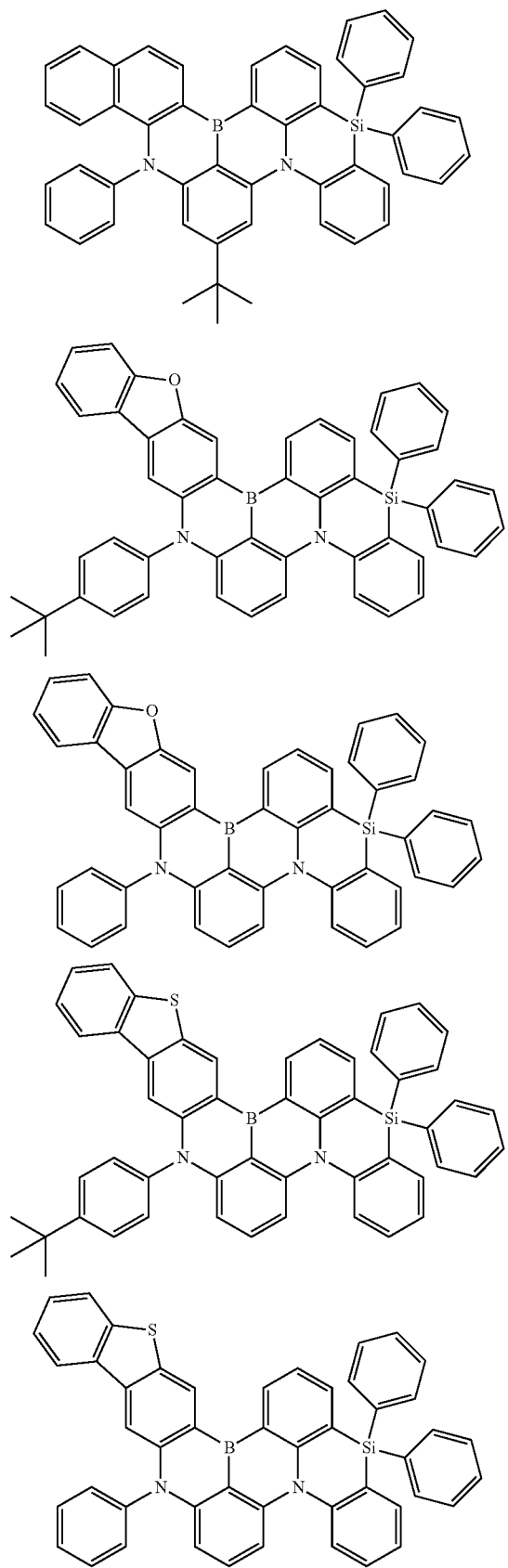
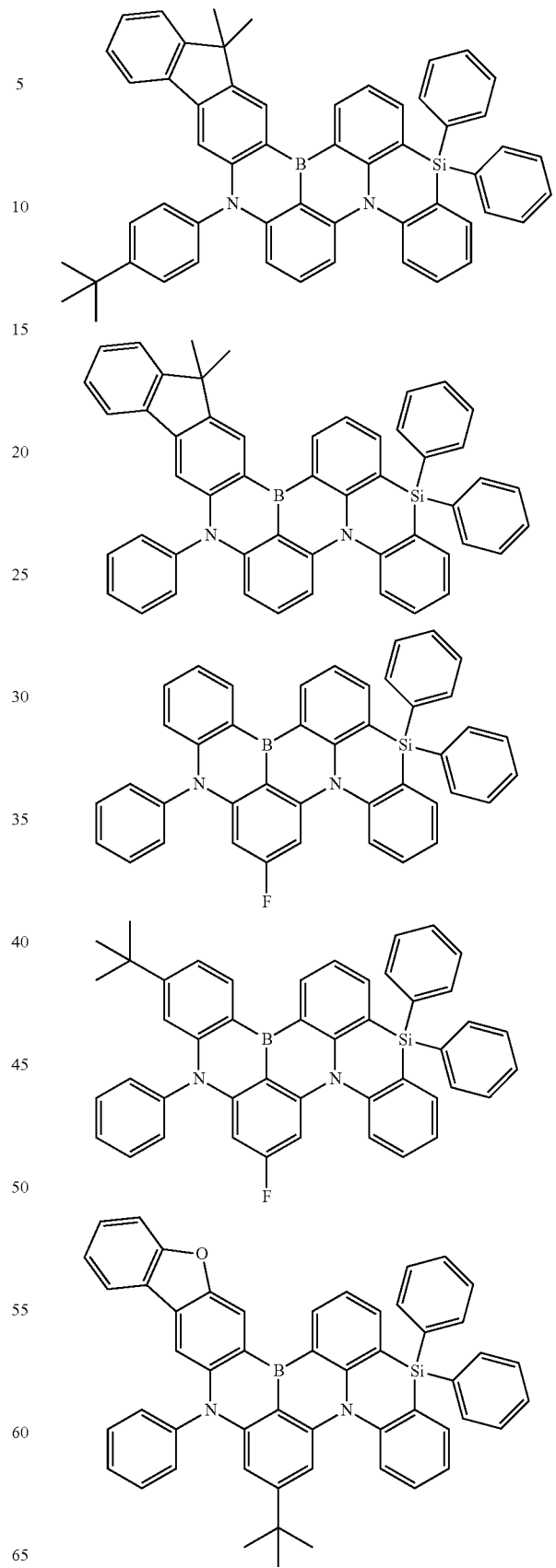

-continued
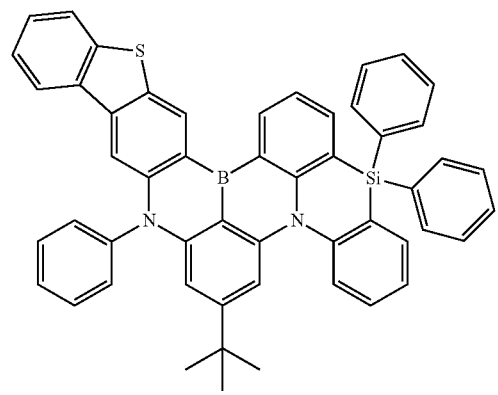
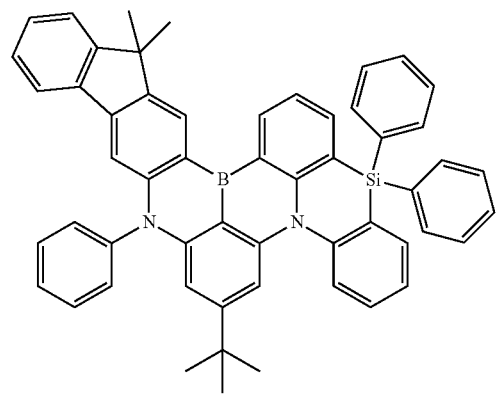
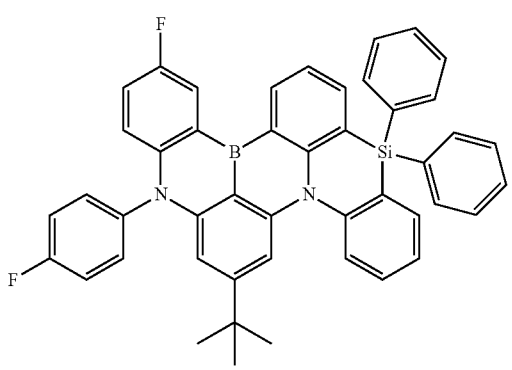
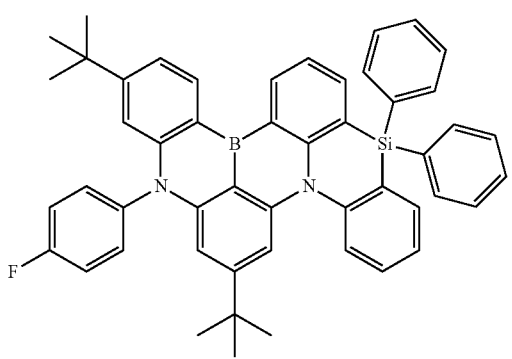
-continued
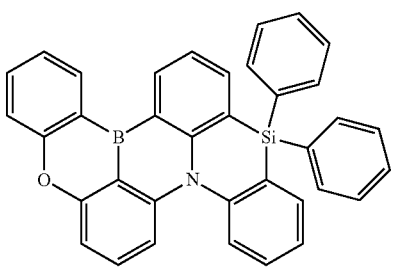
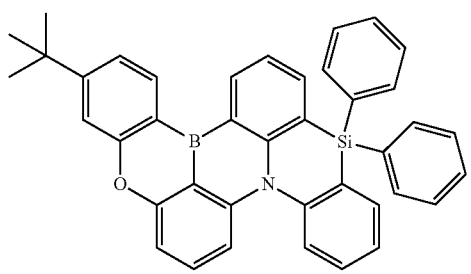
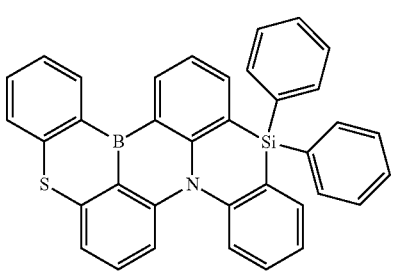
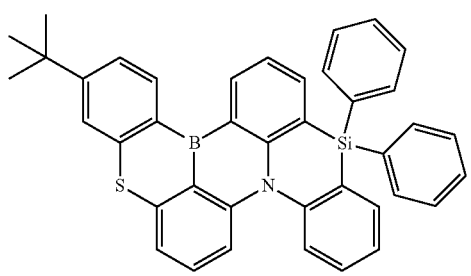
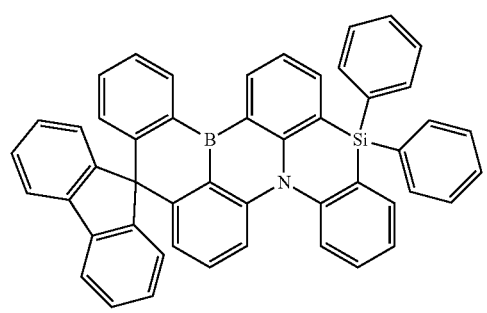
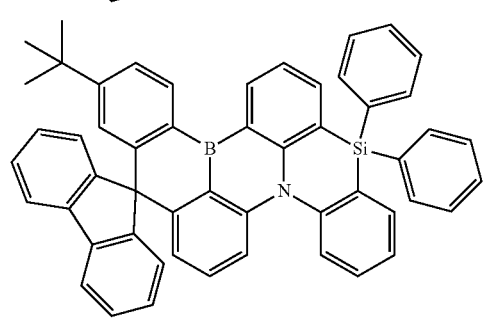

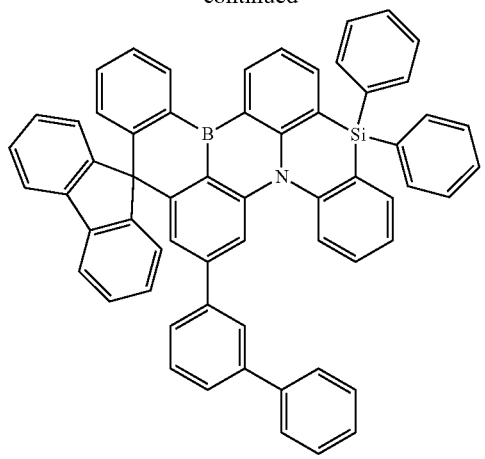
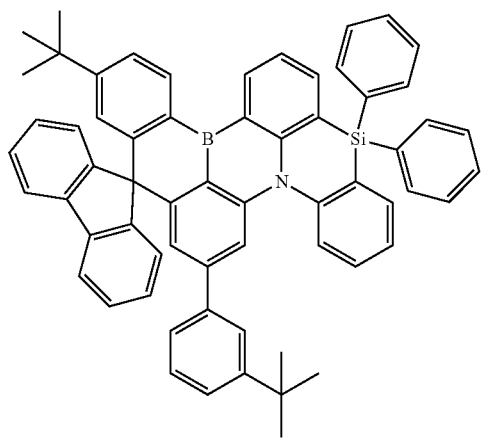
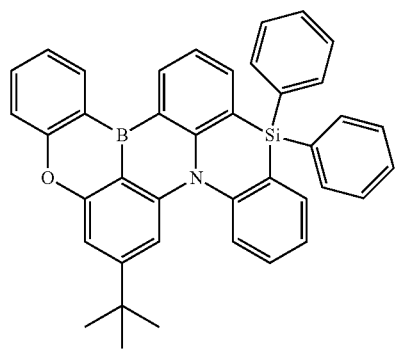
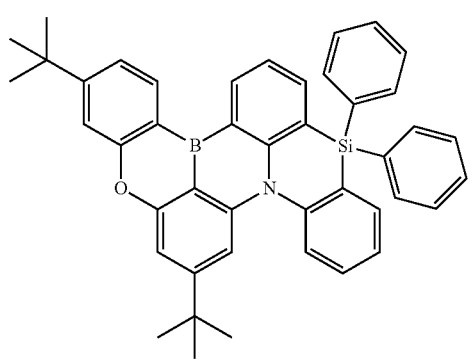
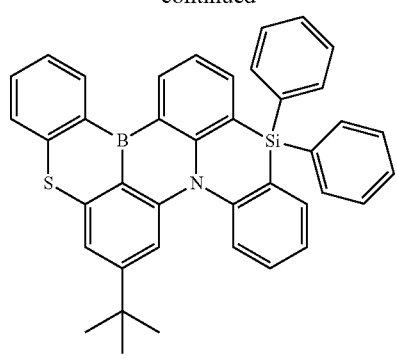
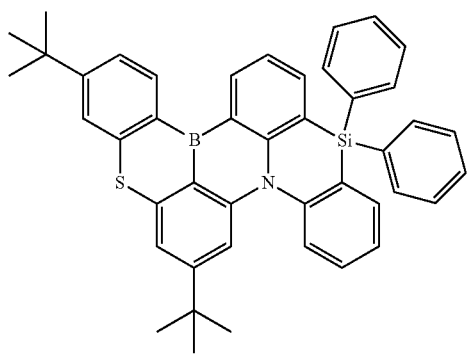
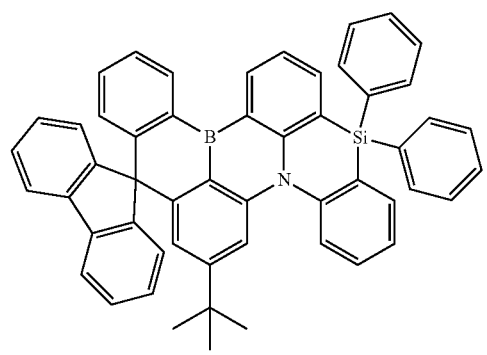
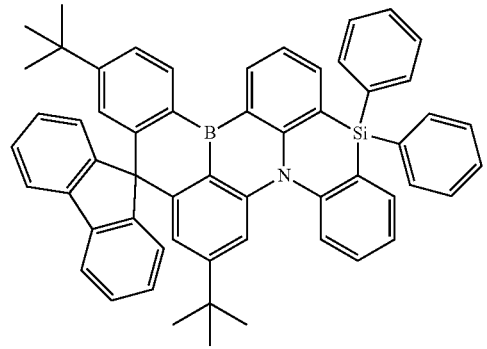

35
-continued
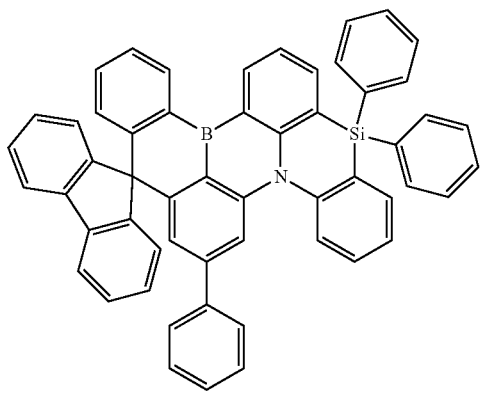
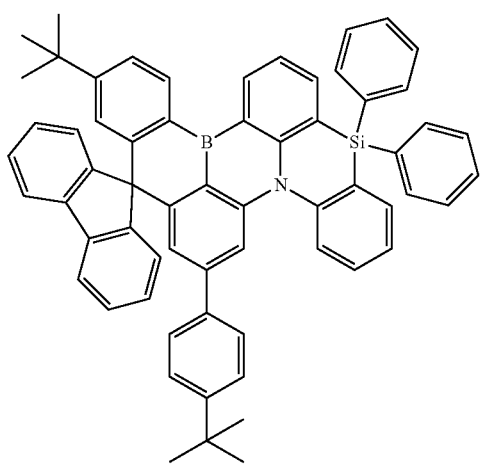
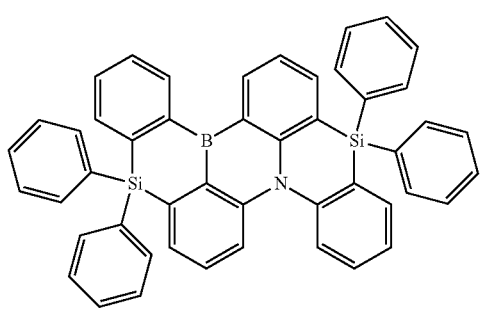
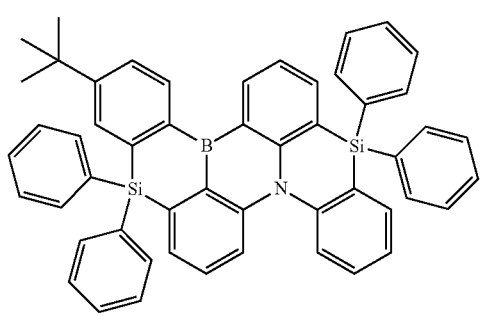
36
-continued
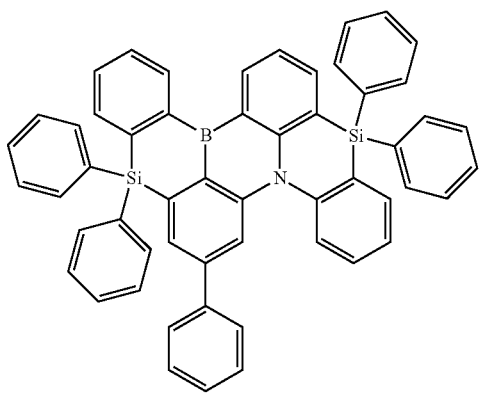
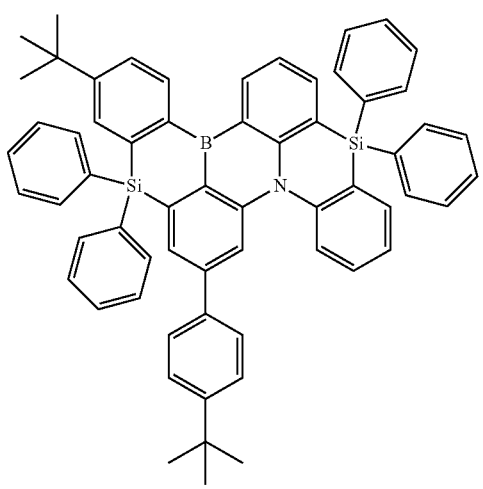
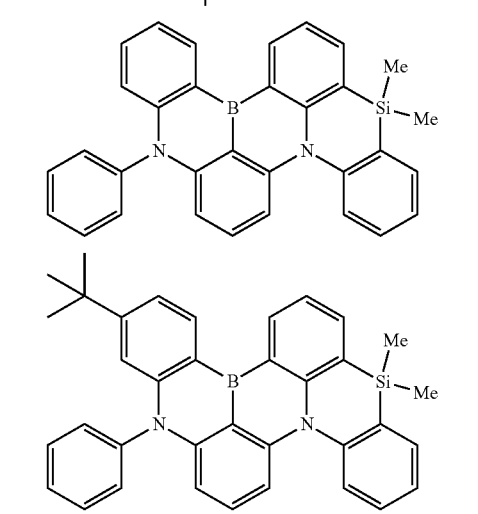
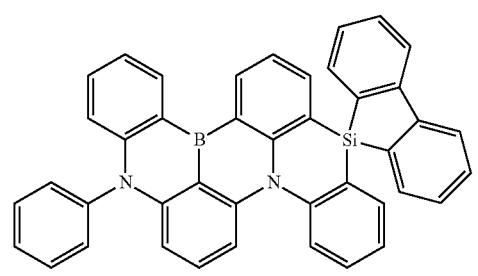

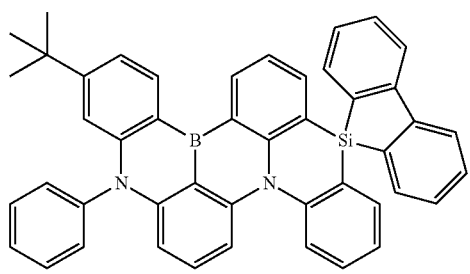
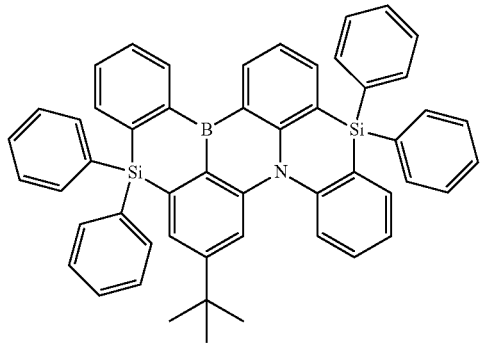
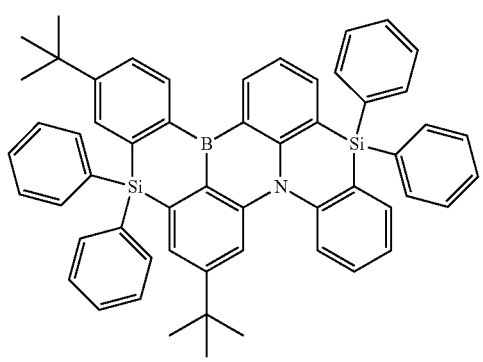
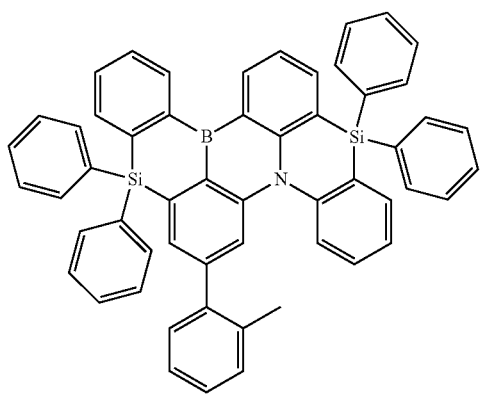
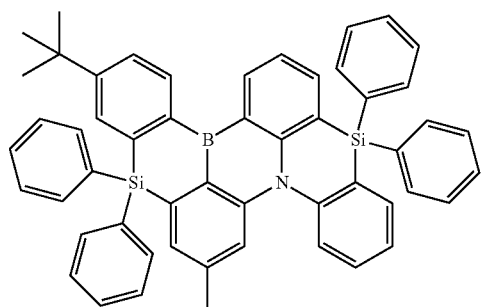
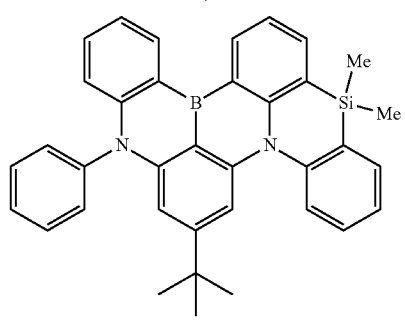
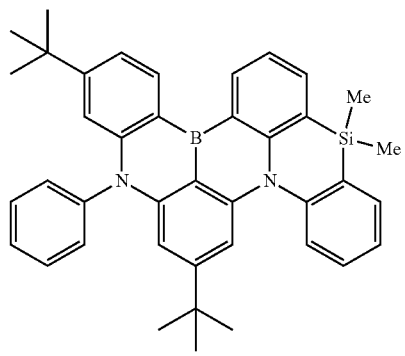
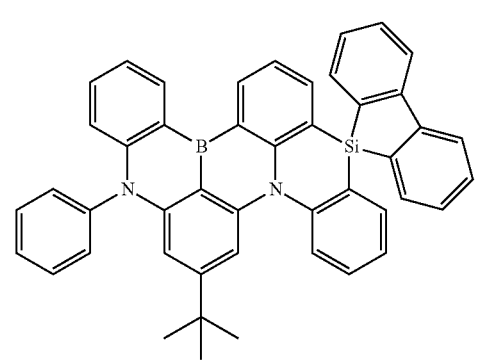

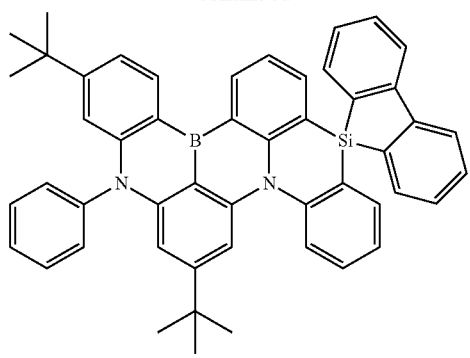
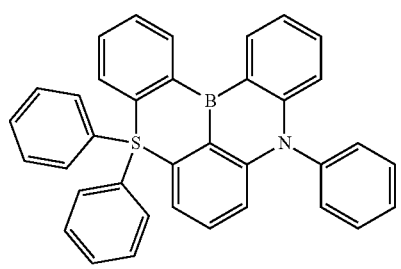
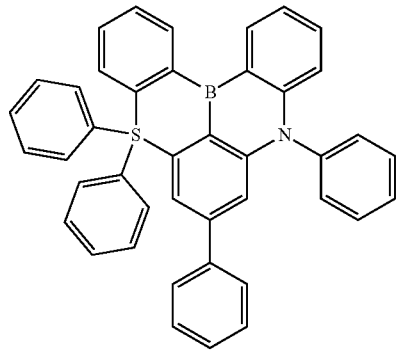
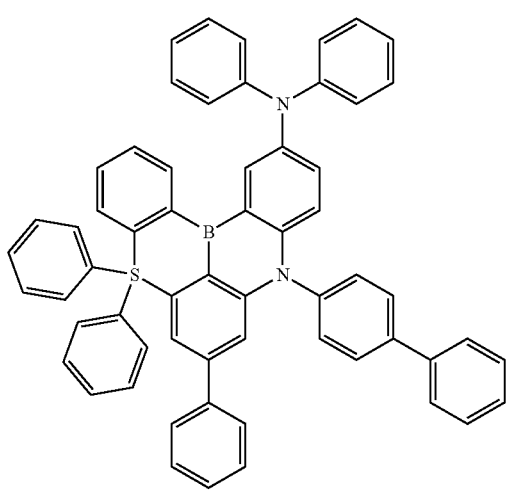
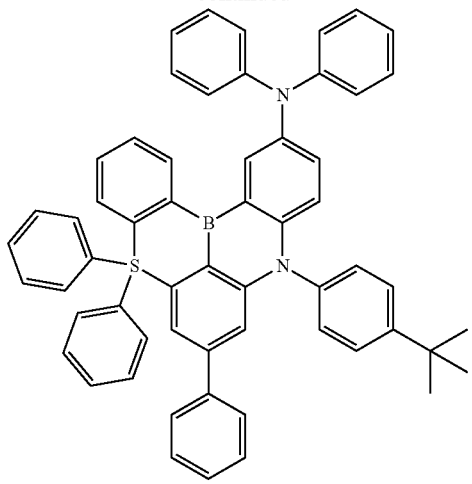
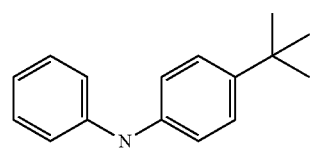
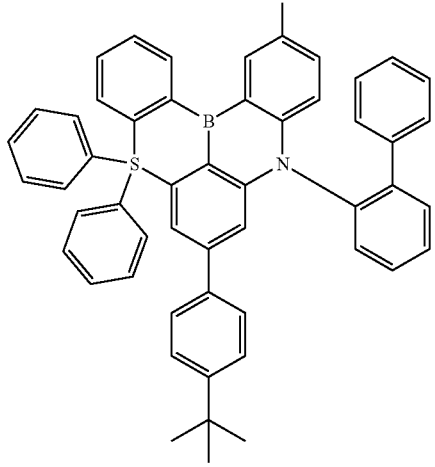
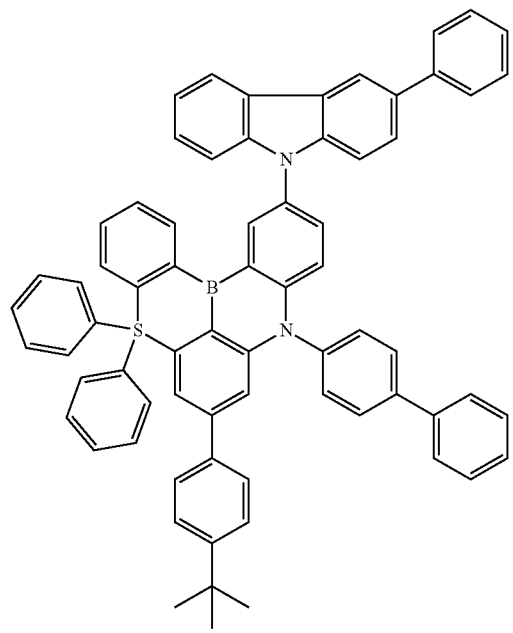

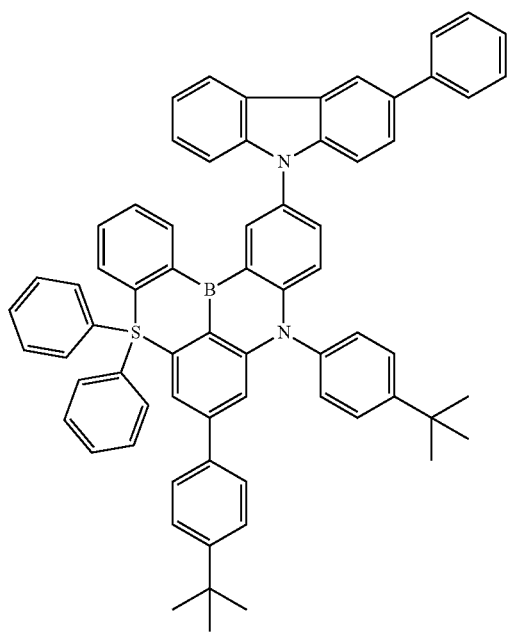
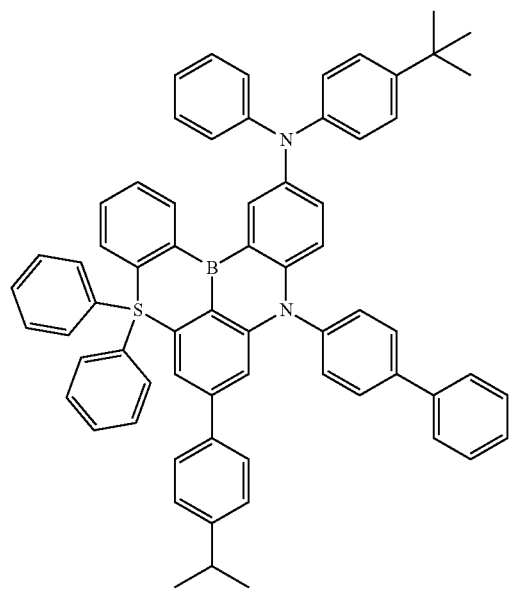
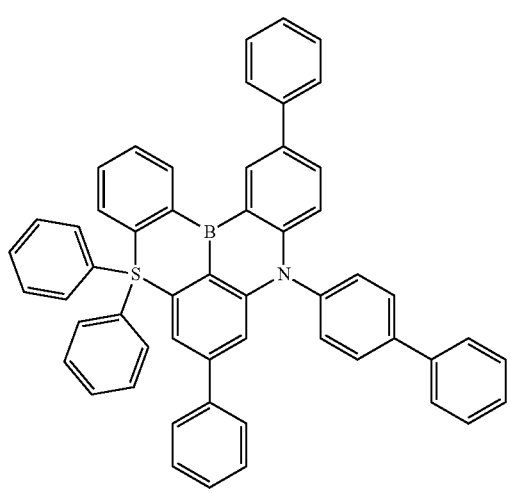
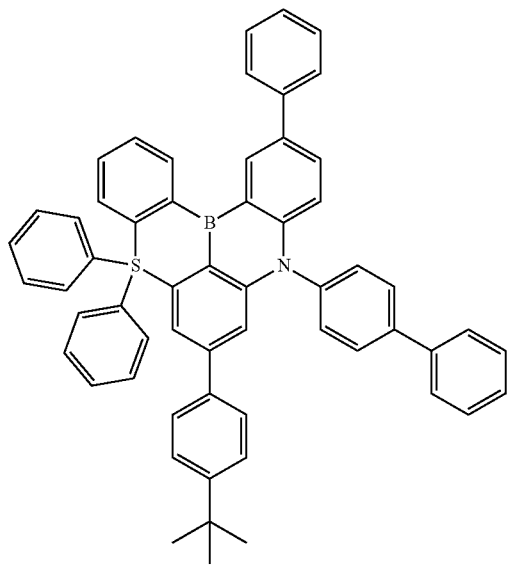
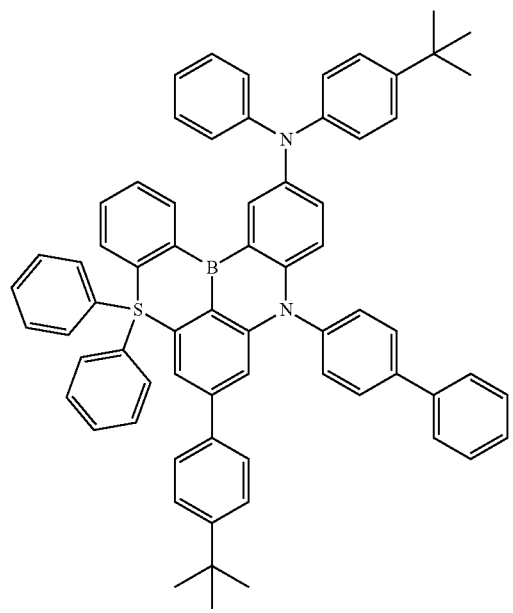

43
-continued
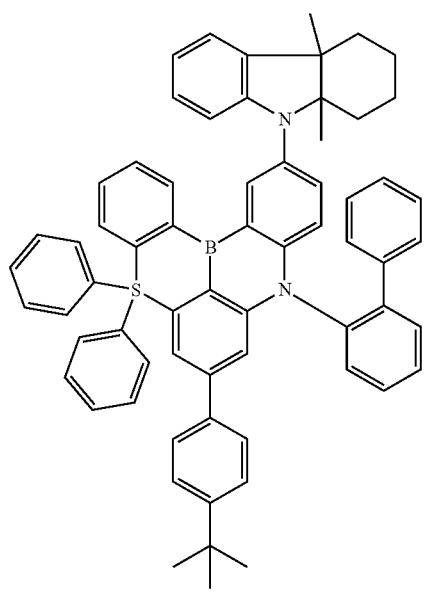
44
-continued
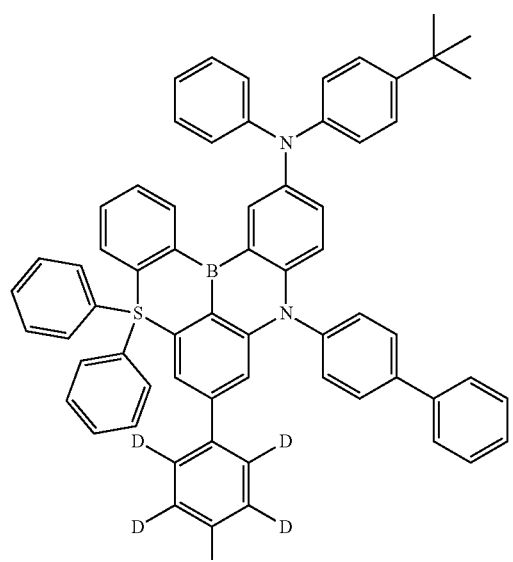
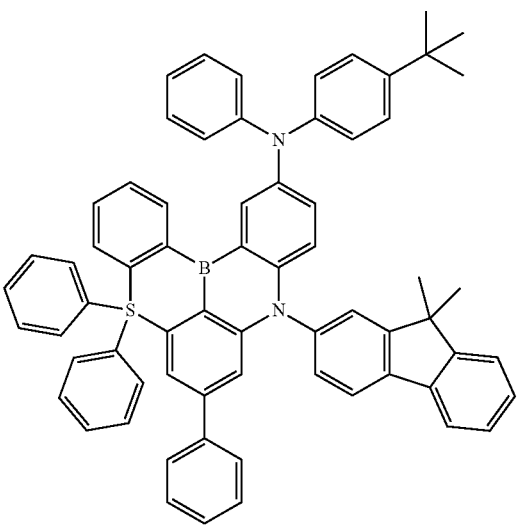
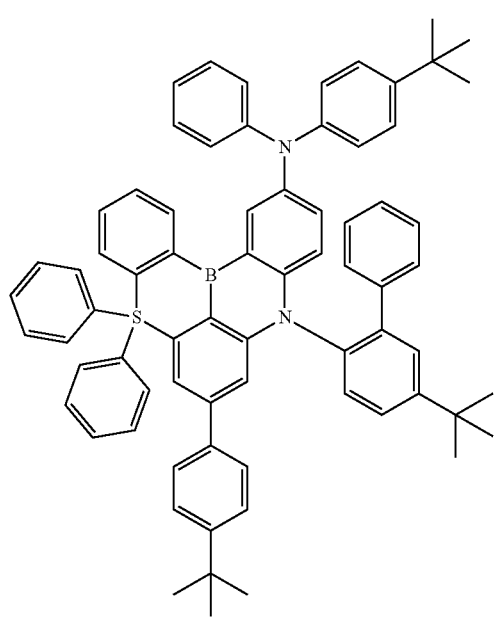
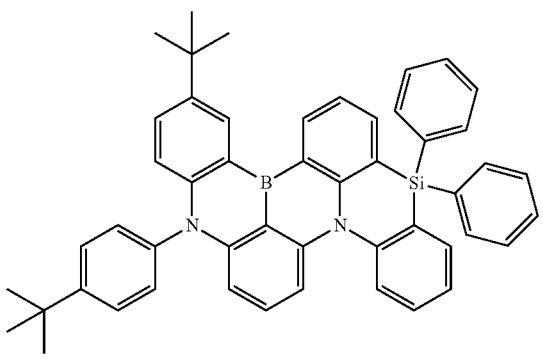

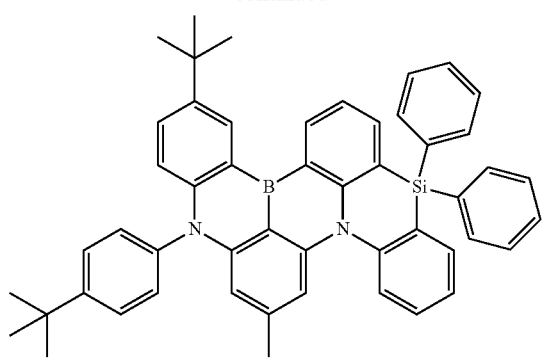
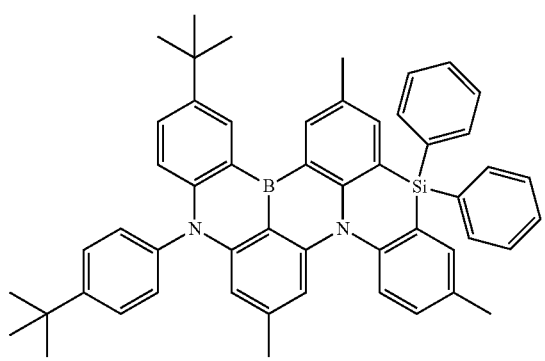
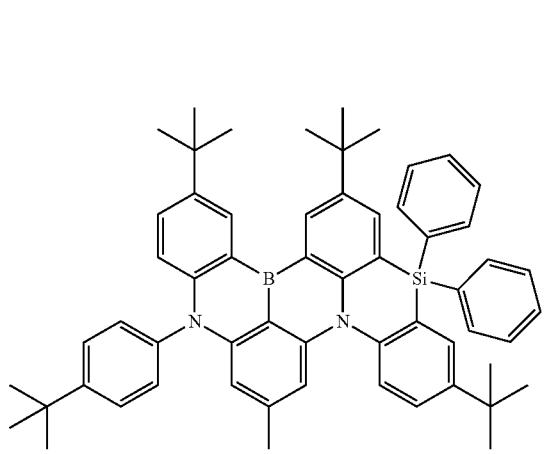
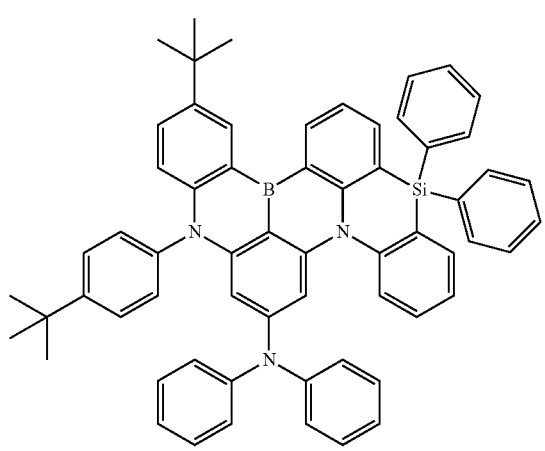
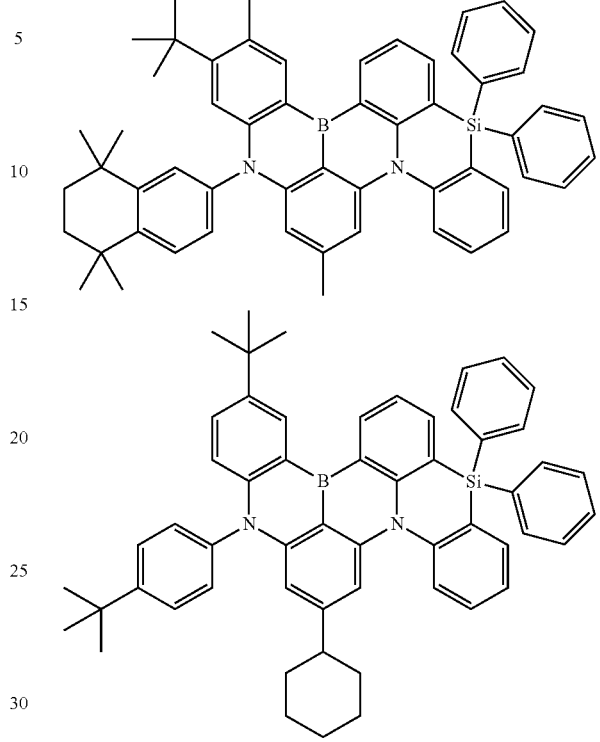
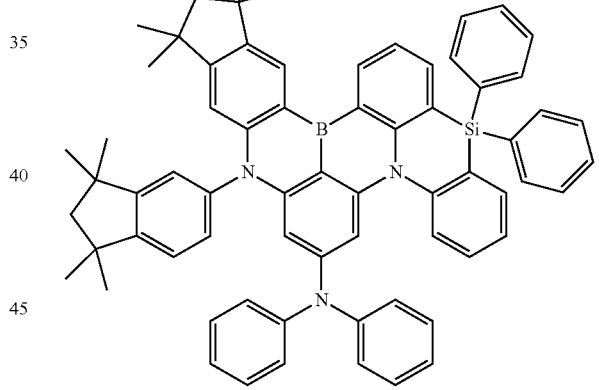
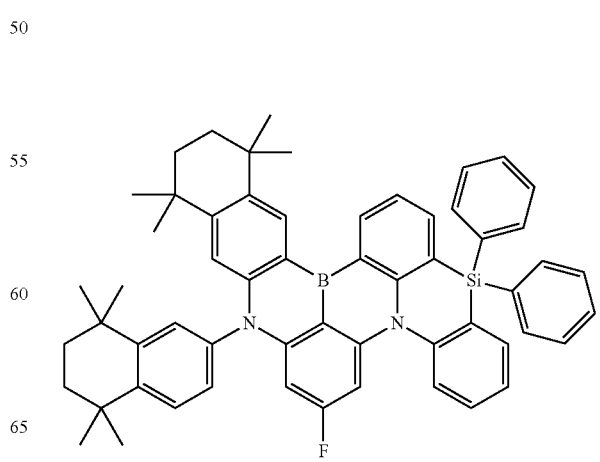

-continued

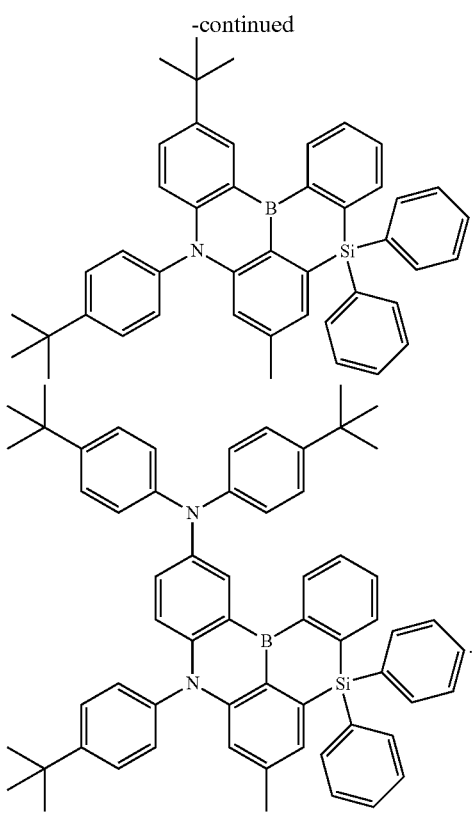

In the present specification, various substituents can be introduced into the core structure as described above to synthesize compounds having various energy bandgaps. Further, in the present specification, various substituents can be introduced into the core structures having the structure described above to adjust the HOMO and LUMO energy levels of a compound.

In addition, an organic light emitting device according to the present specification is characterized by including: a first electrode; a second electrode provided to face the first electrode; and an organic material layer having one or more layers provided between the first electrode and the second electrode, in which one or more layers of the organic material layer include the above-described compound.

According to an exemplary embodiment of the present specification, one or more layers of the organic material layer may include a compound of the following Formula 4 as a host:

[Formula 4]

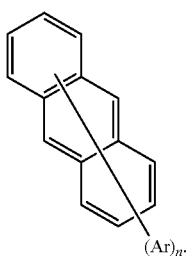

In Formula 4,
Ar is a substituted or unsubstituted aryl group; or a substituted or unsubstituted heterocyclic group, and n is an integer from 1 to 10.

According to an exemplary embodiment of the present specification, the organic material layer includes a light emitting layer.

The light emitting layer may emit red, green, or blue light, and may be composed of a phosphorescent material or a fluorescent material. The light emitting material is a material which can receive holes and electrons from a hole transport layer and an electron transport layer, respectively, and combine the holes and the electrons to emit light in a visible ray region, and is preferably a material having high quantum efficiency for fluorescence or phosphorescence.

According to an exemplary embodiment of the present specification, the organic material layer includes a light emitting layer, and the light emitting layer may include the above-described compound of Formula 1.

According to another exemplary embodiment, the organic material layer includes a light emitting layer, and the light emitting layer may include the above-described compound of Formula 1 as a dopant of the light emitting layer.

In an exemplary embodiment of the present specification, the organic material layer may include: a dopant including the above-described compound of Formula 1; and a host. In this case, in the light emitting layer, a weight ratio of the host to the dopant may be 90:10 or higher, 91:9 or higher, 92:8 or higher, 93:7 or higher, 94:6 or higher, 95:5 or higher, 96:4 or higher, 97:3 or higher, or 98:2 or higher, and 99.9:0.1 or less, 99.8:0.2 or less, 99.7:0.3 or less, 99.6:0.4 or less, 99.5:0.5 or less, 99.4:0.6 or less, 99.3:0.7 or less, 99.2:0.8 or less, 99.1:0.9 or less, or 99:1 or less.

In an exemplary embodiment of the present specification, the organic material layer further includes one or more layers selected from the group consisting of a hole injection layer, a hole transport layer, a light emitting layer, an electron transport layer, an electron injection layer, a hole blocking layer, and an electron blocking layer.

Since the triplet energy of the compound of Formula 4 is lower than that of the compound of Formula 1 of the present application, the compound can be used as a host material for emitting fluorescence.

According to an exemplary embodiment of the present specification, the light emitting layer may include a dopant including the compound of Formula 1 of the present application and a host including a compound of the following Formula 4.

According to an exemplary embodiment of the present specification, the content of the dopant of the light emitting layer can be 1 part by weight to 10 parts by weight based on 100 parts by weight of the host. According to an exemplary embodiment, the content of the dopant of the light emitting layer can be 1 part by weight to 5 parts by weight based on 100 parts by weight of the host. When the dopant is included within the above content range in the light emitting layer, there is an advantage in that the manufactured organic light emitting device has a low driving voltage, a long service life, and excellent light emitting efficiency.

According to an exemplary embodiment of the present specification, Ar is a substituted or unsubstituted aryl group having 6 to 60 carbon atoms; or a substituted or unsubstituted heterocyclic group having 2 to 60 carbon atoms.

According to an exemplary embodiment of the present specification, Ar is a substituted or unsubstituted aryl group having 6 to 30 carbon atoms; or a substituted or unsubstituted heterocyclic group having 2 to 30 carbon atoms.

According to an exemplary embodiment of the present specification, Ar is a substituted or unsubstituted aryl group having 6 to 15 carbon atoms; or a substituted or unsubstituted heterocyclic group having 2 to 15 carbon atoms.

In an exemplary embodiment of the present application, the host includes a compound of any one of the following structures:
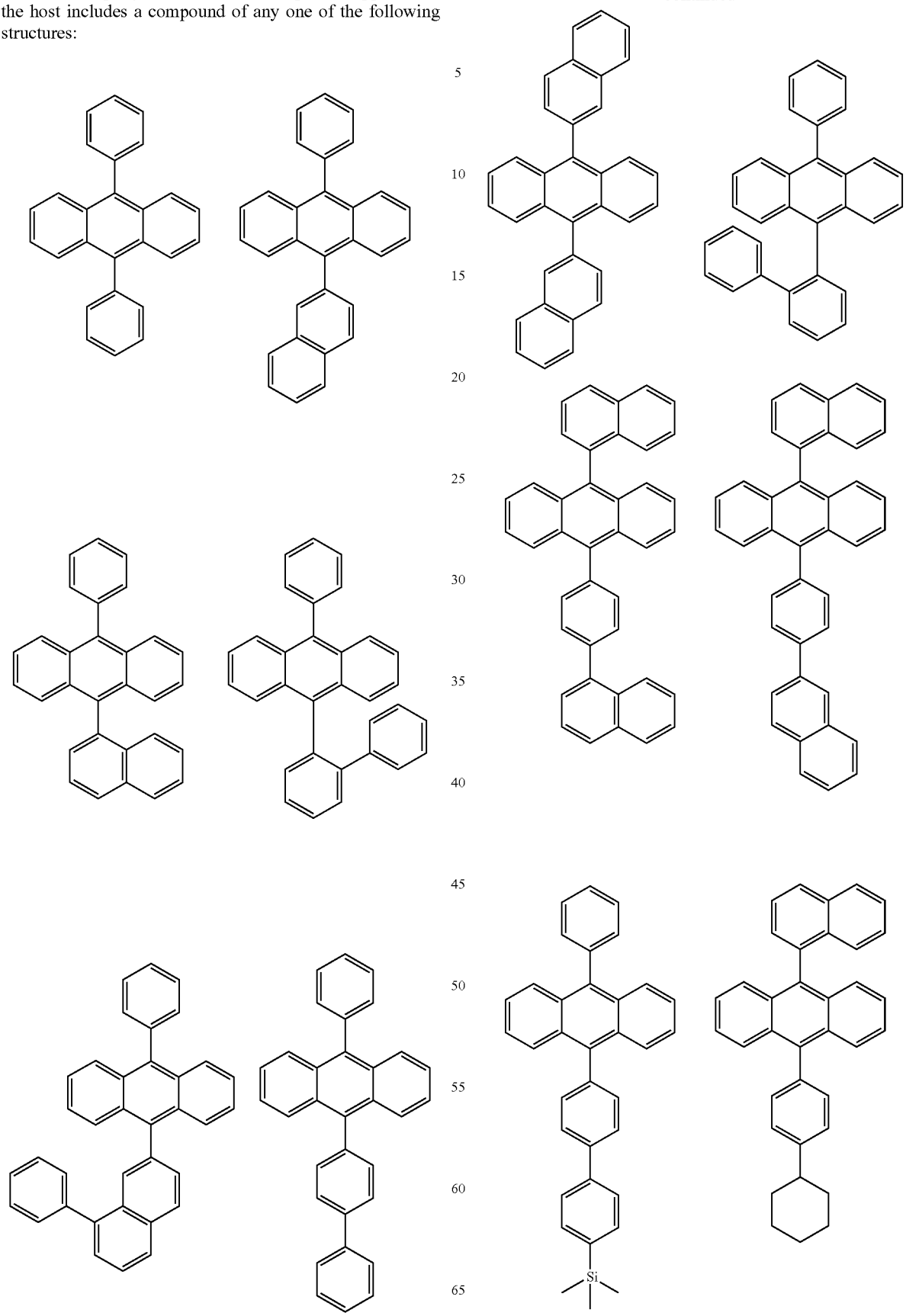

51
-continued
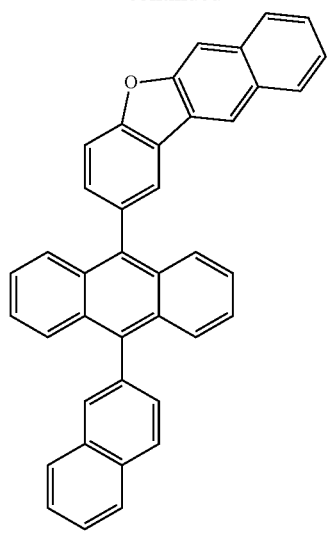
52
-continued
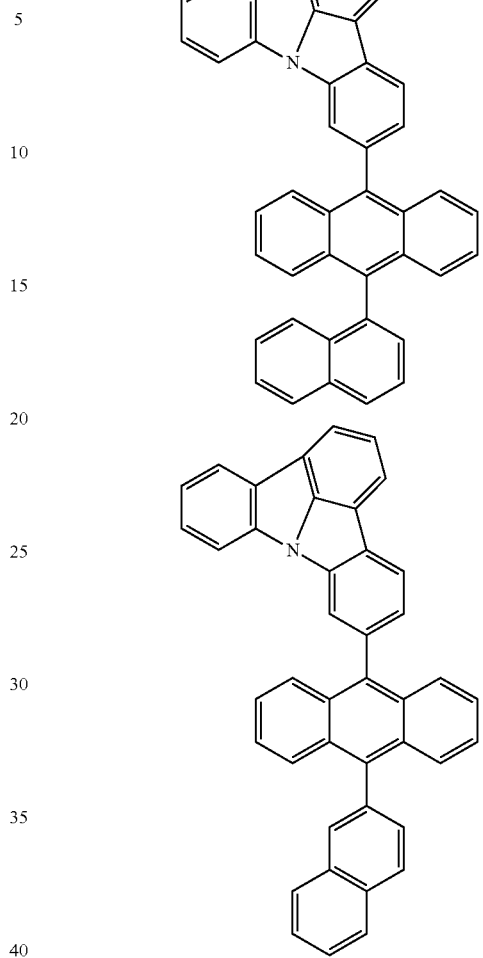
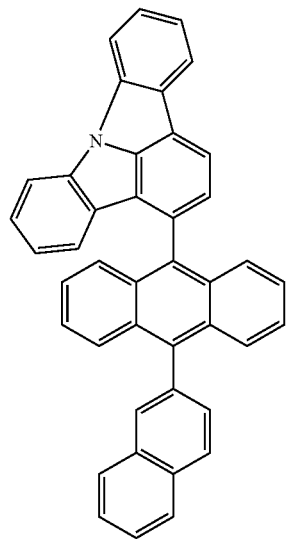

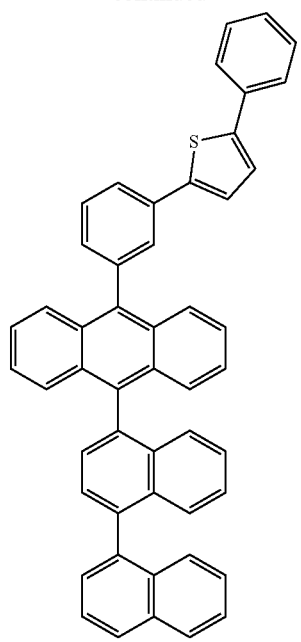
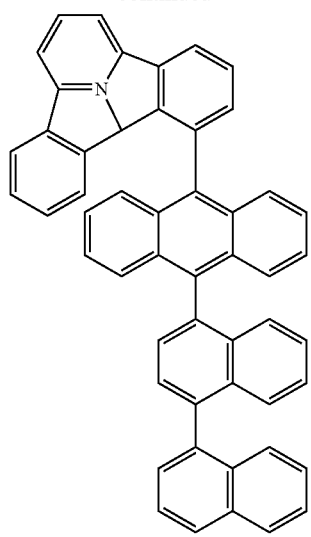
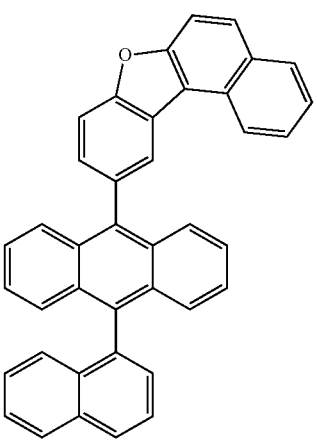
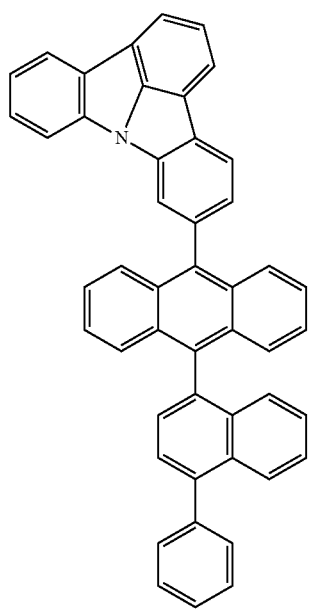

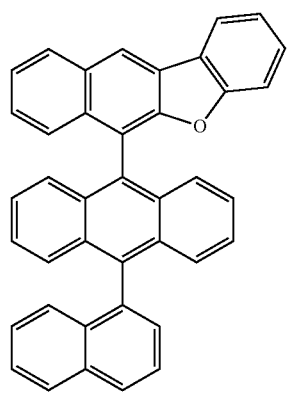
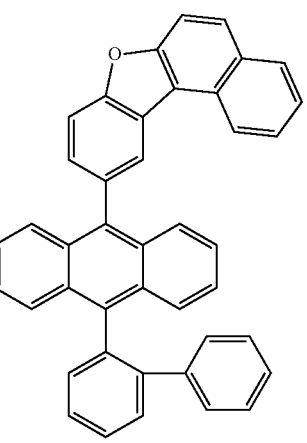
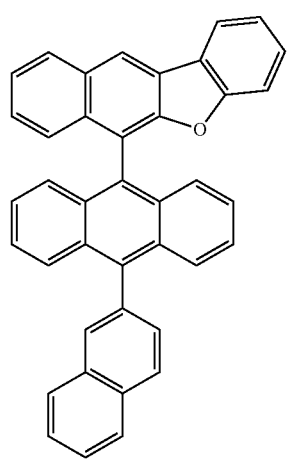
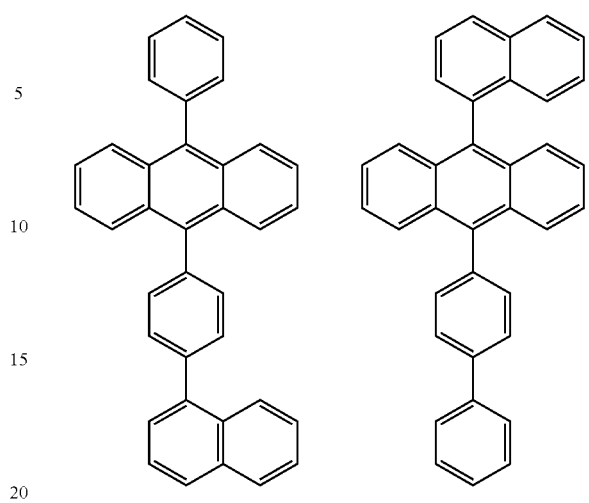
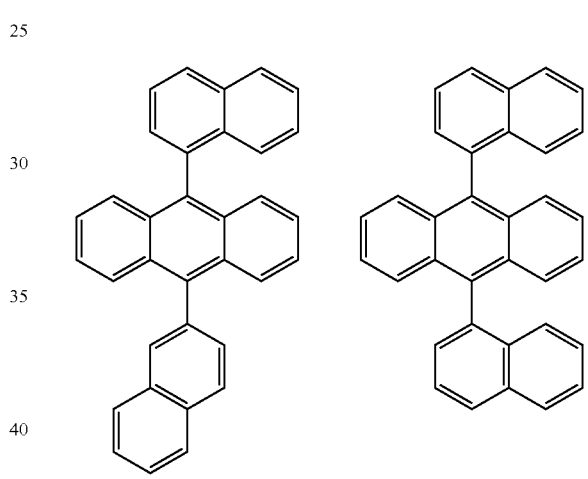
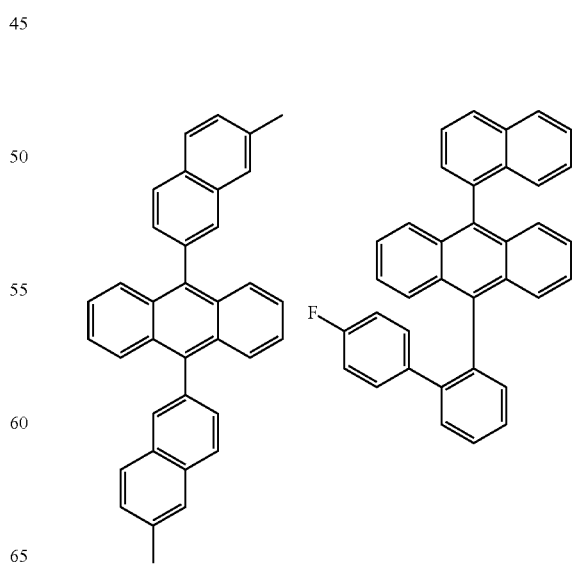

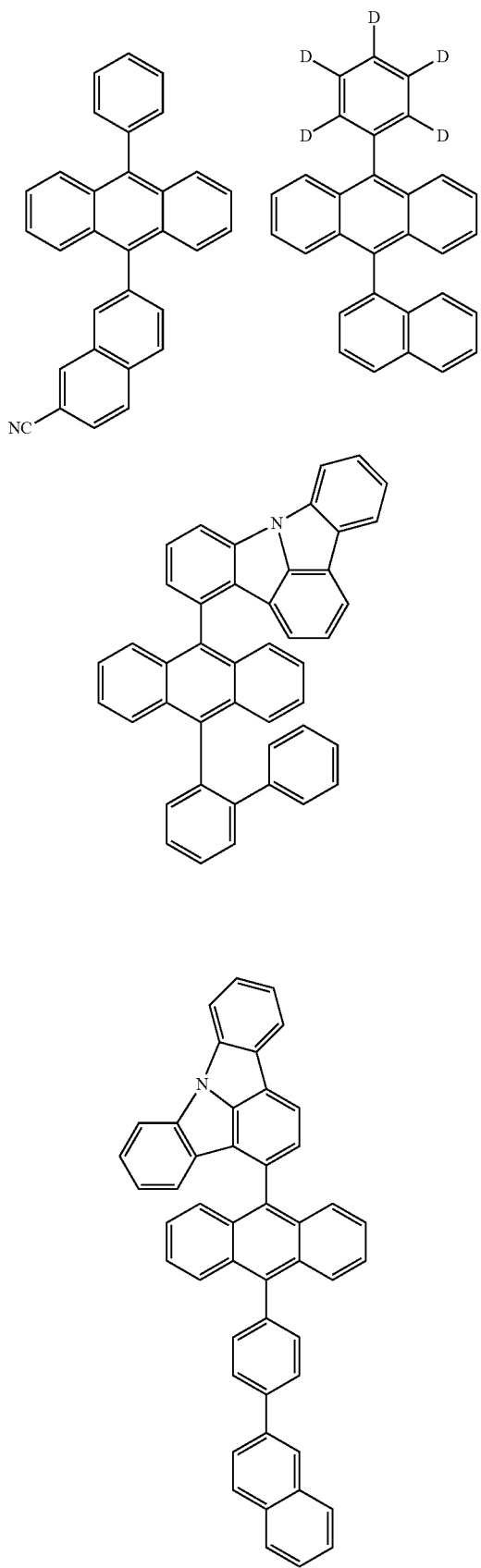
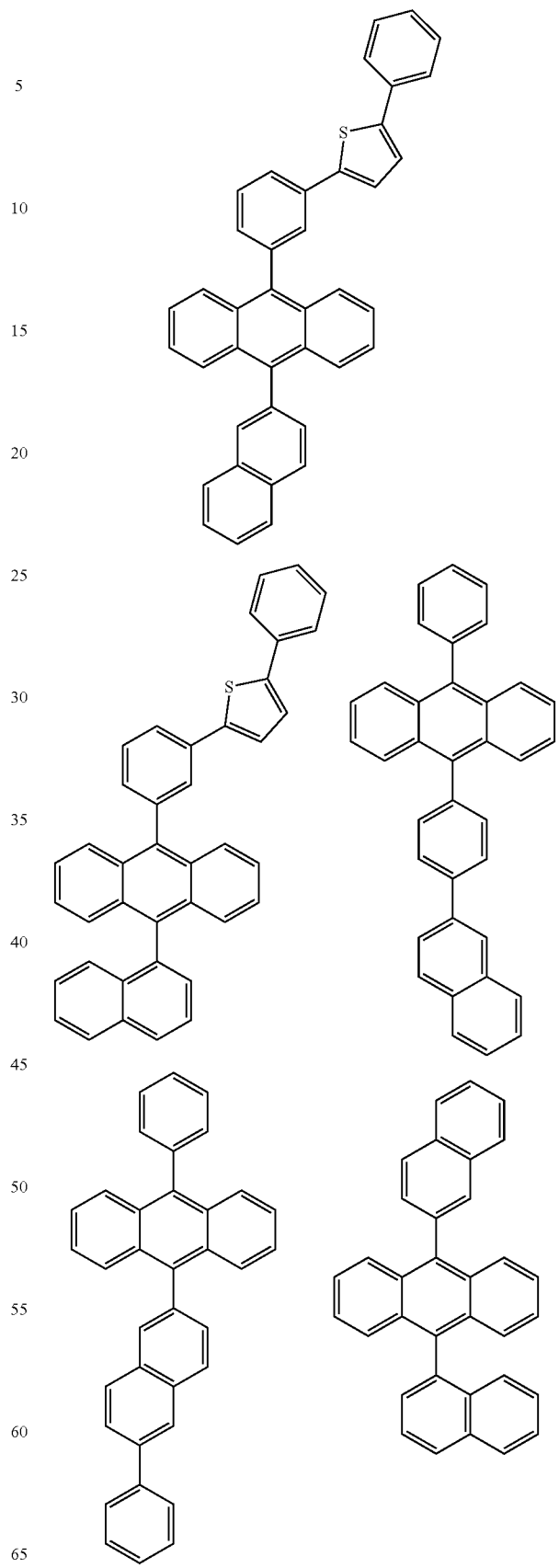

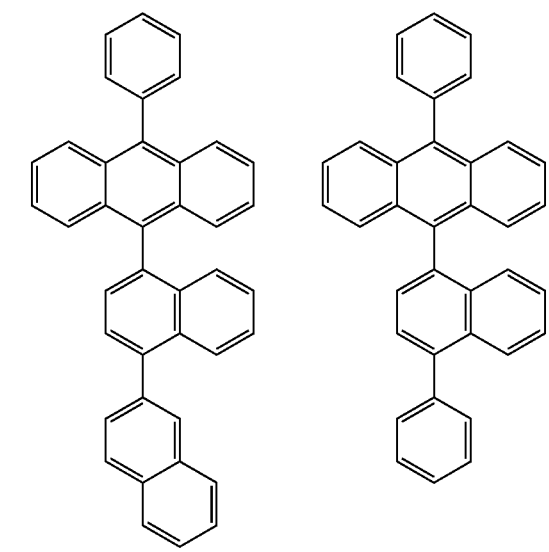
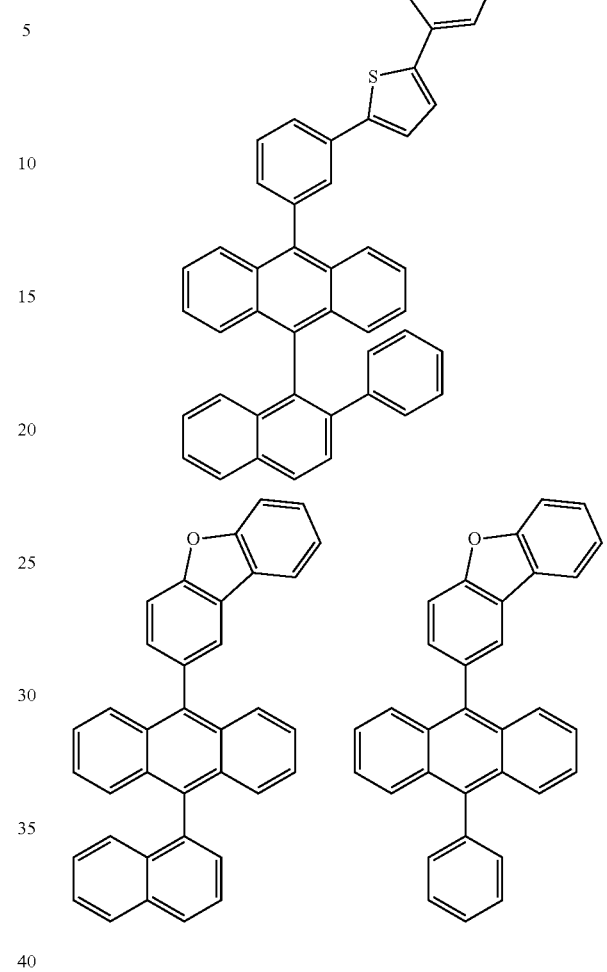
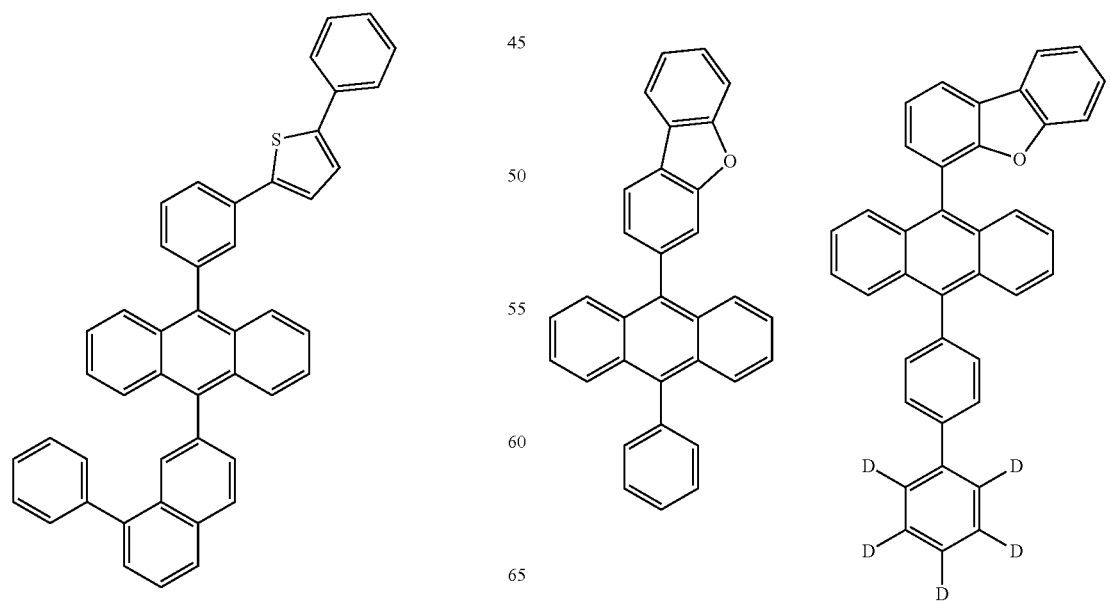

61
-continued
62
-continued
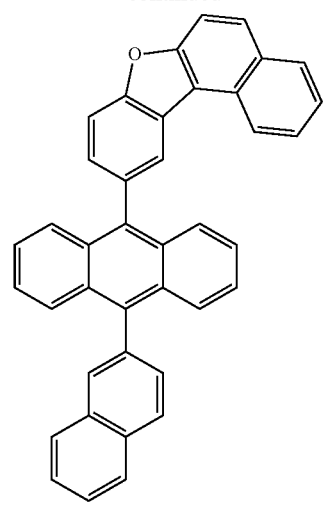
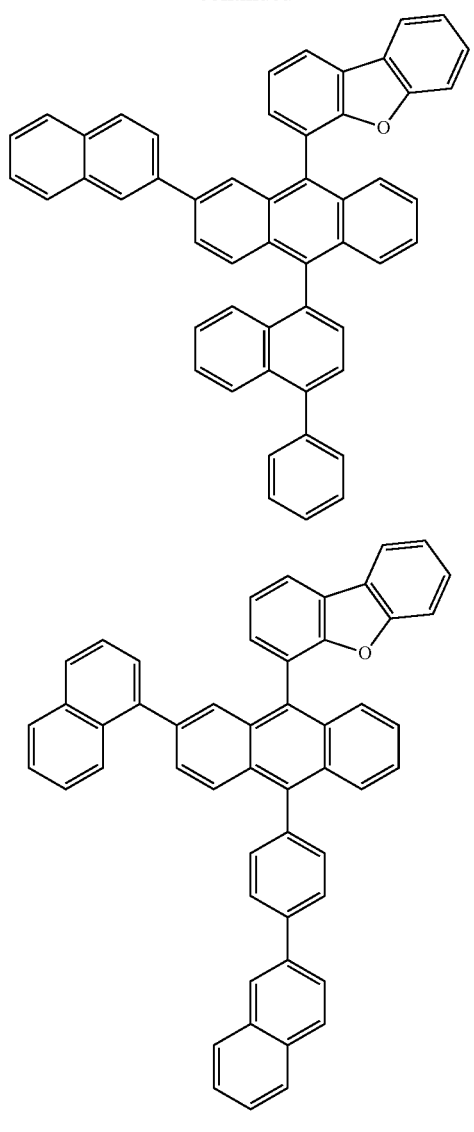
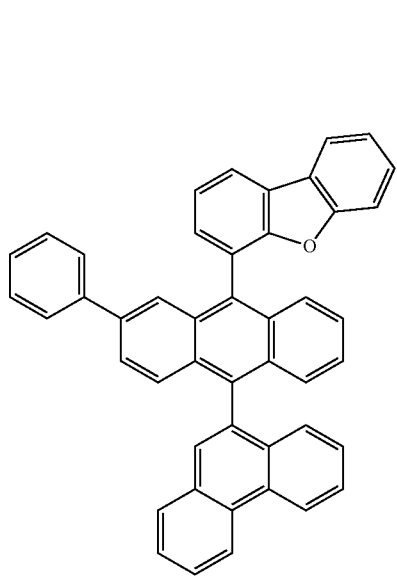

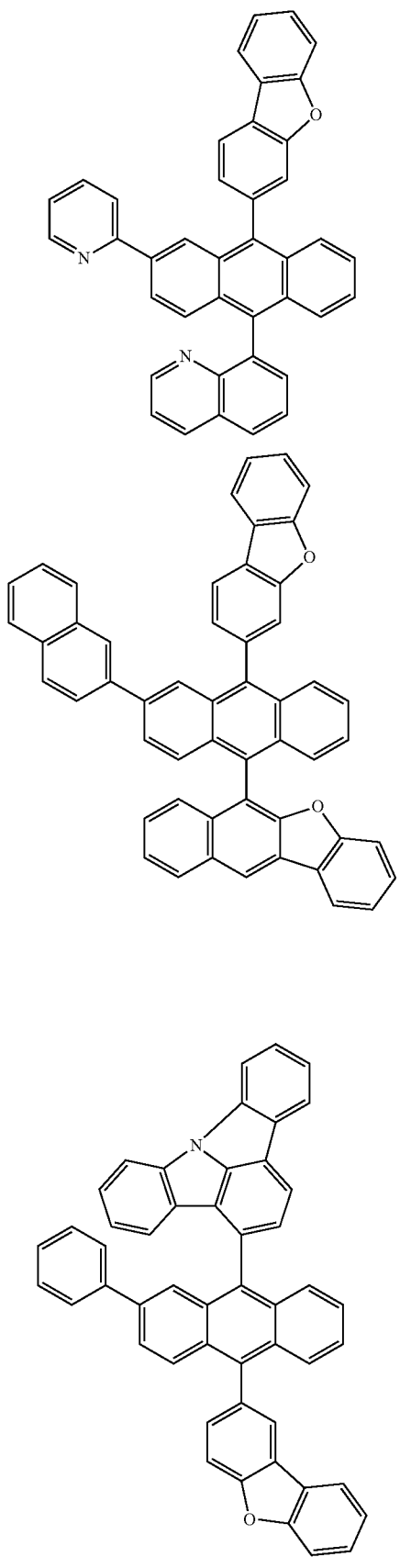

65
-continued
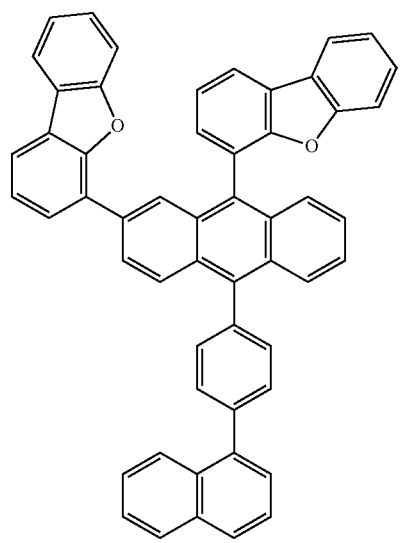
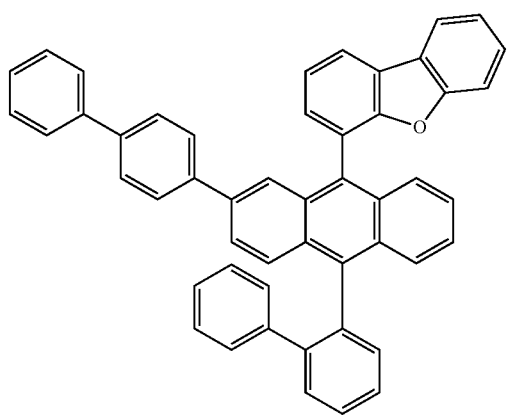
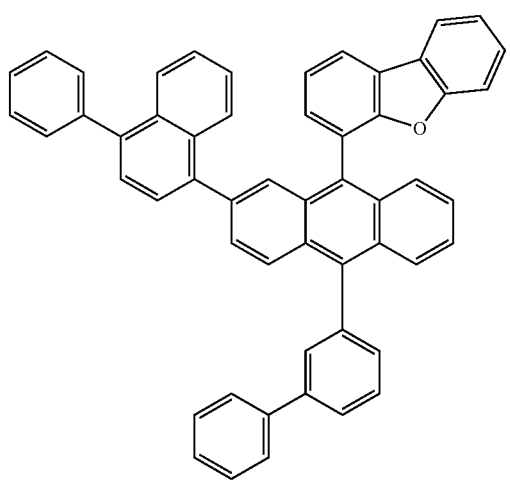
66
-continued
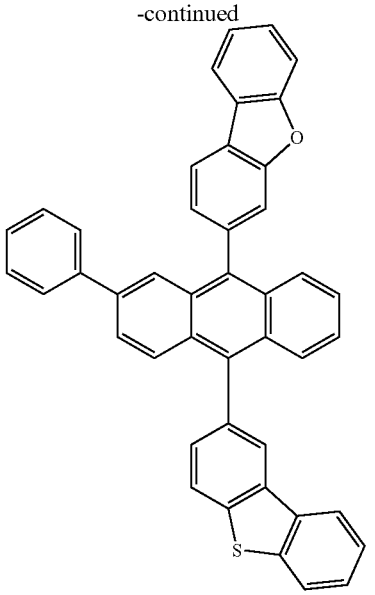
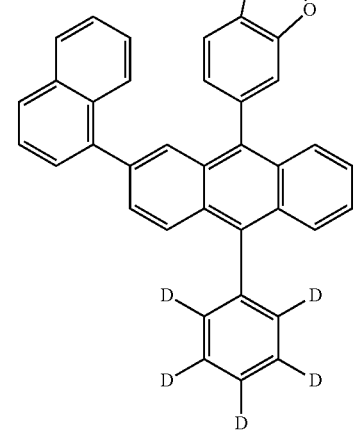
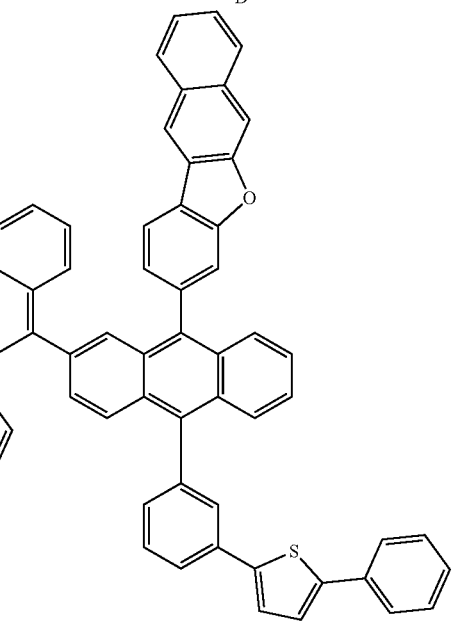

67
-continued
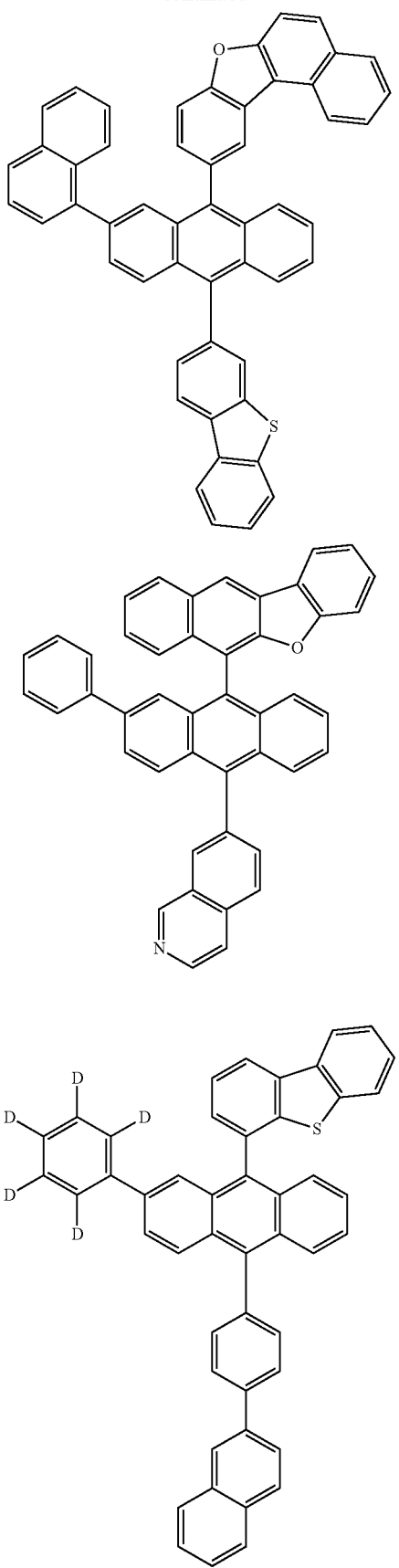
68
-continued
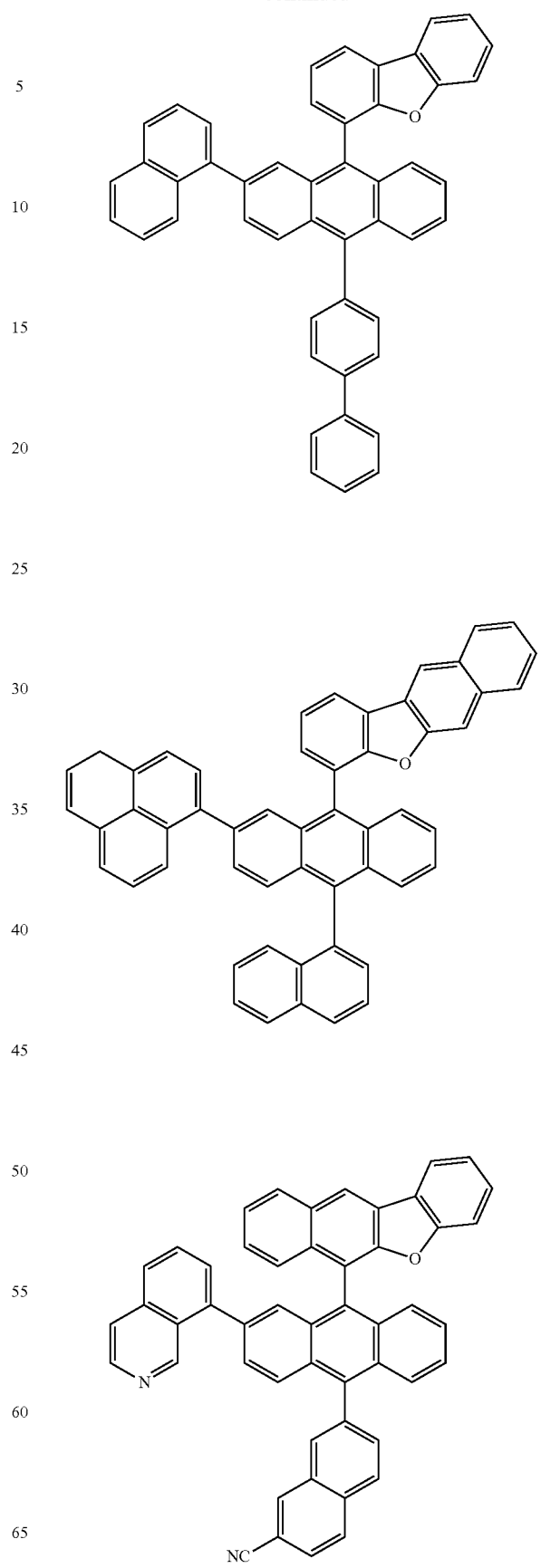

69
-continued
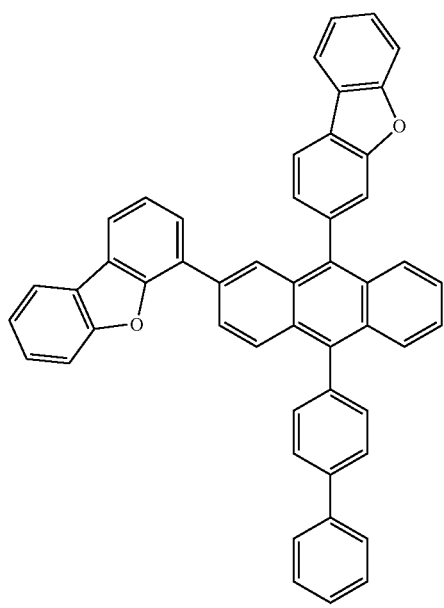
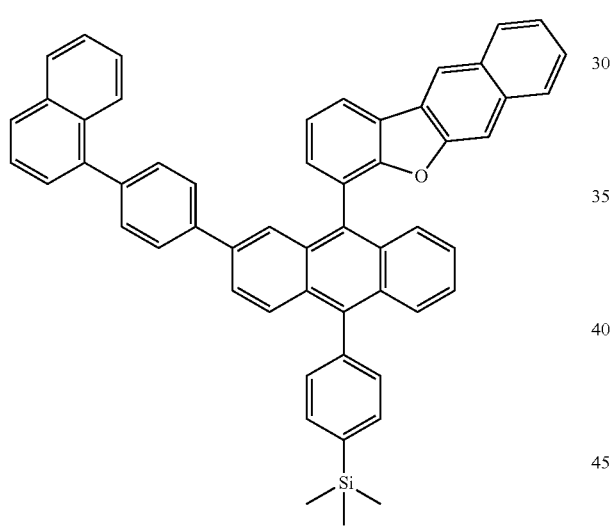
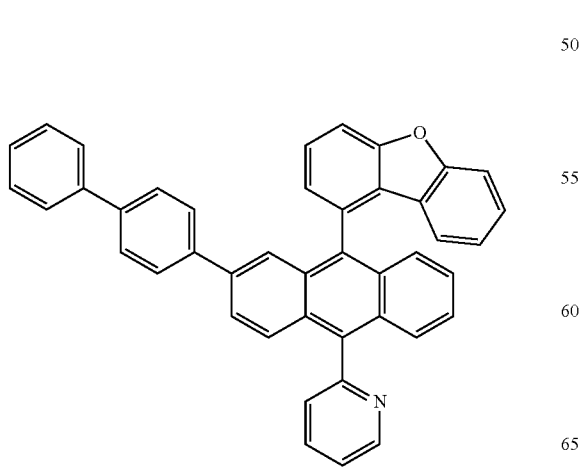
70
-continued
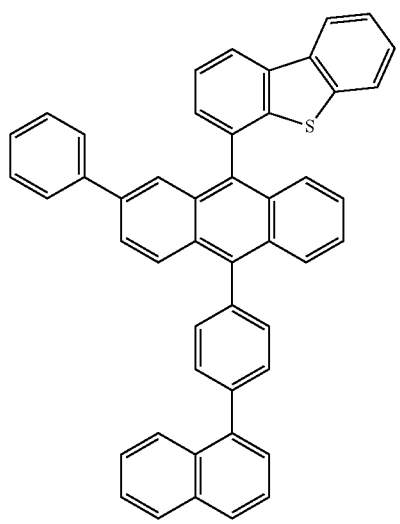
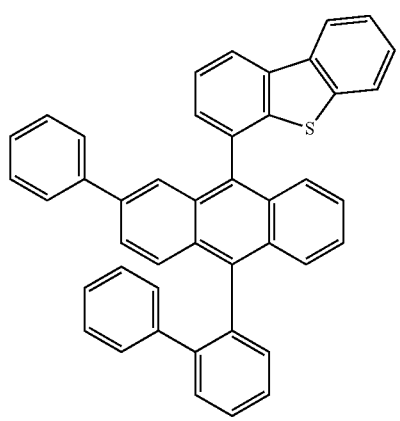
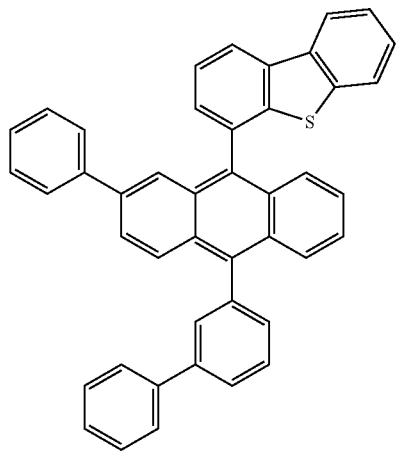

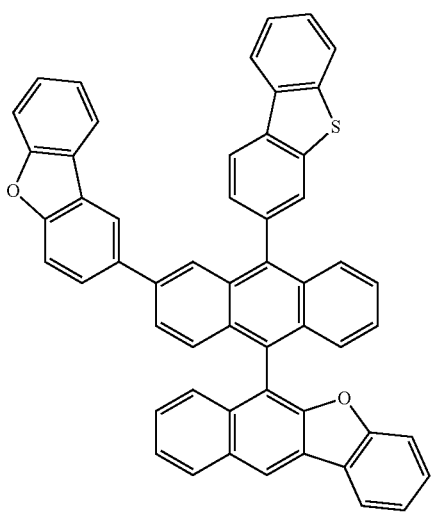
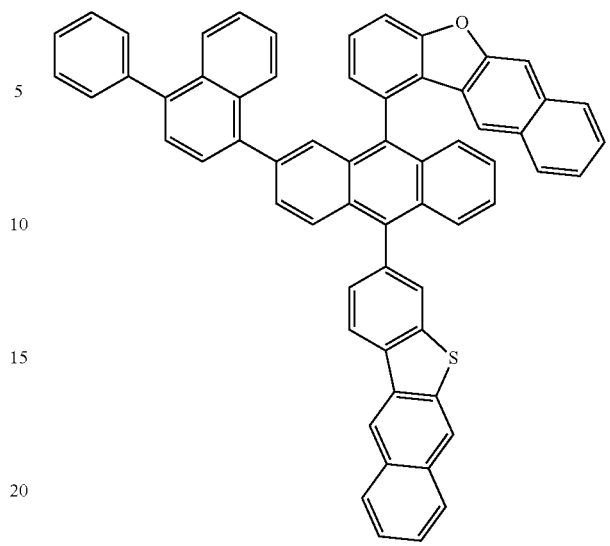
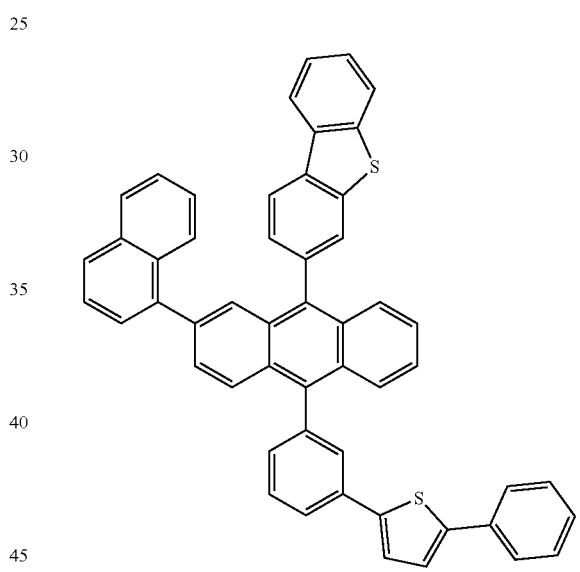
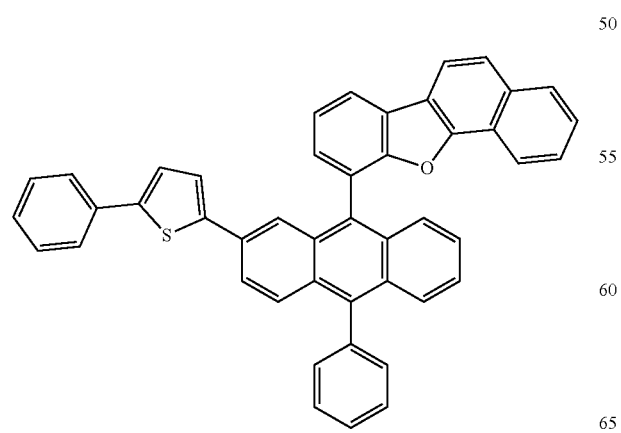
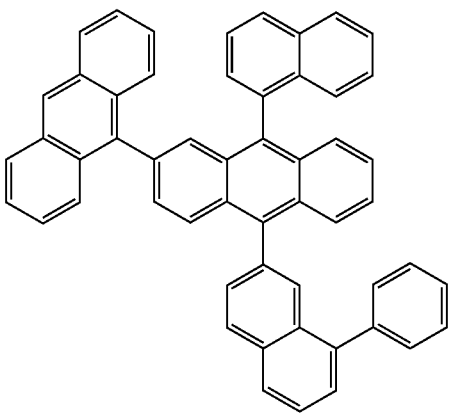

73
-continued
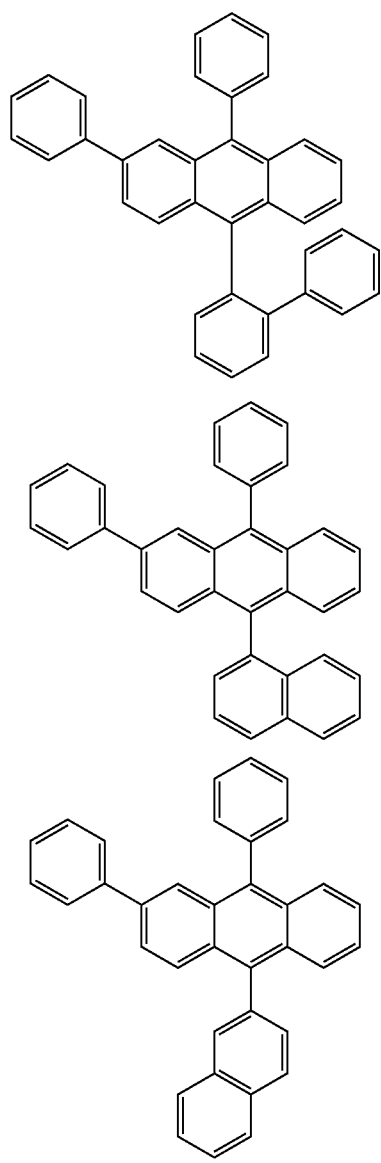
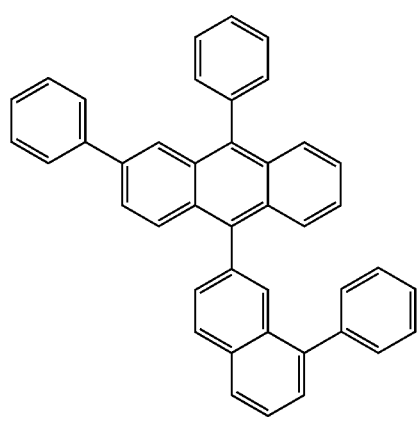
74
-continued
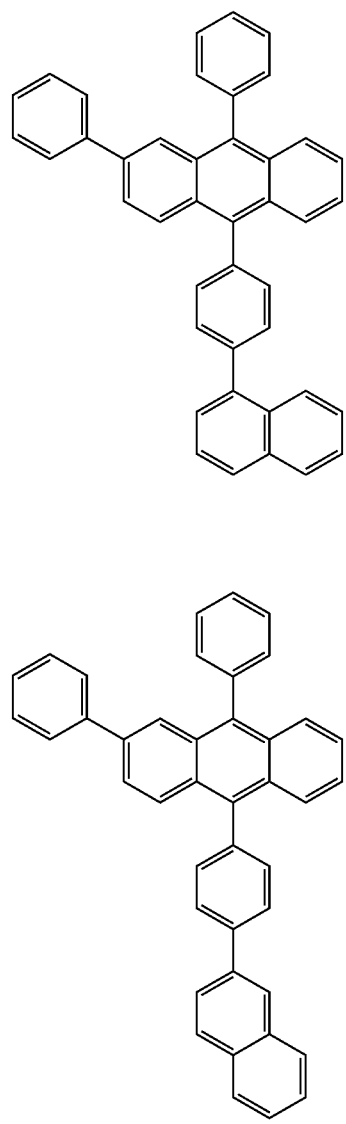
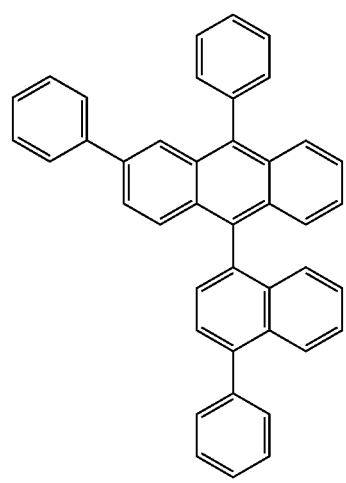

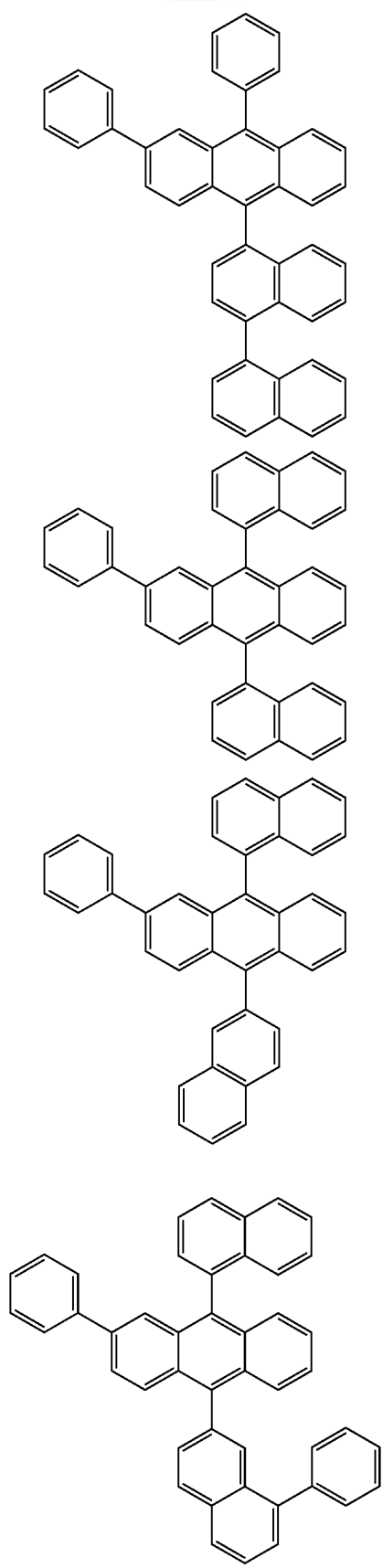
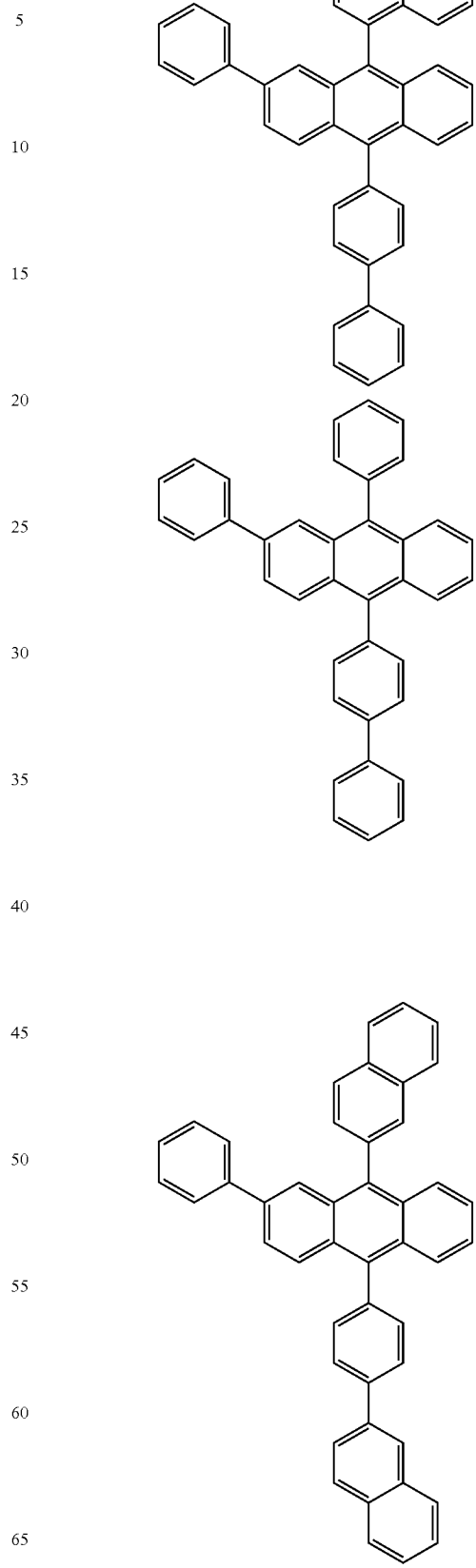

77
-continued
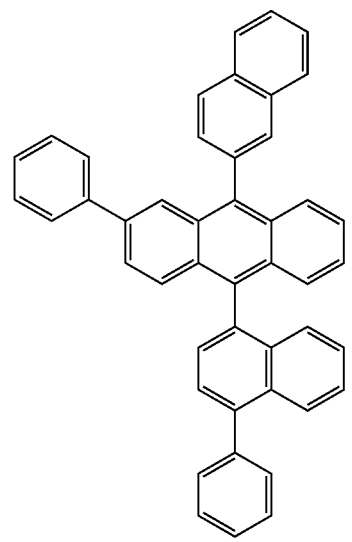
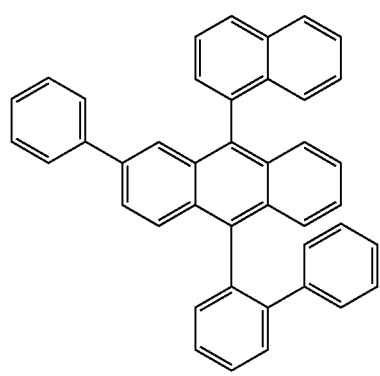
78
-continued
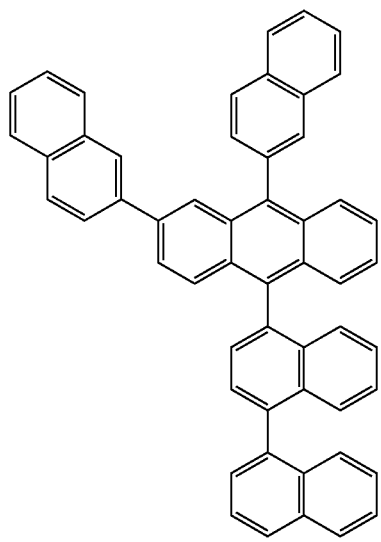 [SMILES: c1ccc(-c2ccc(-c3c4ccccc4c(-c4ccc5ccccc5c4)c4cc(-c5ccc6ccccc6c5)ccc34)c3ccccc23)cc1]
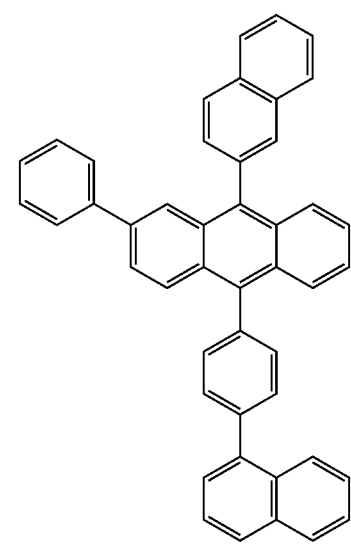
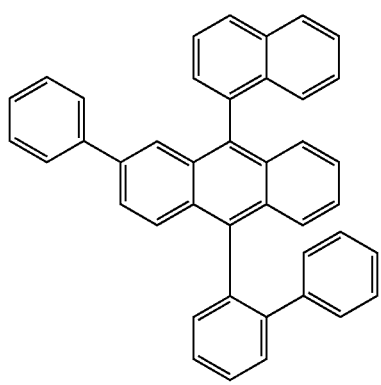

79
-continued
80
-continued
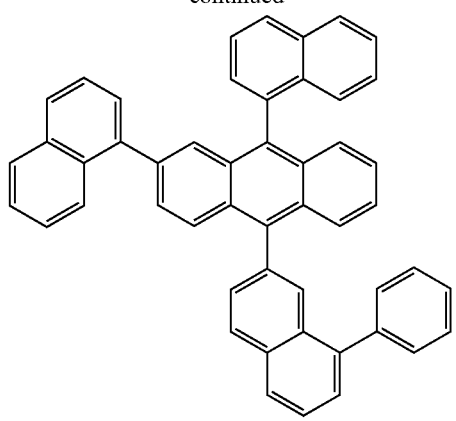
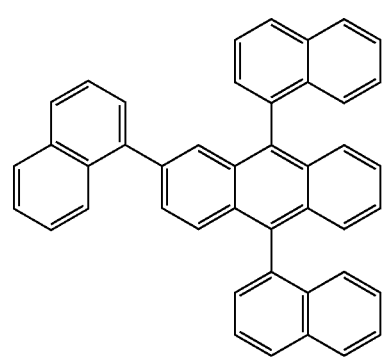
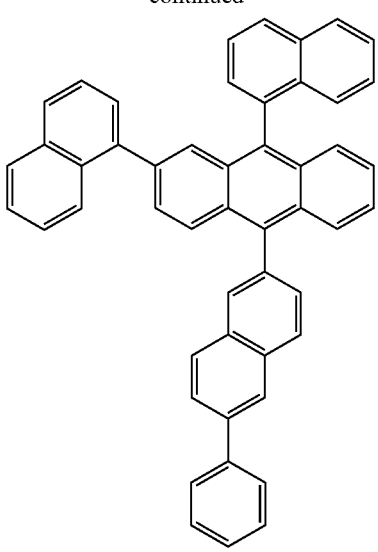
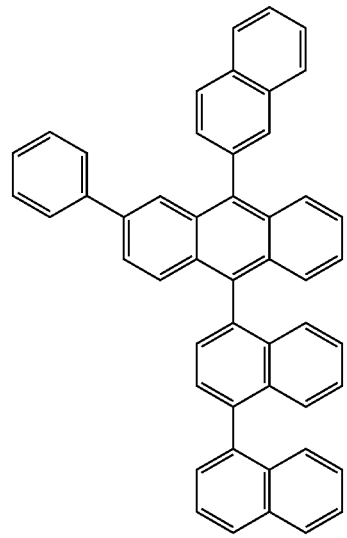
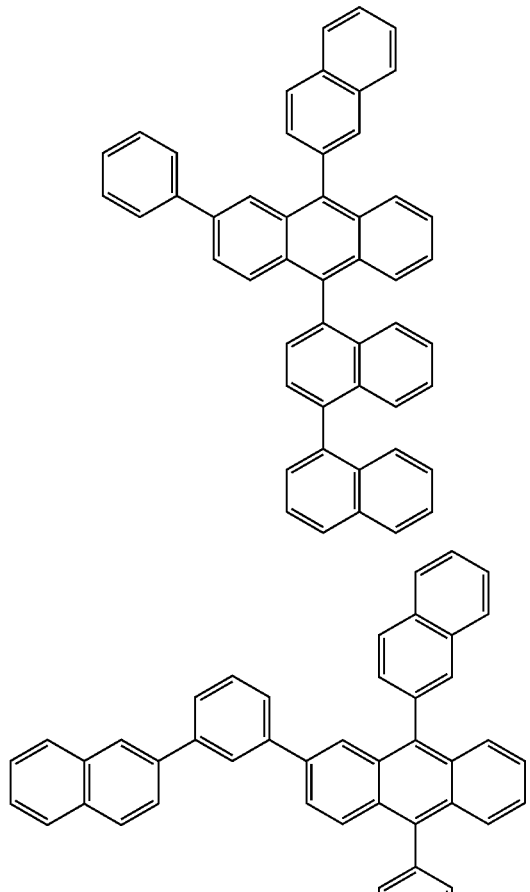

81
-continued
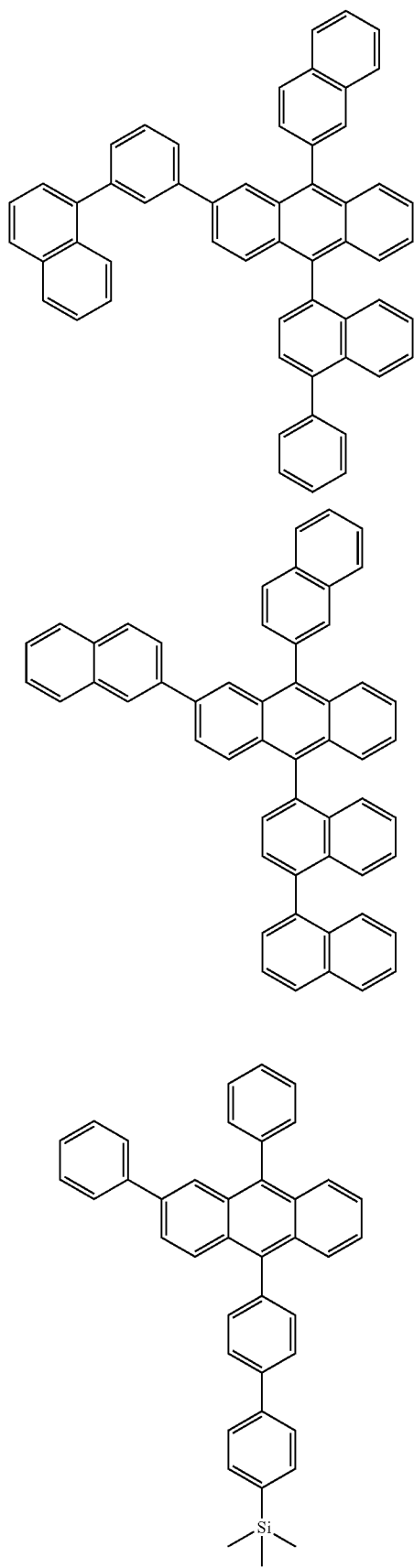
82
-continued
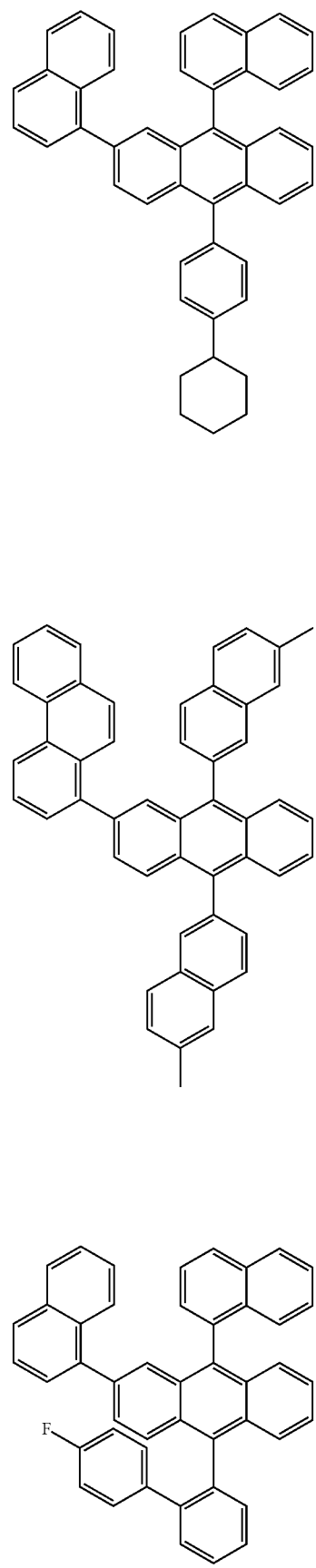

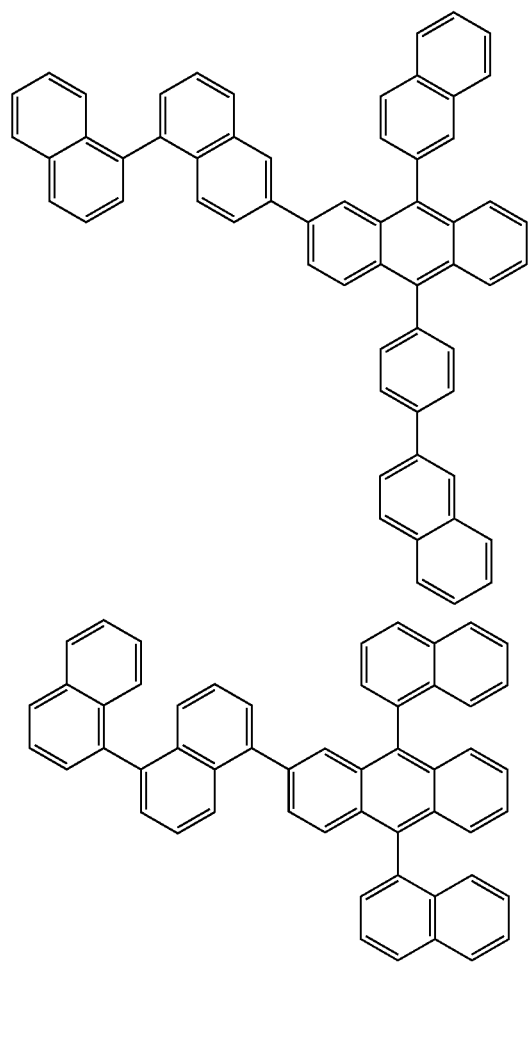
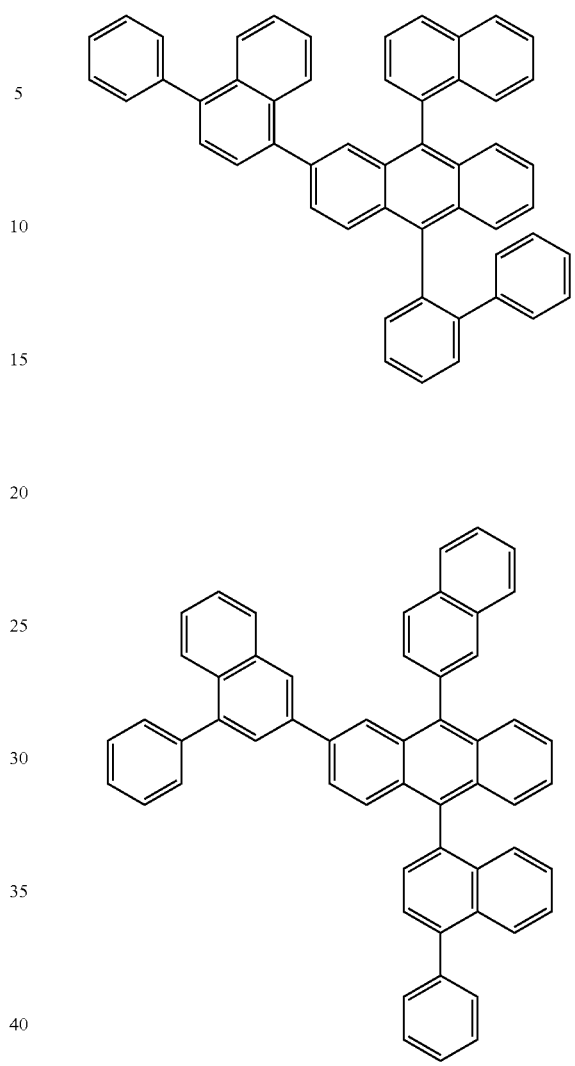
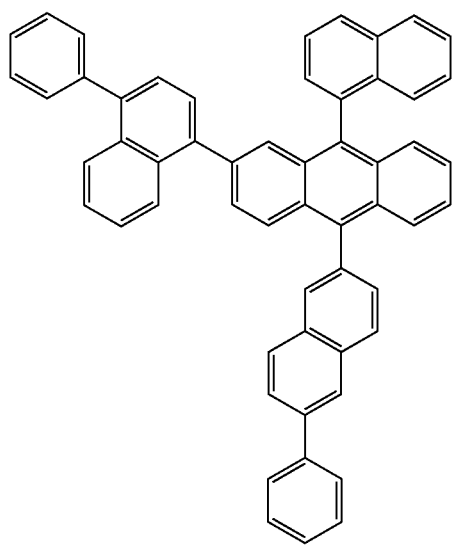 [SMILES: c1ccc(-c2ccc3cc(-c4c5ccccc5c(-c5cccc6ccccc56)c5cc(-c6ccc(-c7ccccc7)c7ccccc67)ccc45)ccc3c2)cc1]

85
-continued
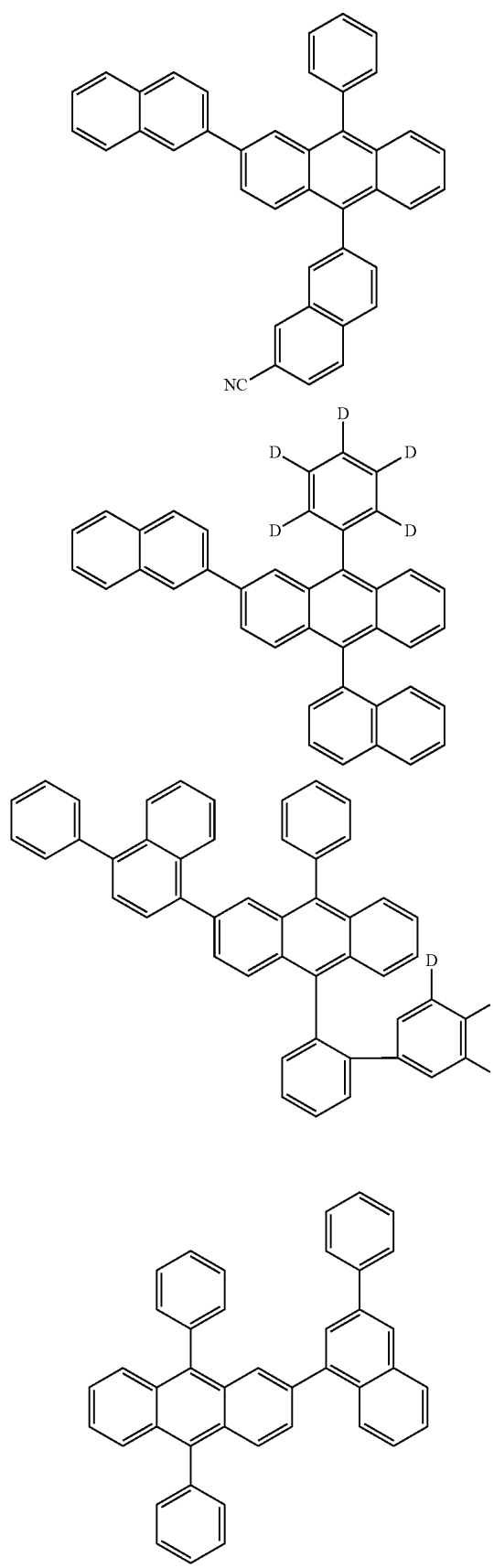
86
-continued
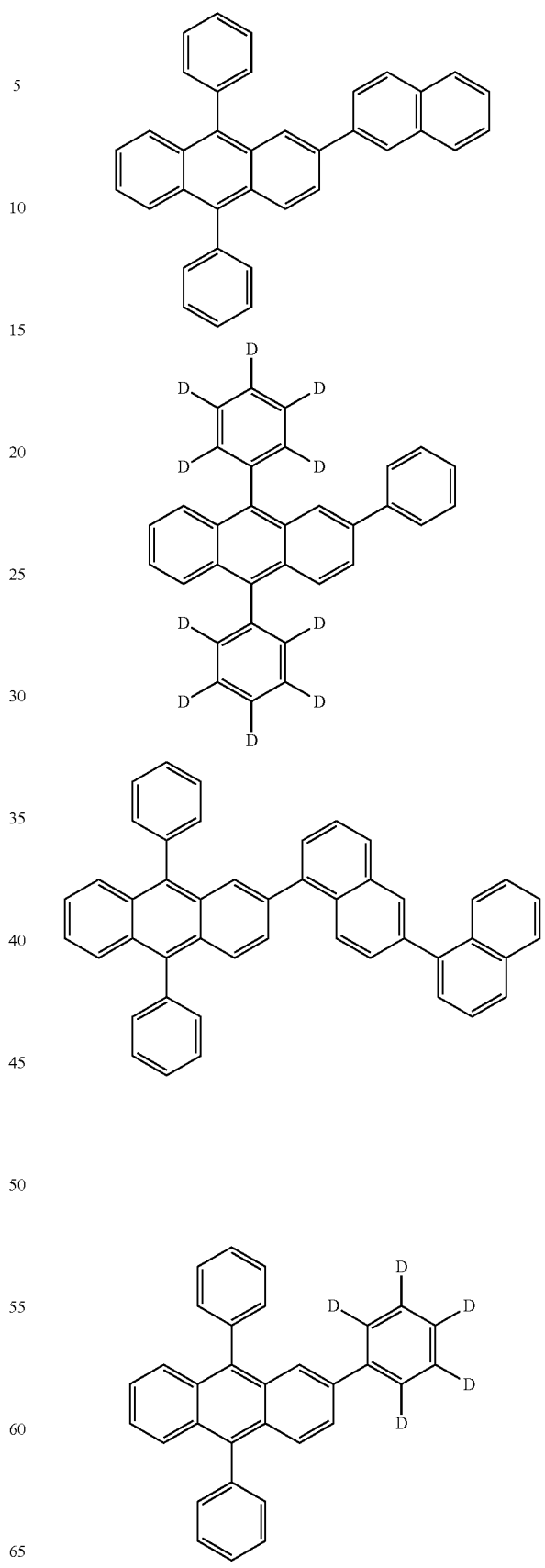

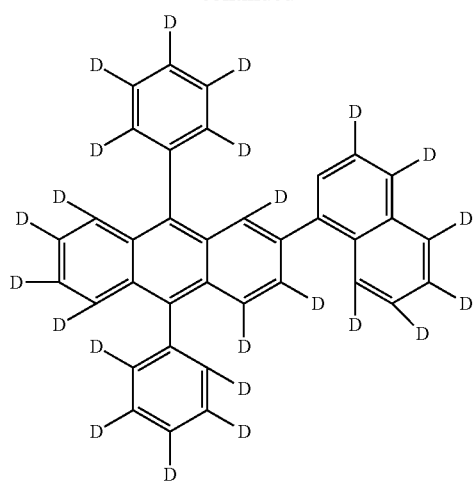
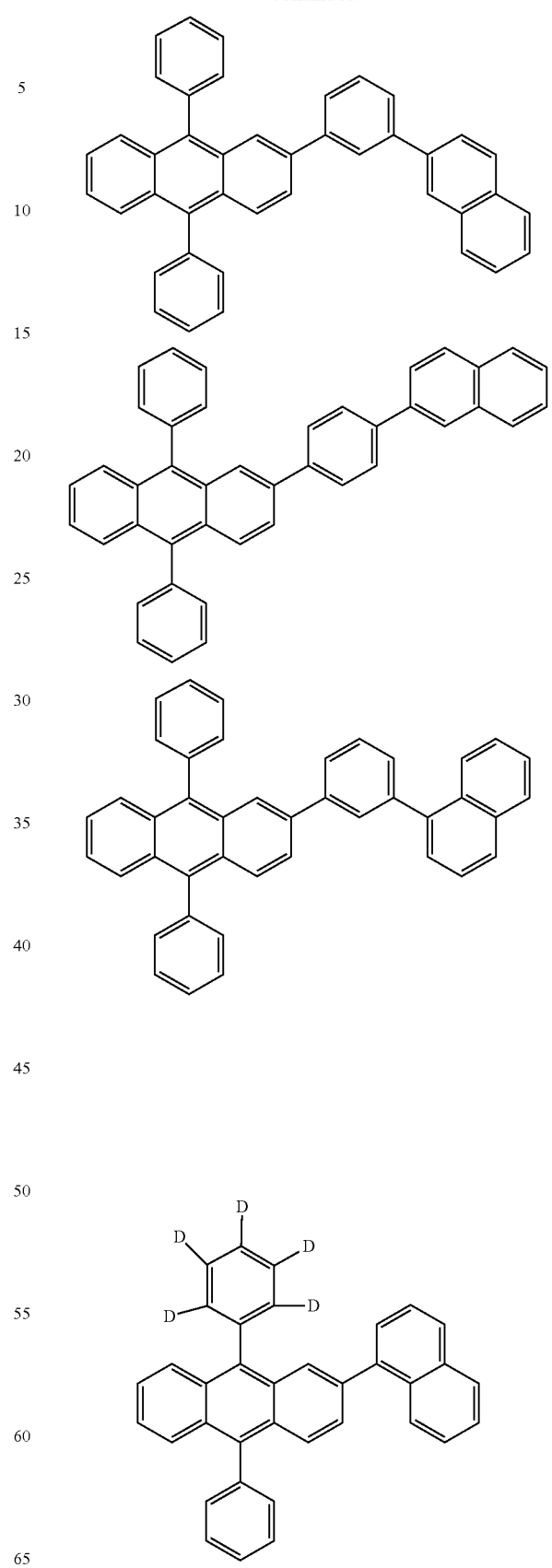

89
-continued
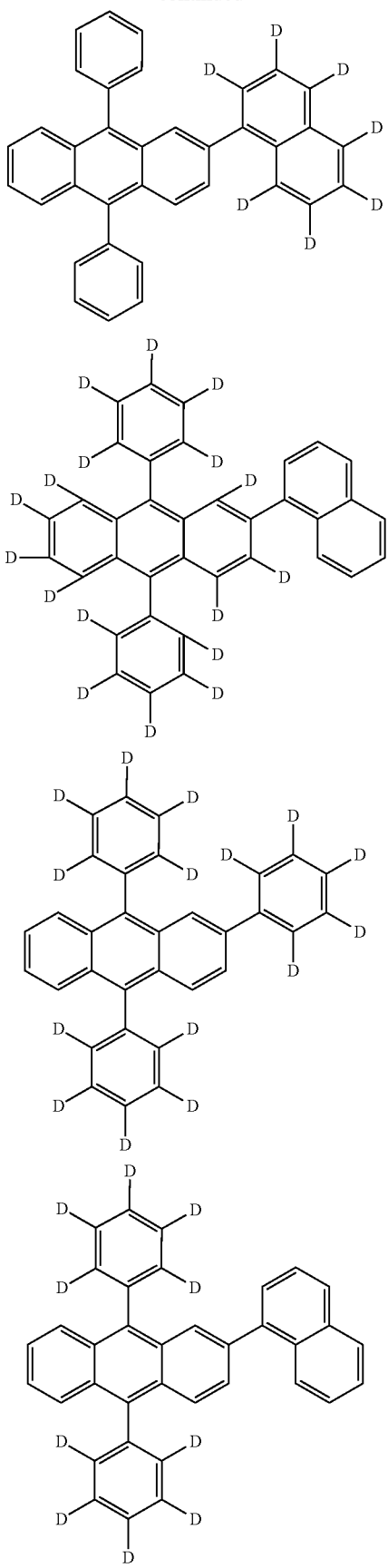
90
-continued
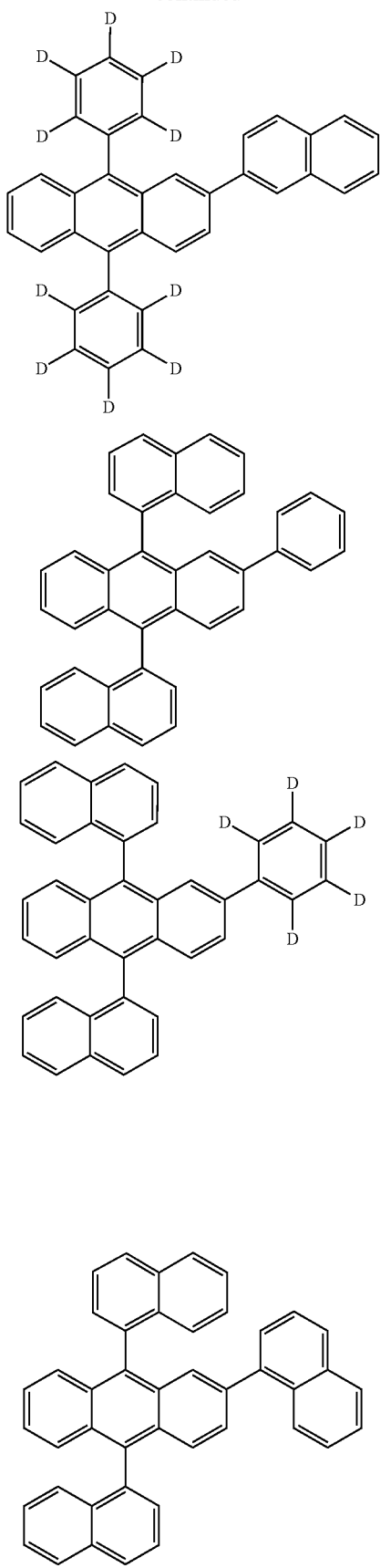

91
-continued
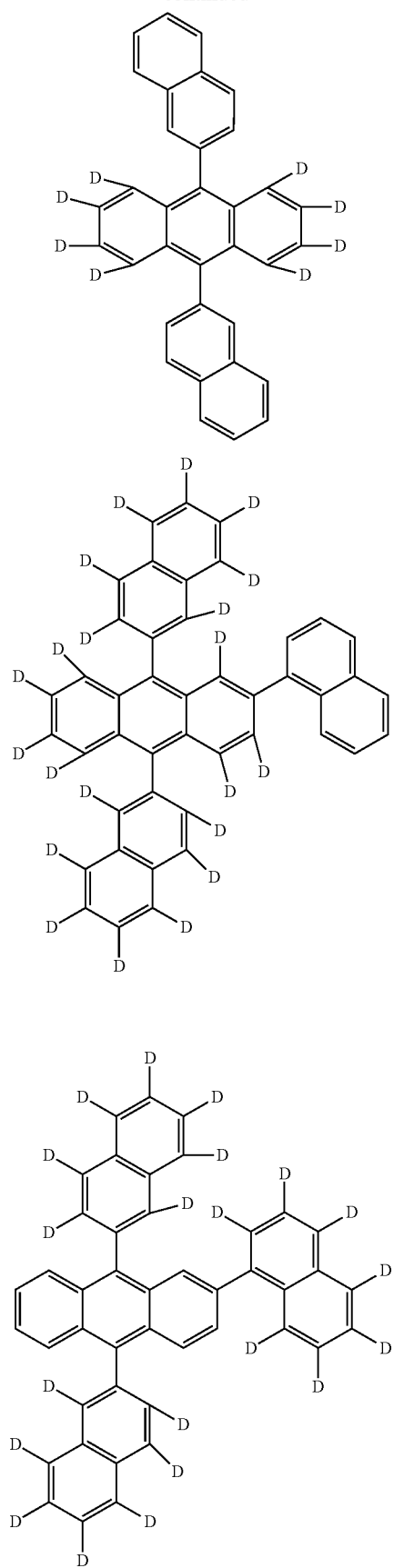
92
-continued
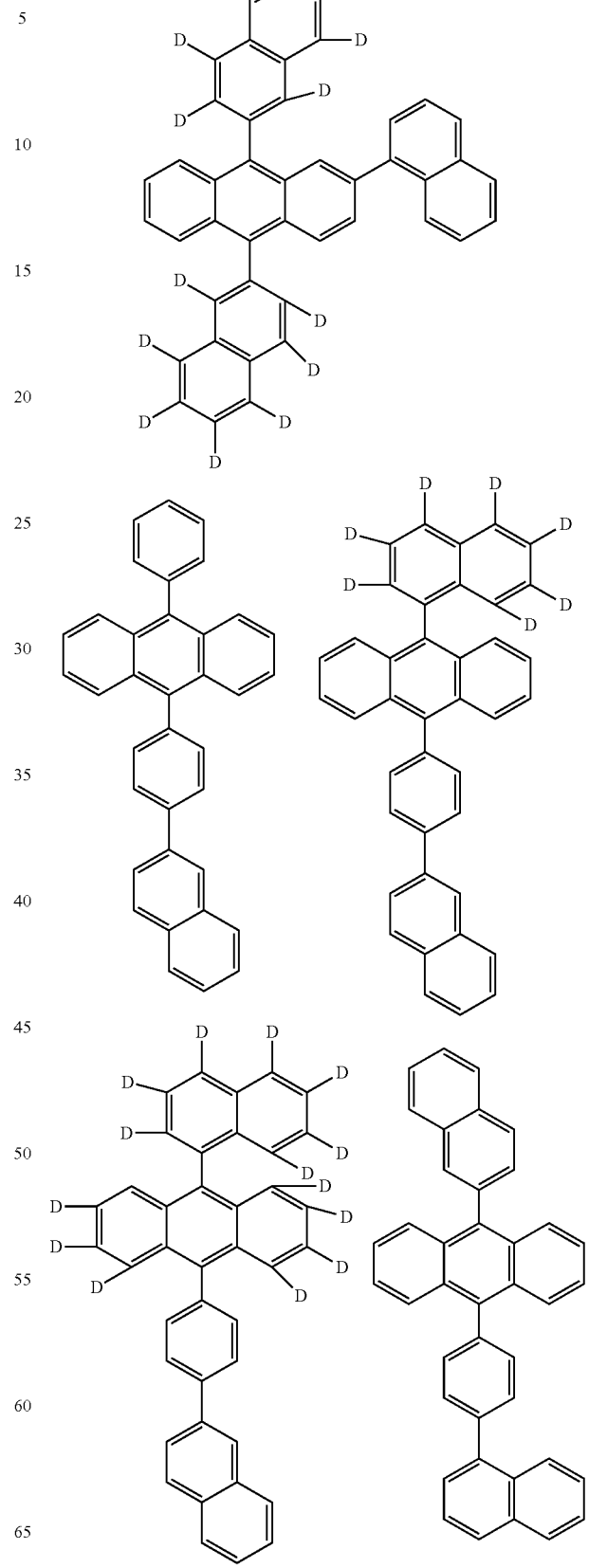

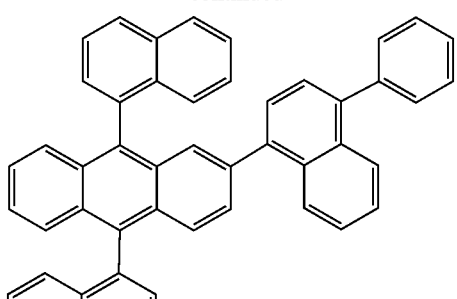
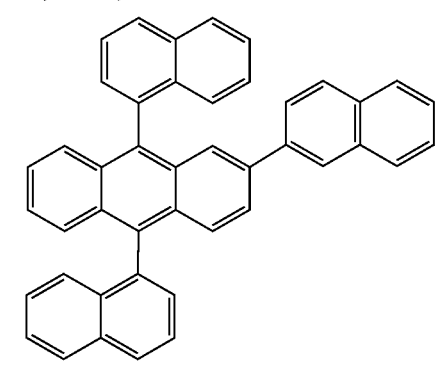
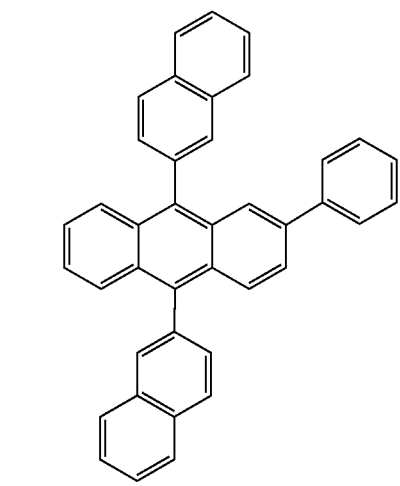
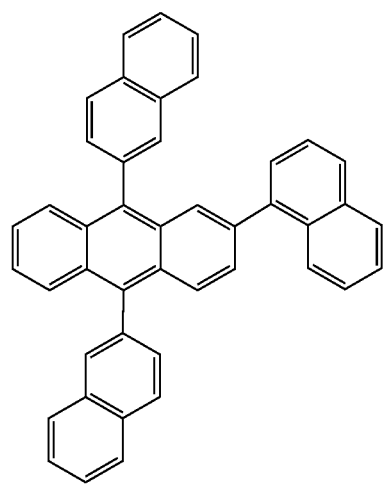
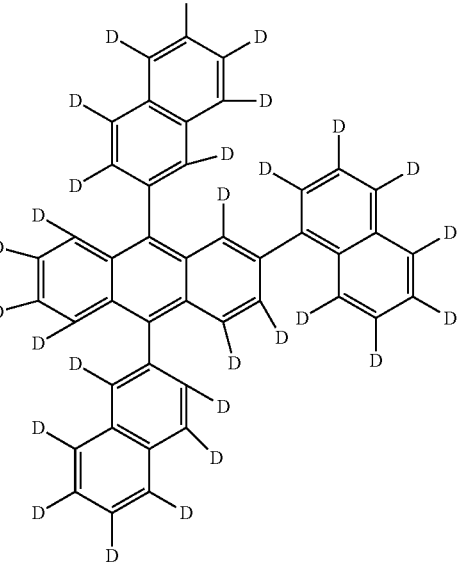
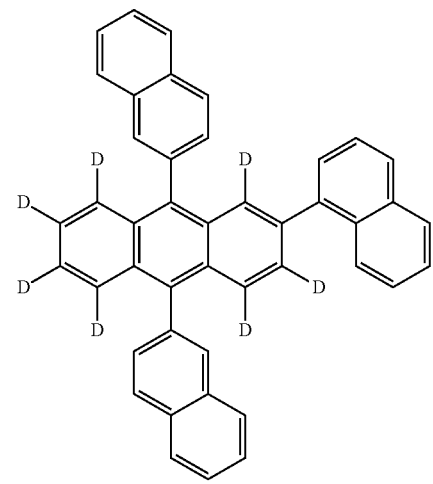
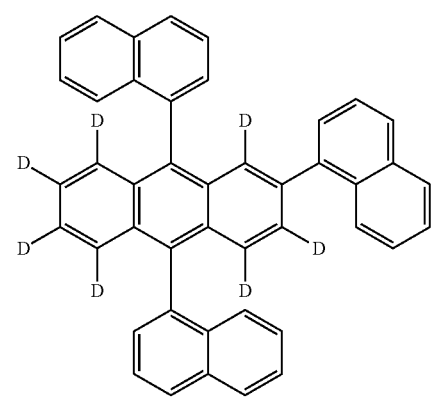

95
-continued
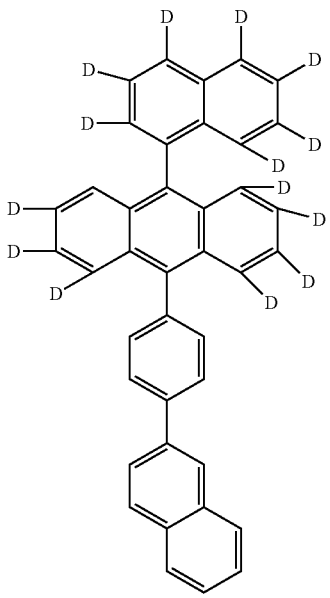
96
-continued
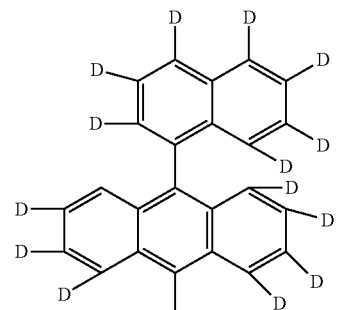
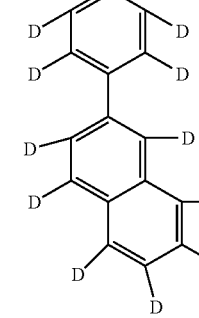
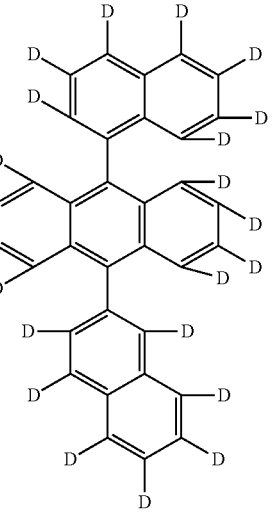
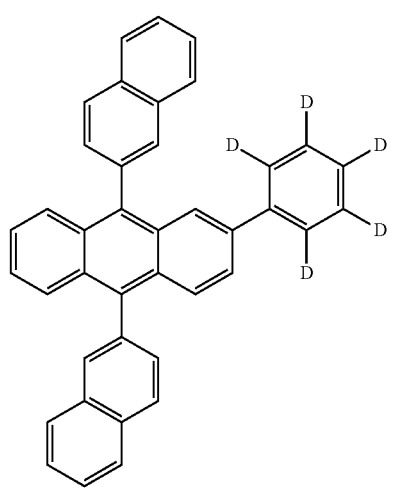

97
-continued
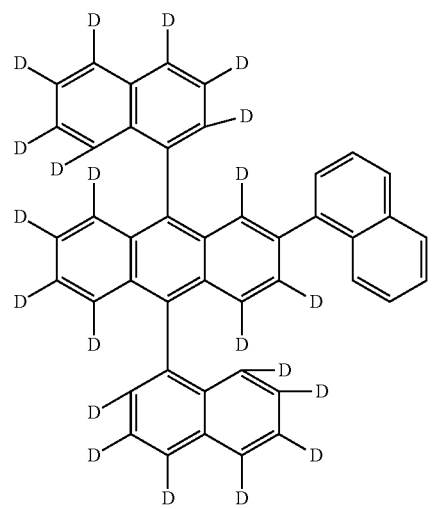
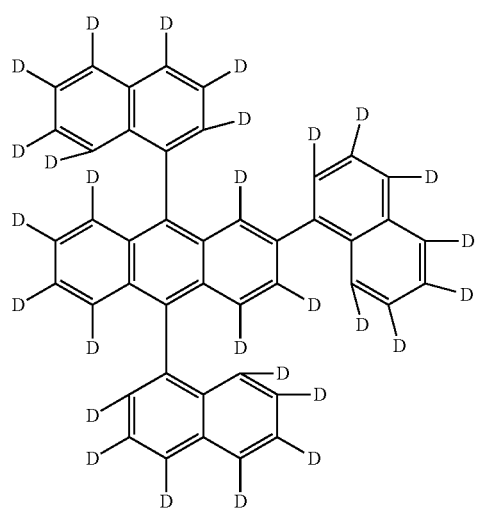
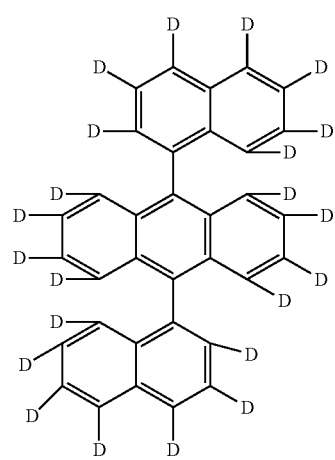
98
-continued
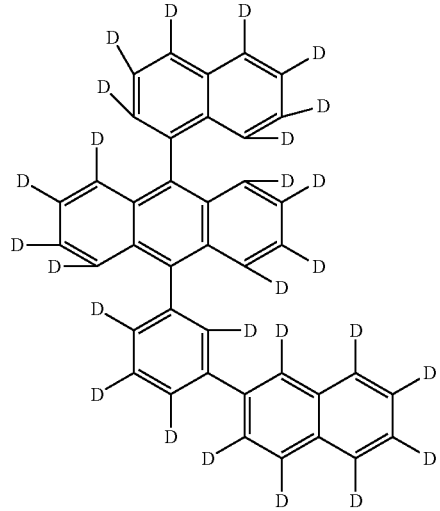
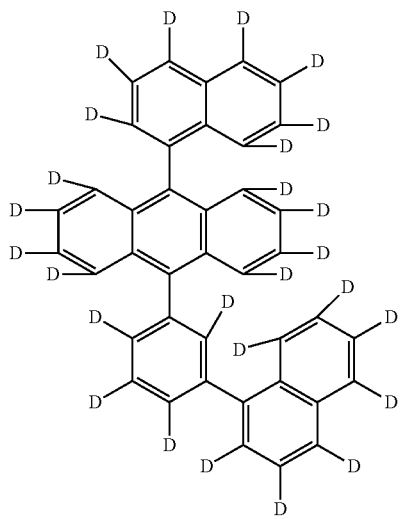
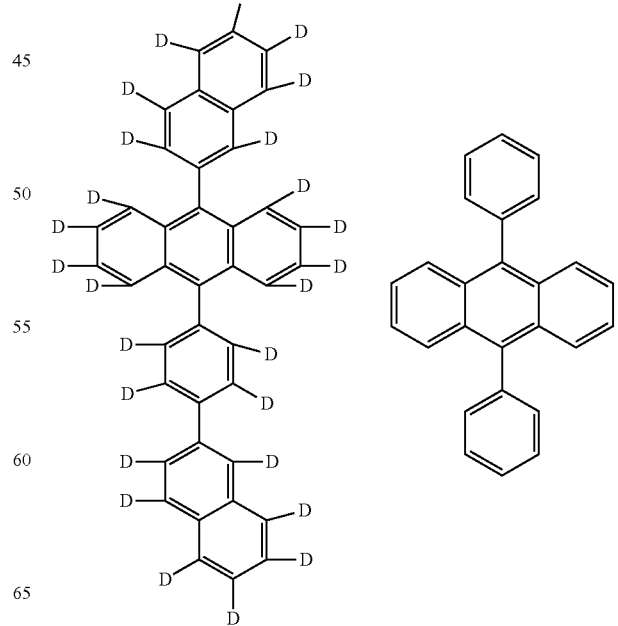

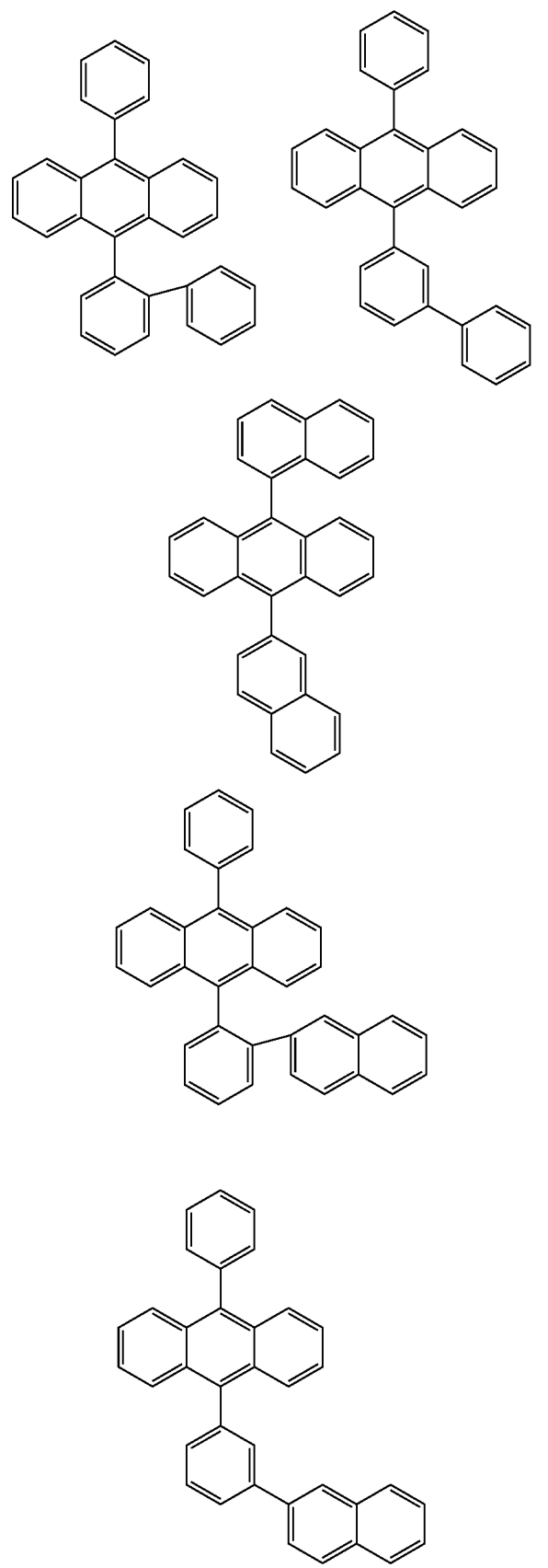
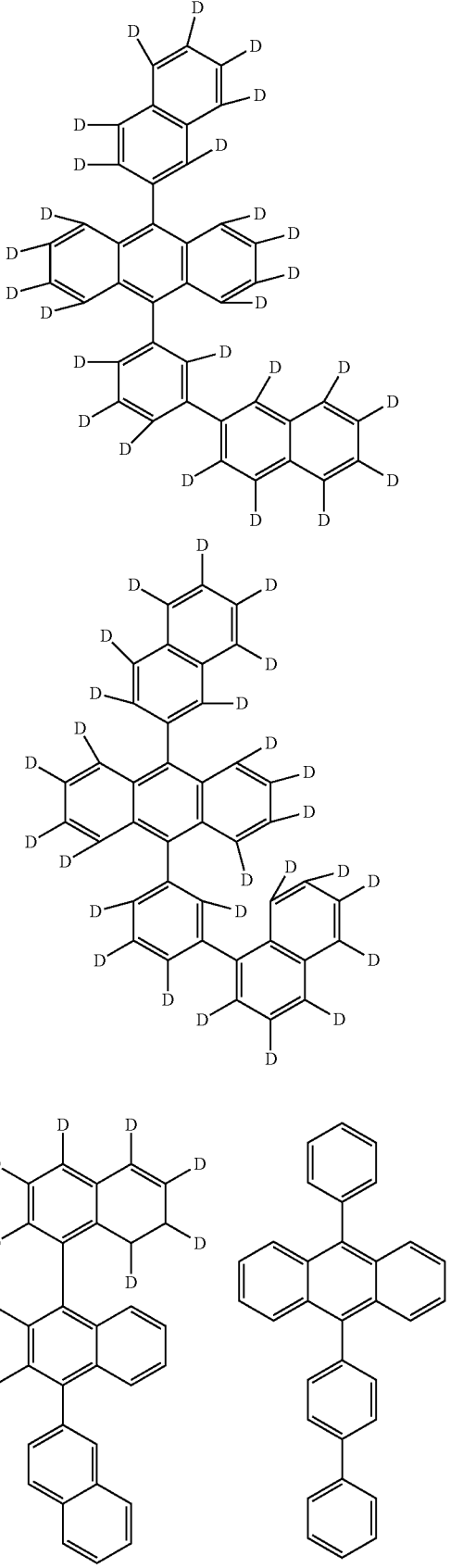

101
-continued
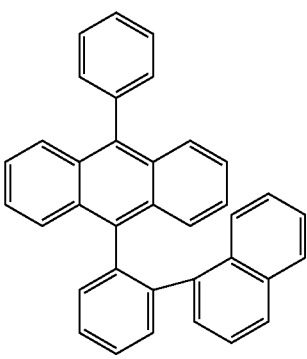
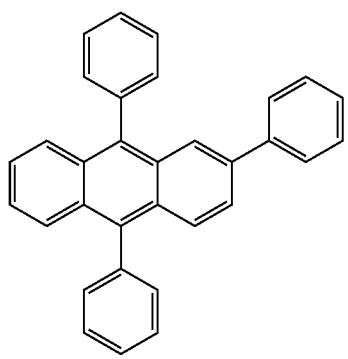
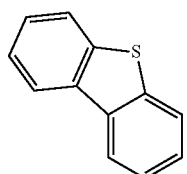
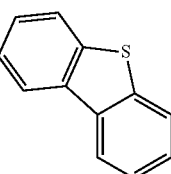
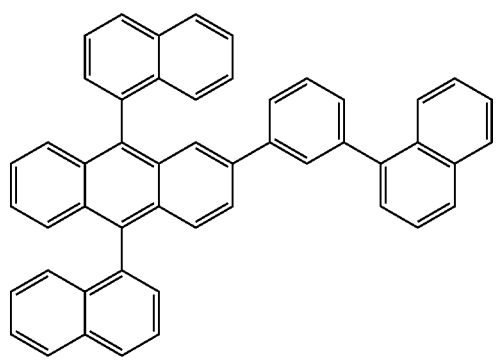
102
-continued
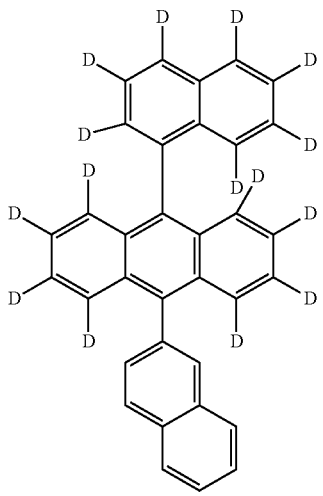
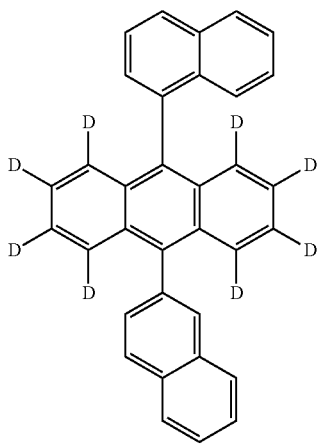
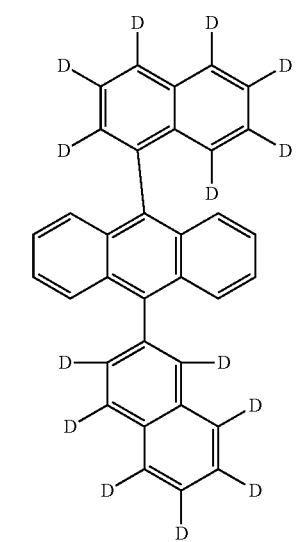

103
-continued
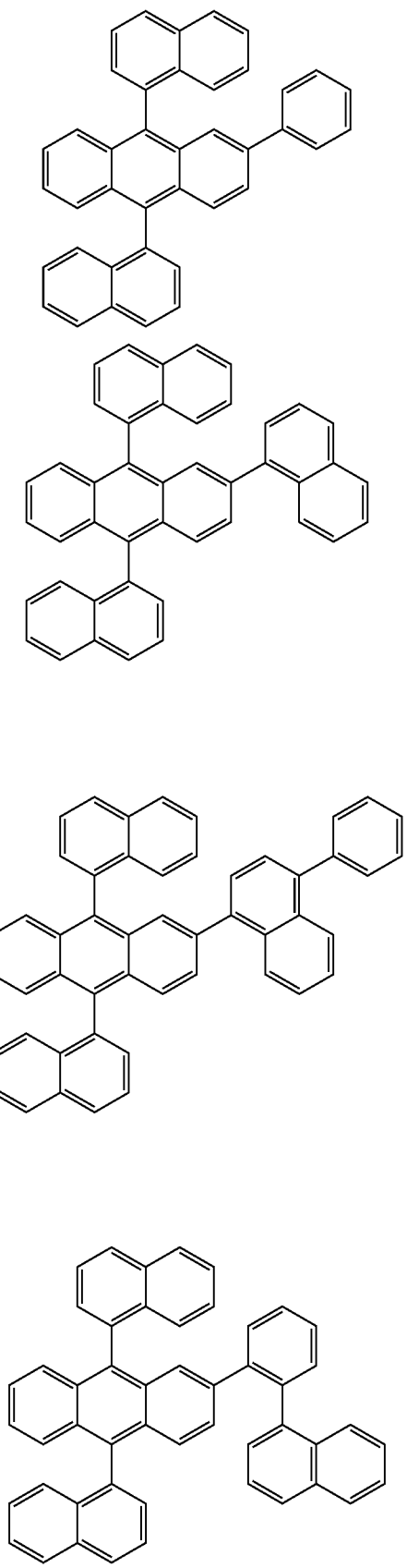
104
-continued
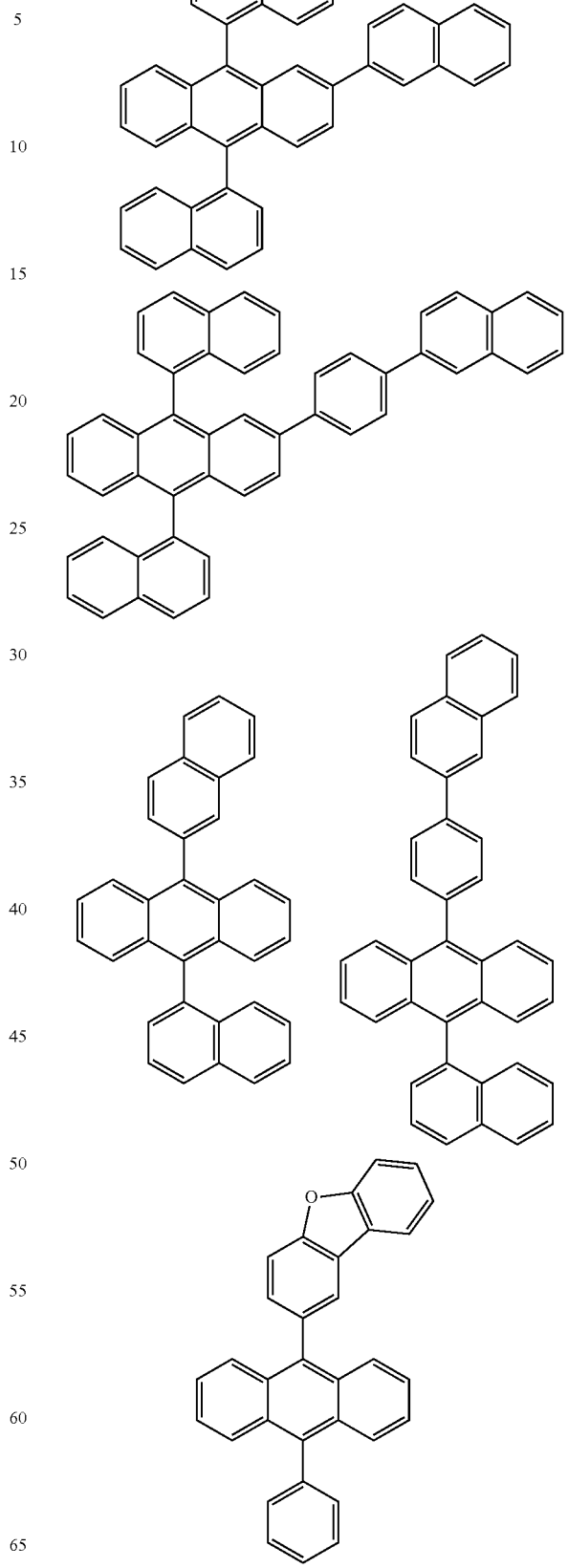

105
-continued
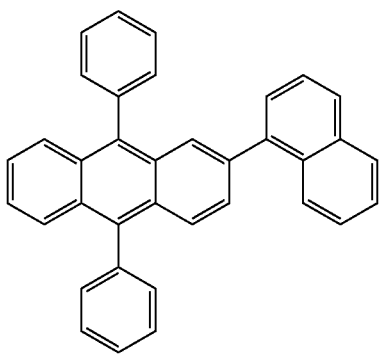
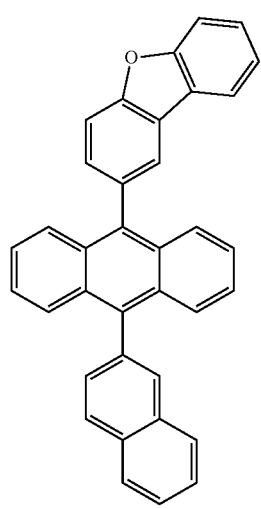
106
-continued
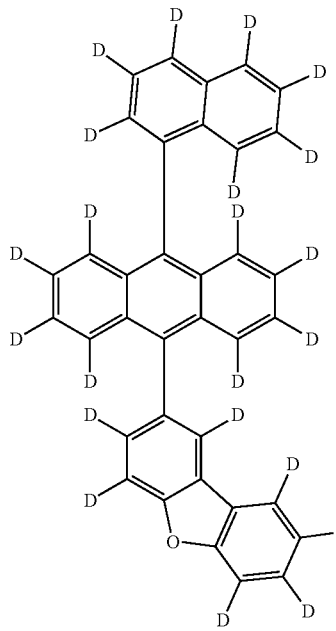
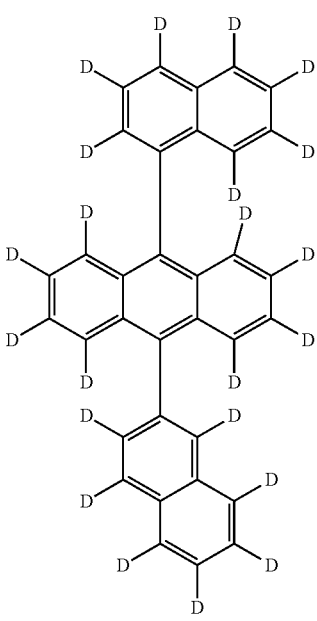
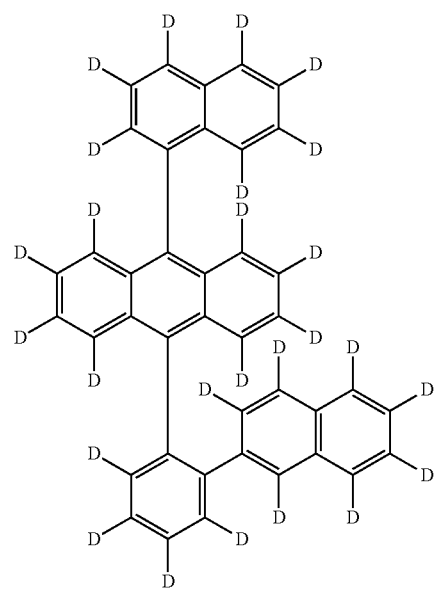

107
-continued
108
-continued
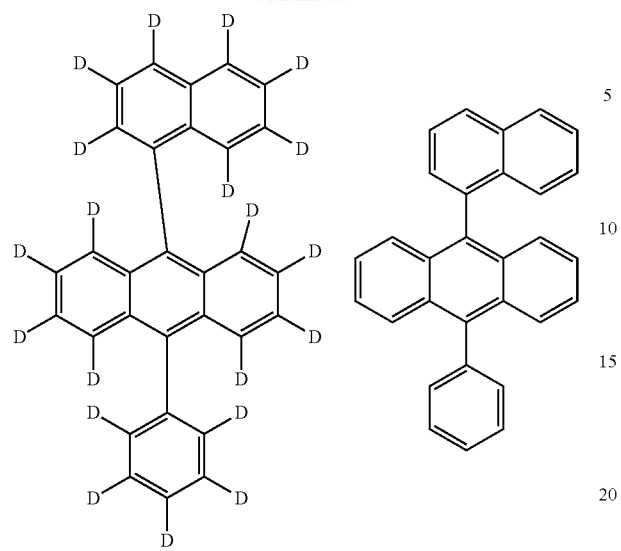
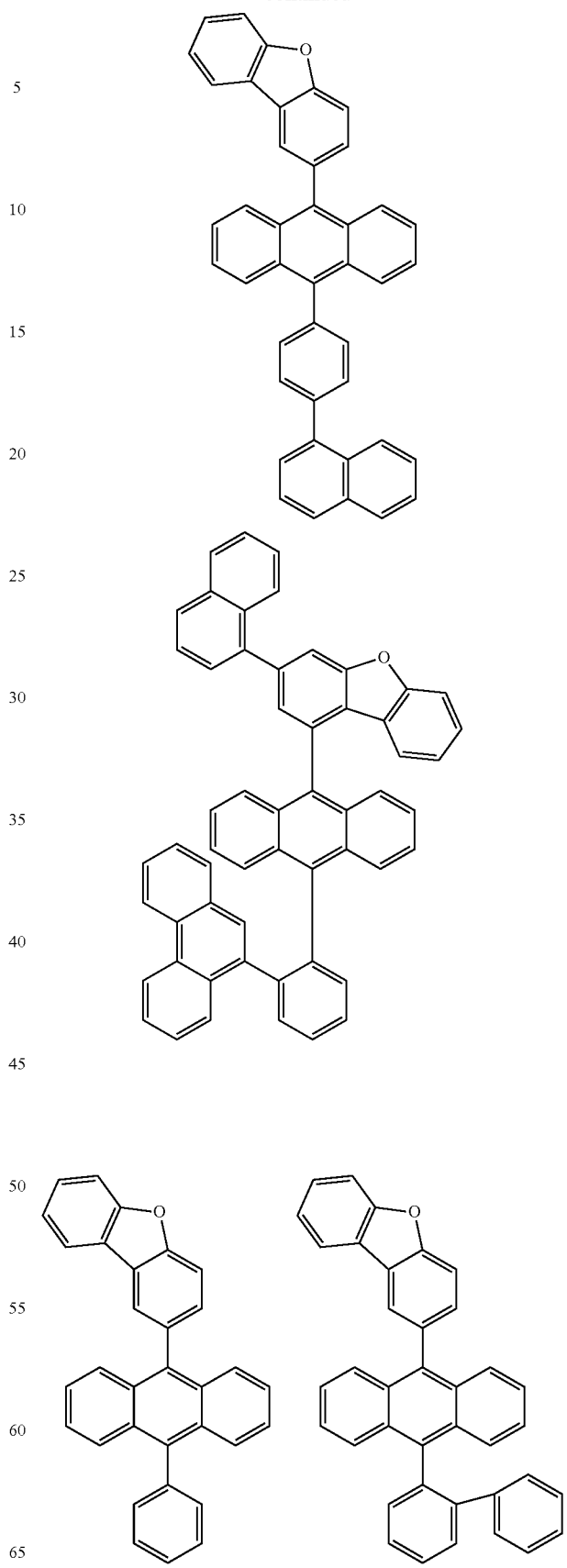

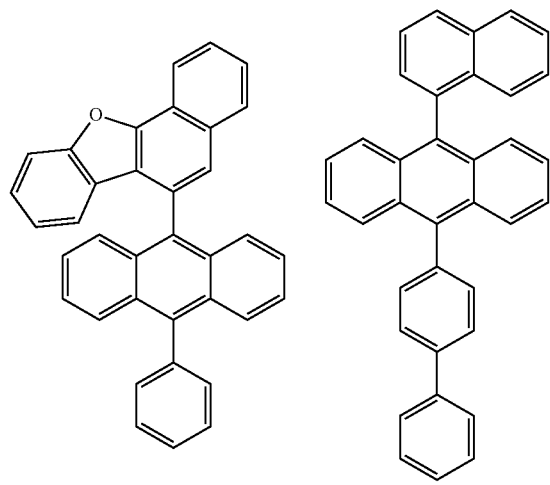
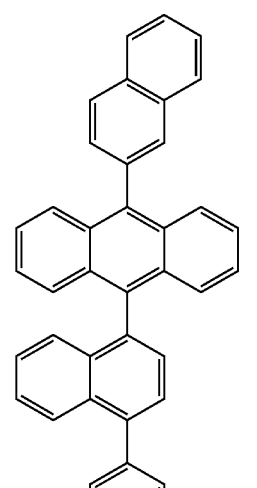
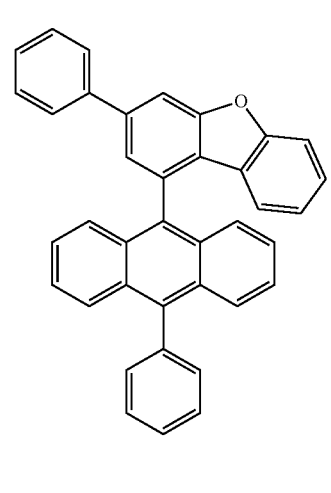
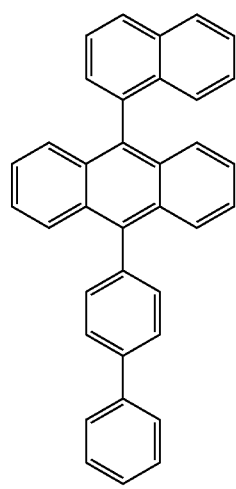
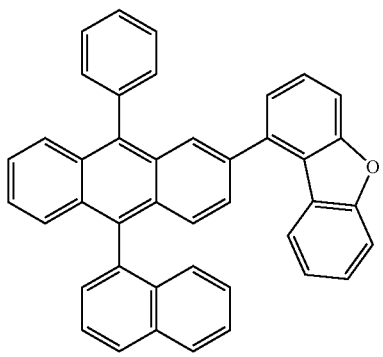
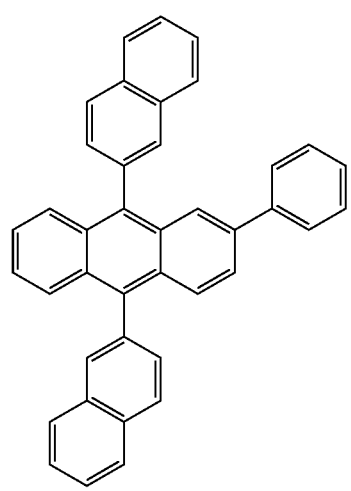
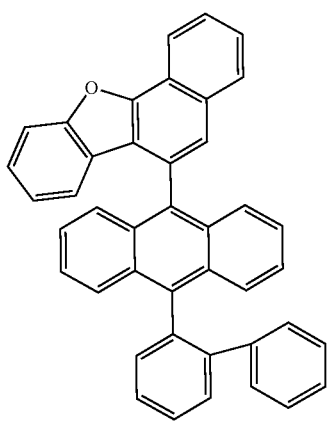

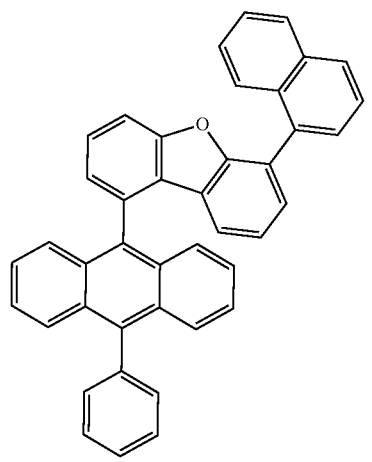
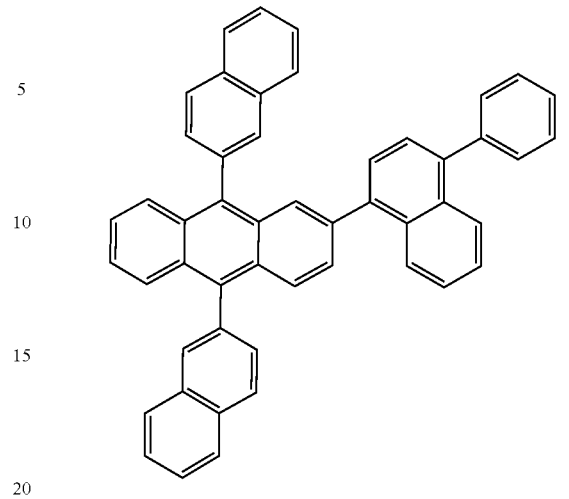
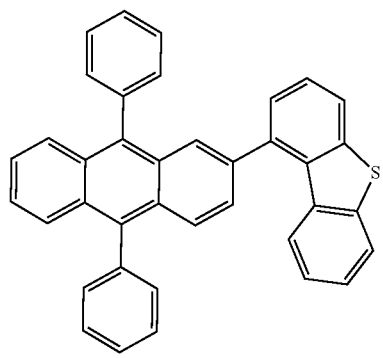
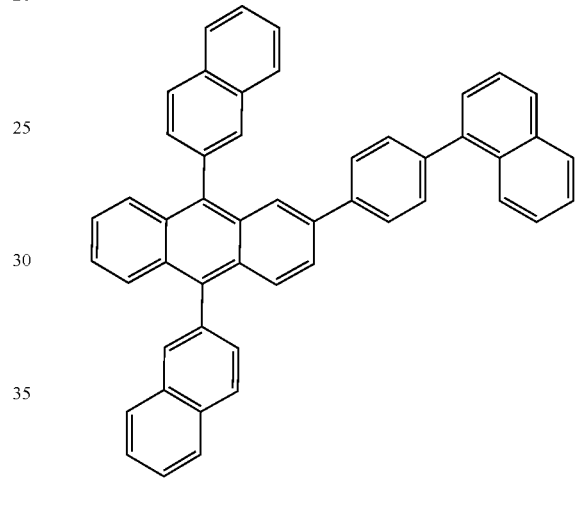
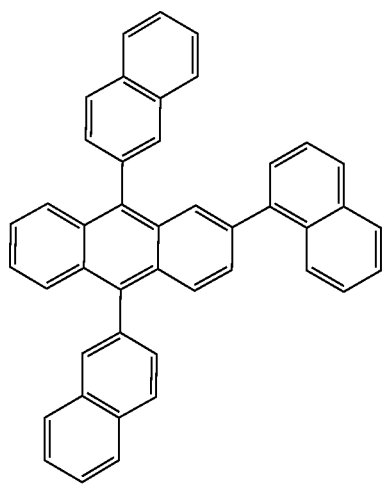
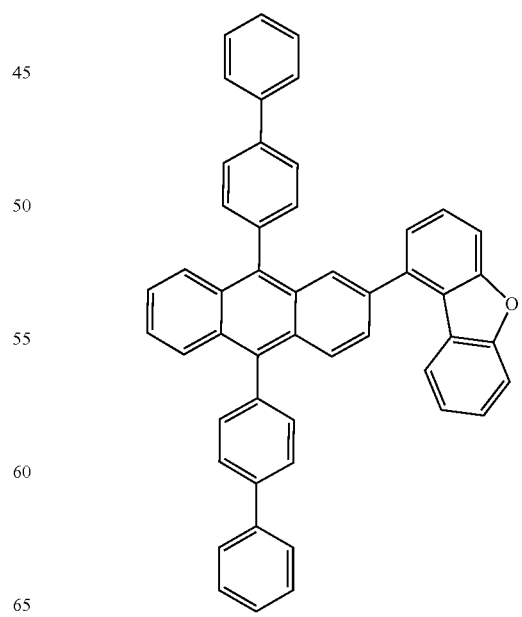

113
-continued
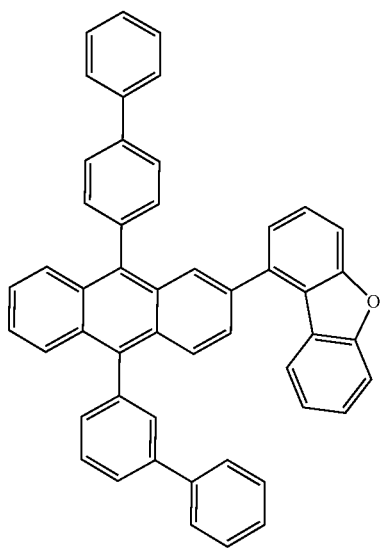
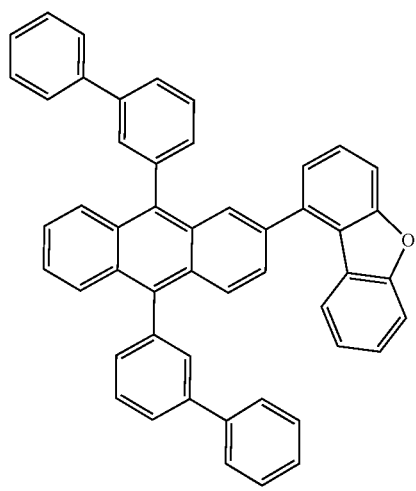
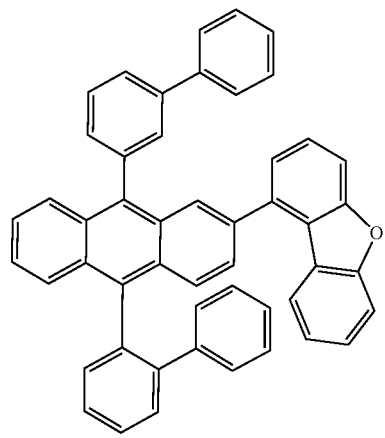
114
-continued
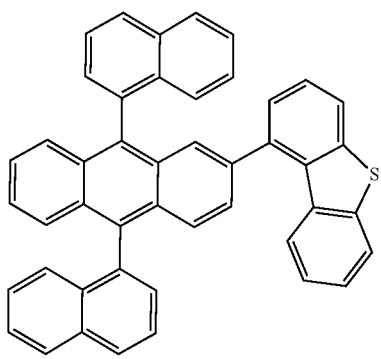
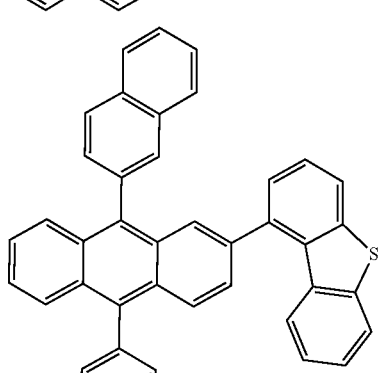
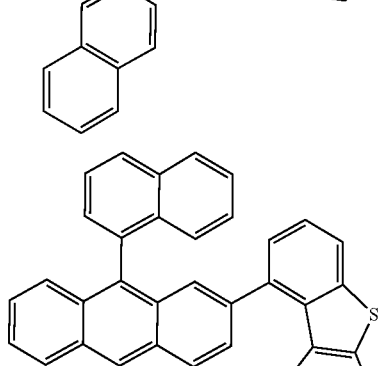
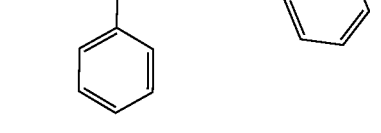

In a general organic light emitting device, excitons produced from the singlet and the triplet are produced at a ratio of 25:75 (singlet:triplet), and the organic light emitting device can be divided into fluorescence emission, phosphorescence emission, and thermally activated delayed fluorescence emission depending on the emission form due to the migration of excitons. The thermally activated delayed fluorescence (TADF) indicates a phenomenon in which reverse intersystem crossing (RISC) occurs from triplet excitons to singlet excitons, and also refers to TADF. When such a heat-activated delayed fluorescence is used, a 100% internal quantum efficiency equivalent to the phosphorescence emission is also possible theoretically even in fluorescence emission due to electric field excitation.

In order to exhibit the thermally activated delayed fluorescence, a reverse intersystem crossing to singlet excitons from 75% triplet excitons produced by electric field excitation at room temperature or a temperature of a light emitting layer in a light emitting device needs to occur. Further, the singlet excitons produced by the reverse intersystem crossing emit fluorescence like 25% singlet excitons produced by the direct excitation, so that the above-described 100% internal quantum efficiency is theoretically possible. In order for the reverse intersystem crossing to occur, the absolute value ($\Delta E_{st}$) of the difference between the lowest excited singlet energy level (S1) and the lowest excited triplet energy level (T1) is required to be small.

Since the compound of the present invention has delayed fluorescence characteristics of $\Delta E_{st}$ of less than 0.3 eV, excitons in a triplet excited state are subjected to reverse intersystem crossing in a singlet excited state to transfer the energy thereof to a dopant, thereby implementing an organic light emitting device having high efficiency.

In general, materials having $\Delta Est$ of less than 0.3 eV satisfy delayed fluorescence characteristics, and the delayed fluorescence characteristics of materials can be confirmed by measuring a photoluminescence quantum yield (PLQY) and measuring the lifetime of excitons. When the PLQY difference between the nitrogen atmosphere and the oxygen atmosphere is large, the material has a delayed fluorescence characteristic, and the shorter the lifetime of excitons in microseconds, the stronger the delayed fluorescence characteristic.

The organic light emitting device of the present specification can be manufactured by conventional manufacturing methods and using conventional materials for an organic light emitting device, except that an organic material layer having one or more layers is formed using the above-described compound of Formula 1.

During the manufacture of an organic light emitting device in which an organic material layer including the compound of Formula 1 is formed, the compound can be formed as an organic material layer by not only a vacuum deposition method, but also a solution application method. Here, the solution application method means spin coating, dip coating, inkjet printing, screen printing, a spray method, roll coating, and the like, but is not limited thereto.

The organic material layer of the organic light emitting device of the present specification can have a single-layered structure, but can also have a multi-layered structure in which two or more organic material layers are stacked. For example, the organic light emitting device of the present invention can have a structure including one or more layers of a hole transport layer, a hole injection layer, an electron blocking layer, a layer which simultaneously transports and injects holes, an electron transport layer, an electron injection layer, a hole blocking layer, and a layer which simultaneously transports and injects electrons as organic material layers. However, the structure of the organic light emitting device of the present specification is not limited thereto, and can include fewer or greater number of organic material layers.

In the organic light emitting device of the present specification, the organic material layer may include a hole transport layer or a hole injection layer, and the hole transport layer or the hole injection layer may include the above-described compound of Formula 1.

In another organic light emitting device of the present specification, the organic material layer may include an electron transport layer or an electron injection layer, and the electron transport layer or the electron injection layer may include the above-described compound of Formula 1.

In still another organic light emitting device of the present specification, the organic material layer may include a light emitting layer, and the light emitting layer may include the above-described compound of Formula 1.

According to yet another exemplary embodiment, the organic material layer can include a light emitting layer, and the light emitting layer can include the compound as a doping material for the light emitting layer.

In an exemplary embodiment of the present specification, the first electrode is a positive electrode, and the second electrode is a negative electrode.

According to another exemplary embodiment, the first electrode is a negative electrode, and the second electrode is a positive electrode.

The organic light emitting device can have, for example, a stacking structure described below, but the stacking structure is not limited thereto:

(1) Positive electrode/Hole transport layer/Light emitting layer/Negative electrode;
(2) Positive electrode/Hole injection layer/Hole transport layer/Light emitting layer/Negative electrode;
(3) Positive electrode/Hole transport layer/Light emitting layer/Electron transport layer/Negative electrode;
(4) Positive electrode/Hole transport layer/Light emitting layer/Electron transport layer/Electron injection layer/Negative electrode;
(5) Positive electrode/Hole injection layer/Hole transport layer/Light emitting layer/Electron transport layer/Negative electrode;
(6) Positive electrode/Hole injection layer/Hole transport layer/Light emitting layer/Electron transport layer/Electron injection layer/Negative electrode;
(7) Positive electrode/Hole transport layer/Electron blocking layer/Light emitting layer/Electron transport layer/Negative electrode;
(8) Positive electrode/Hole transport layer/Electron blocking layer/Light emitting layer/Electron transport layer/Electron injection layer/Negative electrode;
(9) Positive electrode/Hole injection layer/Hole transport layer/Electron blocking layer/Light emitting layer/Electron transport layer/Negative electrode;
(10) Positive electrode/Hole injection layer/Hole transport layer/Electron blocking layer/Light emitting layer/Electron transport layer/Electron injection layer/Negative electrode;
(11) Positive electrode/Hole transport layer/Light emitting layer/Hole blocking layer/Electron transport layer/Negative electrode;
(12) Positive electrode/Hole transport layer/Light emitting layer/Hole blocking layer/Electron transport layer/Electron injection layer/Negative electrode;

(13) Positive electrode/Hole injection layer/Hole transport layer/Light emitting layer/Hole blocking layer/Electron transport layer/Negative electrode; or

(14) Positive electrode/Hole injection layer/Hole transport layer/Light emitting layer/Hole blocking layer/Electron transport layer/Electron injection layer/Negative electrode.

The organic light emitting device of the present specification can have a structure as illustrated in FIGS. 1 and 2, but is not limited thereto.

FIG. 1 illustrates an organic light emitting device in which a positive electrode 2, a light emitting layer 3, and a negative electrode 4 are sequentially stacked on a substrate 1. In the structure illustrated in FIG. 1, the compound of Formula 1 of the present application may be included in the light emitting layer 3.

FIG. 2 illustrates an organic light emitting device in which a positive electrode 2, a hole injection layer 5, a first hole transport layer 6-1, a second hole transport layer 6-2, a light emitting layer 7, a layer 8 which simultaneously injects and transports electrons, and a negative electrode 4 are sequentially stacked on a substrate 1. In the structure illustrated in FIG. 2, the compound of Formula 1 of the present invention may be included in the light emitting layer 7.

For example, the organic light emitting device according to the present specification can be manufactured by depositing a metal or a metal oxide having conductivity, or an alloy thereof on a substrate to form a positive electrode, forming an organic material layer including a hole injection layer, a hole transport layer, a light emitting layer, an electron blocking layer, an electron transport layer, and an electron injection layer thereon, and then depositing a material, which can be used as a negative electrode, thereon, by using a physical vapor deposition (PVD) method such as sputtering or e-beam evaporation. In addition to the method described above, an organic light emitting device can also be made by sequentially depositing a negative electrode material, an organic material layer, and a positive electrode material on a substrate.

The organic material layer can also have a multi-layered structure including a hole injection layer, a hole transport layer, a layer which simultaneously injects and transports electrons, an electron blocking layer, a light emitting layer, an electron transport layer, an electron injection layer, a layer which simultaneously injects and transports electrons, and the like, but is not limited thereto, and can have a single-layered structure. Further, the organic material layer can be manufactured to include a fewer number of layers by a method such as a solvent process, for example, spin coating, dip coating, doctor blading, screen printing, inkjet printing, or a thermal transfer method, using various polymer materials, instead of a deposition method.

The positive electrode is an electrode which injects holes, and as a positive electrode material, materials having a high work function are usually preferred to facilitate the injection of holes into an organic material layer. Specific examples of the positive electrode material which can be used in the present invention include: a metal, such as vanadium, chromium, copper, zinc, and gold, or an alloy thereof; a metal oxide, such as zinc oxide, indium oxide, indium tin oxide (ITO), and indium zinc oxide (IZO); a combination of a metal and an oxide, such as $ZnO:Al$ or $SnO_2:Sb$; a conductive polymer, such as poly(3-methylthiophene), poly[3,4-(ethylene-1,2-dioxy)thiophene] (PEDOT), polypyrrole, and polyaniline; and the like, but are not limited thereto.

The negative electrode is an electrode which injects electrons, and as a negative electrode material, materials having a low work function are usually preferred to facilitate the injection of electrons into an organic material layer. Specific examples of the negative electrode material include: a metal such as magnesium, calcium, sodium, potassium, titanium, indium, yttrium, lithium, gadolinium, aluminum, silver, tin, and lead, or an alloy thereof; a multi-layer structured material, such as $LiF/Al$ or $LiO_2/Al$; and the like, but are not limited thereto.

The hole injection layer is a layer which facilitates the injection of holes from a positive electrode to a light emitting layer, and a hole injection material is preferably a material which can proficiently accept holes from a positive electrode at a low voltage, and the highest occupied molecular orbital (HOMO) of the hole injection material is preferably a value between the work function of the positive electrode material and the HOMO of the neighboring organic material layer. Specific examples of the hole injection material include metal porphyrin, oligothiophene, arylamine-based organic materials, hexanitrile hexaazatriphenylene-based organic materials, quinacridone-based organic materials, perylene-based organic materials, anthraquinone, polyaniline-based and polythiophene-based conductive polymers, and the like, but are not limited thereto. The hole injection layer can have a thickness of 1 nm to 150 nm. When the hole injection layer has a thickness of 1 nm or more, there is an advantage in that it is possible to prevent hole injection characteristics from deteriorating, and when the hole injection layer has a thickness of 150 nm or less, there is an advantage in that it is possible to prevent the driving voltage from being increased in order to improve the movement of holes due to the too thick hole injection layer.

The hole transport layer can facilitate the transport of holes. A hole transport material is suitably a material having high hole mobility which can accept holes from a positive electrode or a hole injection layer and transfer the holes to a light emitting layer. Specific examples thereof include arylamine-based organic materials, conductive polymers, block copolymers having both conjugated portions and non-conjugated portions, and the like, but are not limited thereto.

An electron blocking layer can be provided between the hole transport layer and the light emitting layer. For the electron blocking layer, materials known in the art can be used.

The electron transport layer can facilitate the transport of electrons. An electron transport material is suitably a material having high electron mobility which can proficiently accept electrons from a negative electrode and transfer the electrons to a light emitting layer. Specific examples thereof include: Al complexes of 8-hydroxyquinoline; complexes including $Alq_3$; organic radical compounds; hydroxyflavone-metal complexes; and the like, but are not limited thereto. The electron transport layer can have a thickness of 1 to 50 nm. When the electron transport layer has a thickness of 1 nm or more, there is an advantage in that it is possible to prevent electron transport characteristics from deteriorating, and when the electron transport layer has a thickness of 50 nm or less, there is an advantage in that it is possible to prevent the driving voltage from being increased in order to improve the movement of electrons due to the too thick electron transport layer.

The electron injection layer can facilitate the injection of electrons. An electron injection material is preferably a compound, which is capable of transporting electrons injected from a negative electrode to a light emitting layer or a light emitting material, preventing excitons produced from a light emitting layer from moving to a hole injection layer, and also has superior ability to form a thin film. Specific examples thereof include fluorenone, anthraquinodimethane, diphenoquinone, thiopyran dioxide, oxazole, oxadiazole, triazole, imidazole, perylenetetracarboxylic acid, fluorenylidene methane, anthrone, and the like, and derivatives thereof, a metal complex compound, a nitrogen-containing 5-membered ring derivative, and the like, but are not limited thereto.

Examples of the metal complex compounds include 8-hydroxyquinolinato lithium, bis(8-hydroxyquinolinato) zinc, bis(8-hydroxyquinolinato) copper, bis(8-hydroxyquinolinato) manganese, tris(8-hydroxyquinolinato) aluminum, tris(2-methyl-8-hydroxyquinolinato) aluminum, tris(8-hydroxyquinolinato) gallium, bis(10-hydroxybenzo[h]quinolinato) beryllium, bis(10-hydroxybenzo[h]quinolinato) zinc, bis(2-methyl-8-quinolinato) chlorogallium, bis(2-methyl-8-quinolinato)(o-cresolato) gallium, bis(2-methyl-8-quinolinato) (1-naphtholato) aluminum, bis(2-methyl-8-quinolinato) (2-naphtholato) gallium, and the like, but are not limited thereto.

The hole blocking layer is a layer which blocks holes from reaching a negative electrode, and can be generally formed under the same conditions as those of the hole injection layer. Specific examples thereof include oxadiazole derivatives or triazole derivatives, phenanthroline derivatives, BCP, aluminum complexes, and the like, but are not limited thereto.

The organic light emitting device according to the present invention can be a top emission type, a bottom emission type, or a dual emission type according to the material to be used.

Hereinafter, the present specification will be described in more detail through Examples. However, the following Examples are provided only for exemplifying the present specification, but are not intended to limit the present specification.

SYNTHESIS EXAMPLES

[Synthesis Example 1] Synthesis of Formula 4-1

A. Synthesis of Intermediate 3-1

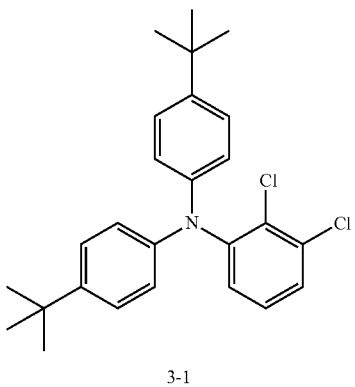

3-1

A flask containing 1-bromo-2,3-dichlorobenzene (22.6 g), bis(4-(tert-butyl)phenyl)amine (29.0 g), Pd(PtBu₃)₂ (0.5 g), NaOtBu (25.0 g), and xylene (260 ml) was heated at 130° C., and the resulting solution was stirred for 4 hours. The reaction solution was cooled to room temperature, the liquid was aliquoted by adding water and ethyl acetate thereto, and then the solvent was distilled off under reduced pressure. The resulting product was purified with a silica gel column chromatography (eluent: hexane/ethyl acetate=50%/50% (volume ratio)) to obtain Intermediate 3-1 (16.4 g). As a result of measuring the mass spectrum of the obtained solid, a peak was confirmed at M/Z=426.

Here, tBu means tert-butyl.

B. Synthesis of Intermediate 3-2

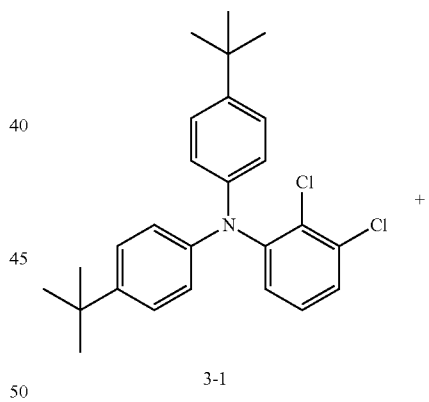

3-1

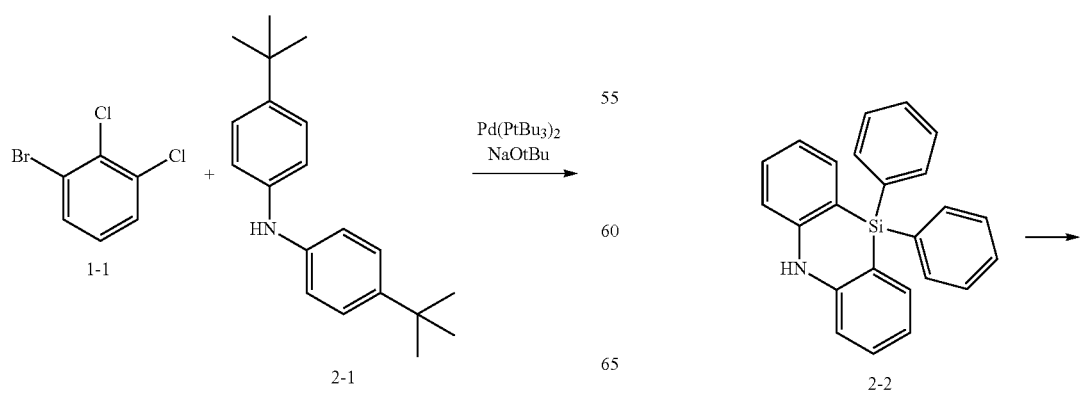

-continued

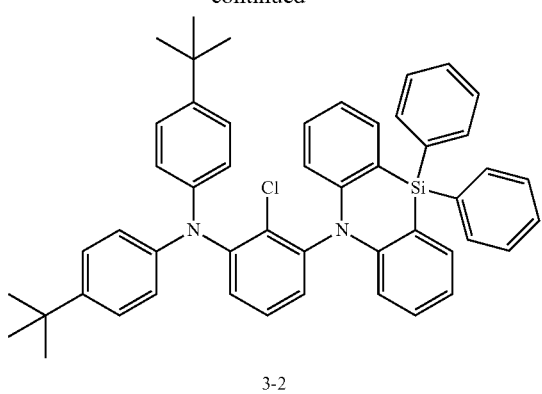

3-2

A flask containing Intermediate 3-1 (42.7 g), 10,10-diphenyl-5,10-dihydrodibenzo[b,e][1,4]azasilane (36.0 g), Pd(PtBu₃)₂ (0.5 g), NaOtBu (25.0 g), and xylene (260 ml) was heated at 130° C., and the resulting solution was stirred for 4 hours. The reaction solution was cooled to room temperature, the liquid was aliquoted by adding water and ethyl acetate thereto, and then the solvent was distilled off under reduced pressure. The resulting product was purified with a silica gel column chromatography (eluent: hexane/ethyl acetate=50%/50% (volume ratio)) to obtain Intermediate 3-2 (36.4 g). As a result of measuring the mass spectrum of the obtained solid, a peak was confirmed at M/Z=739.

C. Synthesis of Formula 4-1

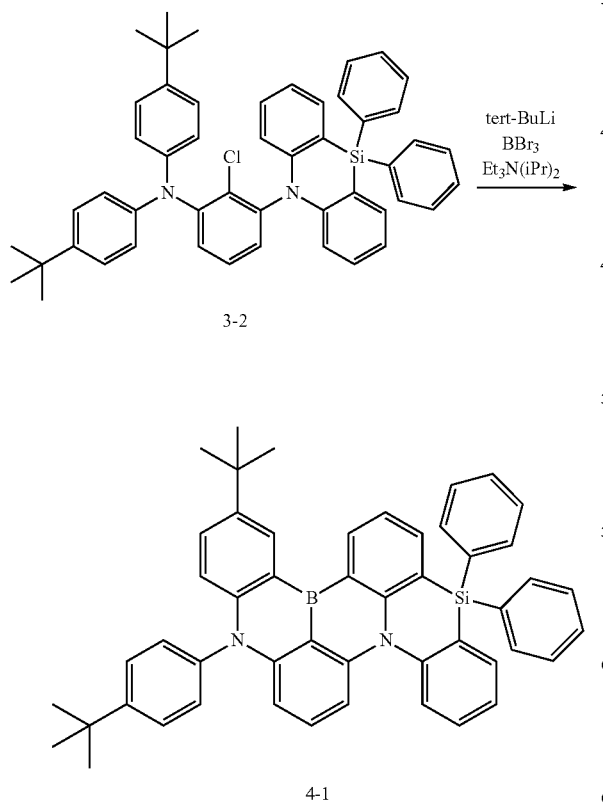

A 1.7 M tert-butyllithium pentane solution (9.2 ml) was added to a flask containing Intermediate 3-2 (11.0 g) and tert-butylbenzene (160 ml) at 0° C. under an argon atmosphere. After the completion of dropwise addition, pentane was distilled off by warming the resulting solution to 70° C. and stirring the solution for 4 hours. The resulting solution was cooled to −40° C., boron tribromide (BBr₃) (1.6 ml) was added thereto, and the resulting solution was stirred for 4 hours while being warmed to room temperature. Thereafter, the resulting solution was cooled again to 0° C., N,N-diisopropylethylamine (Et₃N(iPr)₂) (6.6 ml) was added thereto, and the resulting solution was stirred at room temperature, and then stirred at 80° C. for 4 hours. The reaction solution was cooled to room temperature, the liquid was aliquoted by adding water and ethyl acetate thereto, and then the solvent was distilled off under reduced pressure. Formula 4-1 (3.0 g) was obtained by adding acetonitrile thereto. As a result of measuring the mass spectrum of the obtained solid, a peak was confirmed at M/Z=713.

[Synthesis Example 2] Synthesis of Formula 4-1-a

A. Synthesis of Intermediate 3-1-a

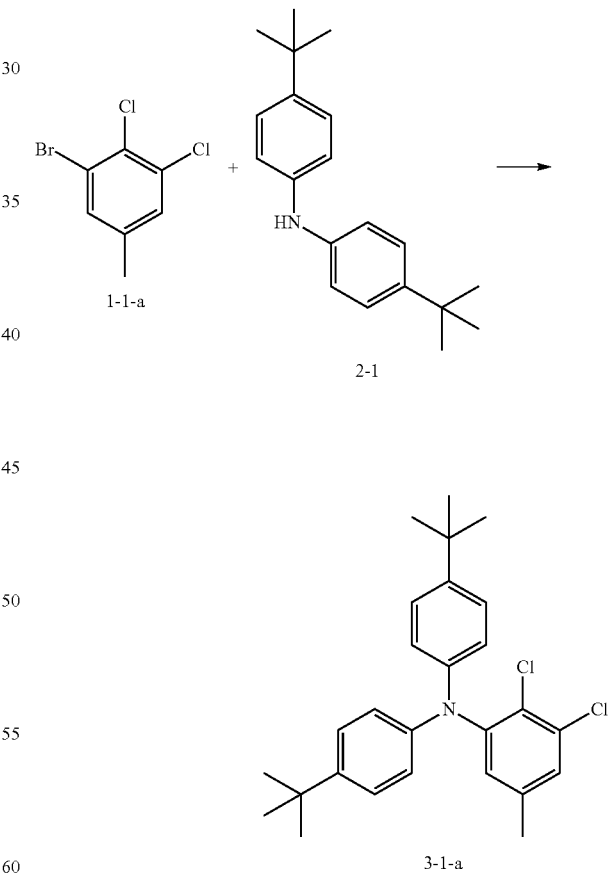

Intermediate 3-1-a (16.8 g) was obtained in the same manner as in the synthesis of Intermediate 3-1, except that Intermediate 1-1 (22.6 g) was changed into Intermediate 1-1-a (24.0 g). As a result of measuring the mass spectrum of the obtained solid, a peak was confirmed at M/Z=440.

B. Synthesis of Intermediate 3-2-a

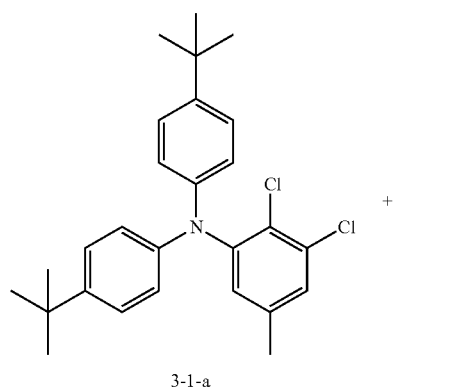

3-1-a

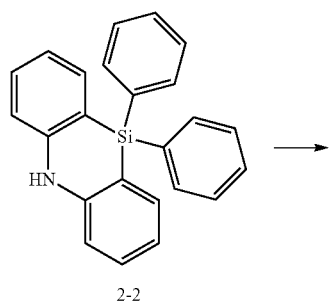

2-2

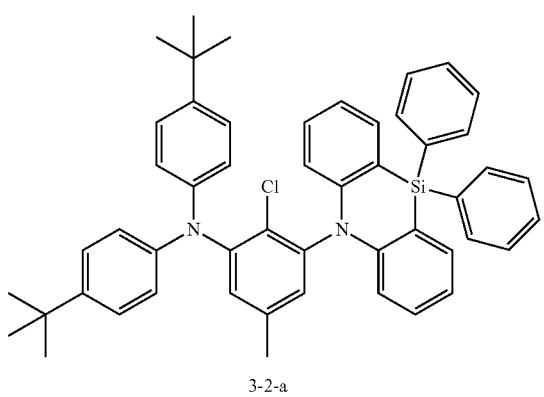

3-2-a

Intermediate 3-2-a (36.6 g) was obtained in the same manner as in the synthesis of Intermediate 3-2, except that Intermediate 3-1 (42.6 g) was changed into Intermediate 3-1-a (44.1 g). As a result of measuring the mass spectrum of the obtained solid, a peak was confirmed at M/Z=754.

C. Synthesis of Formula 4-1-a

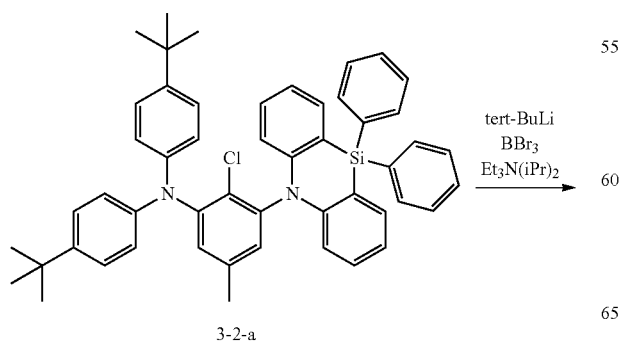

3-2-a

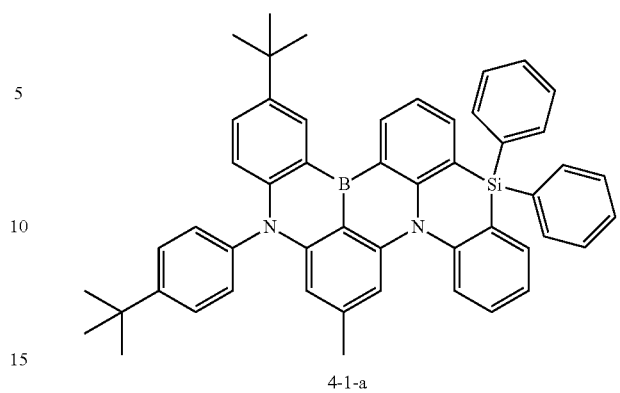

4-1-a

Formula 4-1-a (3.2 g) was obtained in the same manner as in the synthesis of Formula 4-1, except that Intermediate 3-2 (11.0 g) was changed into Intermediate 3-2-a (11.2 g). As a result of measuring the mass spectrum of the obtained solid, a peak was confirmed at M/Z=713.

[Synthesis Example 3] Synthesis of Formula 4-1-b

A. Synthesis of Intermediate 3-2-b

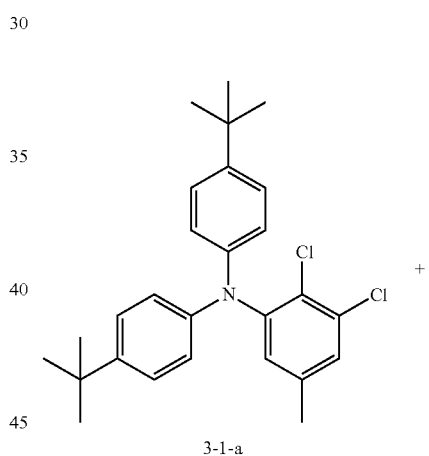

3-1-a

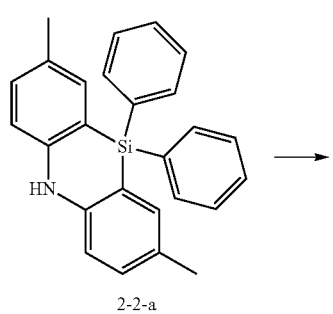

2-2-a

-continued

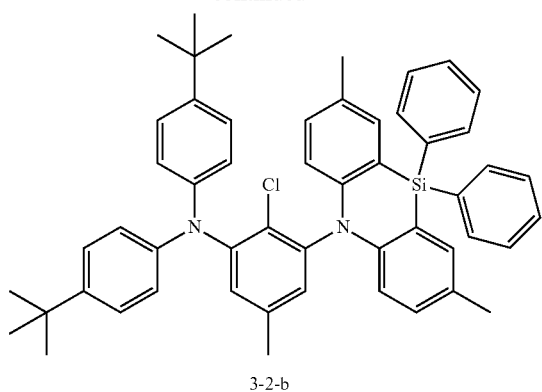

3-2-b

Intermediate 3-2-b (36.8 g) was obtained in the same manner as in the synthesis of Intermediate 3-2-a, except that Intermediate 2-2 (36.0 g) was changed into Intermediate 2-2-a (38.9 g). As a result of measuring the mass spectrum of the obtained solid, a peak was confirmed at M/Z=782.

B. Synthesis of Formula 4-1-b

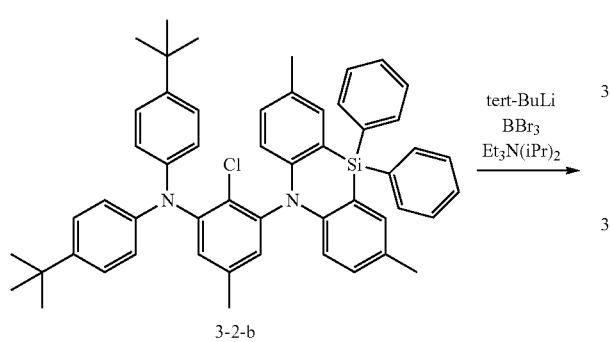

3-2-b tert-BuLi
BBr₃
Et₃N(iPr)₂
→

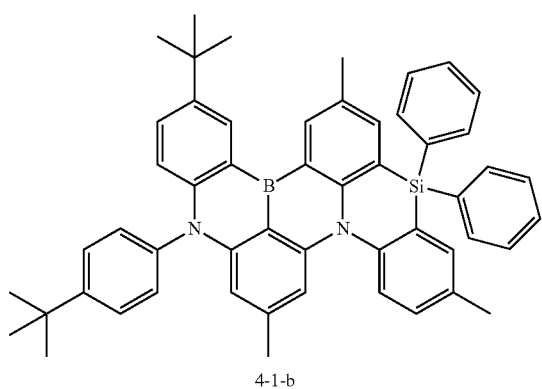

4-1-b

Formula 4-1-b (3.2 g) was obtained in the same manner as in the synthesis of Formula 4-1-a, except that Intermediate 3-2-a (11.2 g) was changed into Intermediate 3-2-b (11.6 g). As a result of measuring the mass spectrum of the obtained solid, a peak was confirmed at M/Z=755.

[Synthesis Example 4] Synthesis of Formula 4-1-c

A. Synthesis of Intermediate 3-2-c

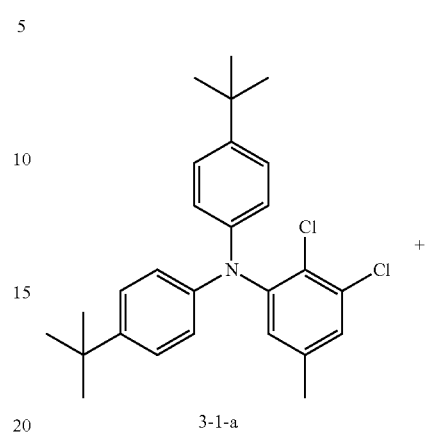

3-1-a

+

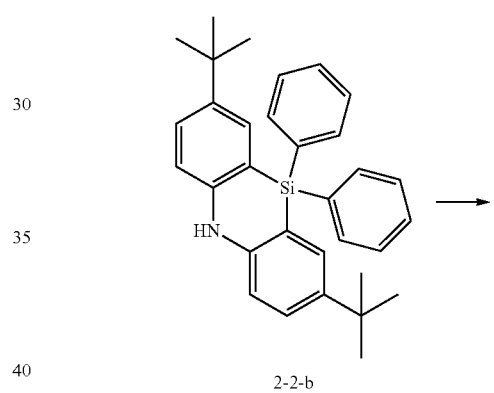

2-2-b

→

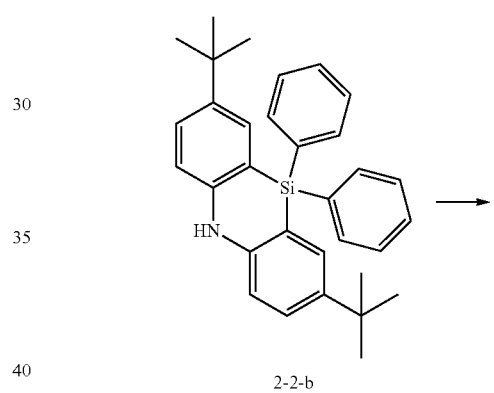

3-2-c

Intermediate 3-2-c (38.0 g) was obtained in the same manner as in the synthesis of Intermediate 3-2-a, except that Intermediate 2-2 (36.0 g) was changed into Intermediate 2-2-b (47.6 g). As a result of measuring the mass spectrum of the obtained solid, a peak was confirmed at M/Z=866.

B. Synthesis of Formula 4-1-c

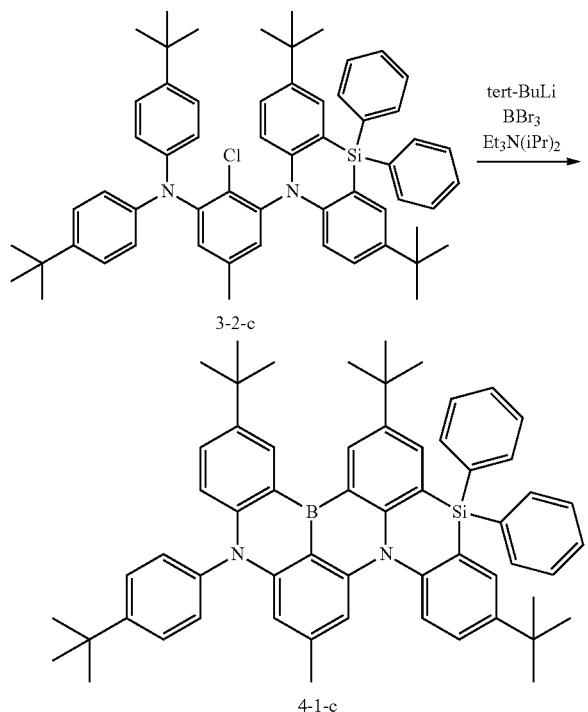

Formula 4-1-c (3.6 g) was obtained in the same manner as in the synthesis of Formula 4-1-a, except that Intermediate 3-2-a (11.2 g) was changed into Intermediate 3-2-c (12.9 g). As a result of measuring the mass spectrum of the obtained solid, a peak was confirmed at M/Z=839.

[Synthesis Example 5] Synthesis of Formula 4-1-d

A. Synthesis of Intermediate 3-1-b

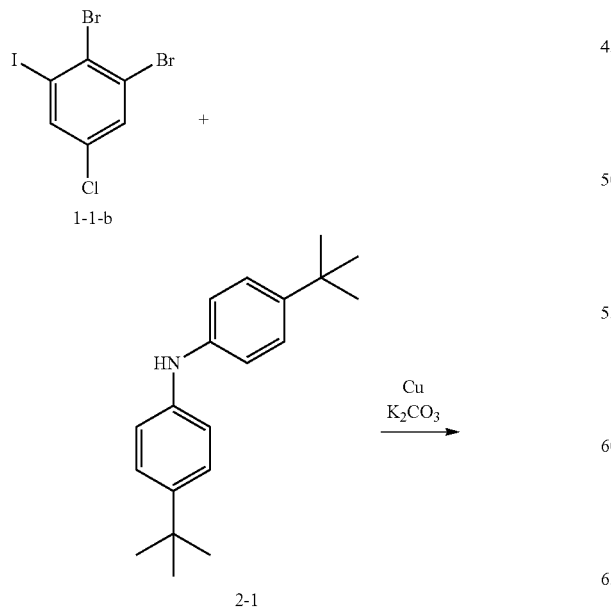

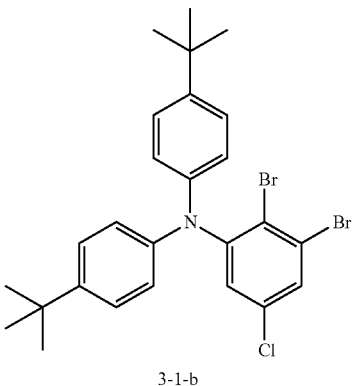

28.4 g of Intermediate 2-1, 40.0 g of Intermediate 1-1-b, 20.9 g of potassium carbonate, 2.0 g of copper powder, 1.1 g of sodium bisulfite, and 15 ml of diphenyl ether were allowed to react at 210° C. for 10 hours while being stirred under a nitrogen atmosphere. After the completion of the reaction, 400 ml of toluene was added thereto, and the resulting solution was stirred for 1 hour. The mixture was heat-filtered, and a product was obtained by concentrating the filtrate. The product was purified by a column chromatography, and 20.6 g of Intermediate 3-1-b was obtained.

B. Synthesis of Intermediate 3-2-d

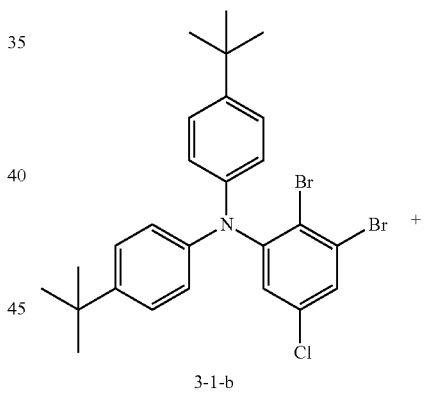

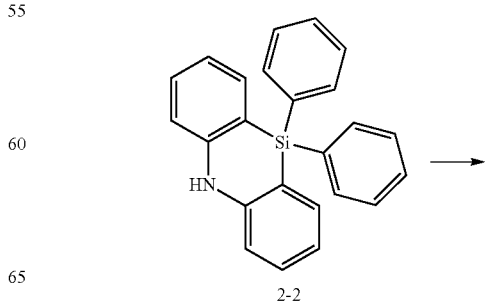

-continued

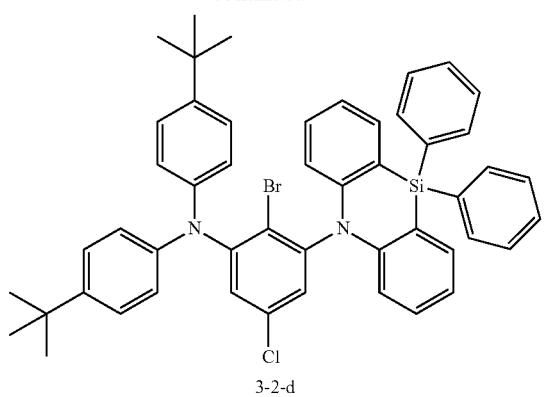

3-2-d 35.3 g of Intermediate 2-2, 55.5 g of Intermediate 3-1-b, 20.9 g of potassium carbonate, 2.0 g of copper powder, 1.1 g of sodium bisulfite, and 15 ml of diphenyl ether were allowed to react at 210° C. for 10 hours while being stirred under a nitrogen atmosphere. After the completion of the reaction, 400 ml of toluene was added thereto, and the resulting solution was stirred for 1 hour. The mixture was heat-filtered, and a product was obtained by concentrating the filtrate. The product was purified by a column chromatography, and 28.6 g of Intermediate 3-2-d was obtained.

C. Synthesis of Formula 4-1-d

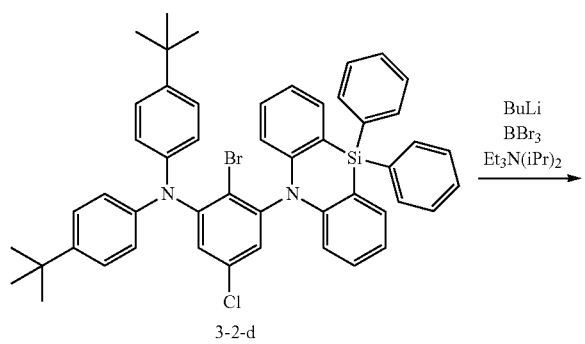

-continued

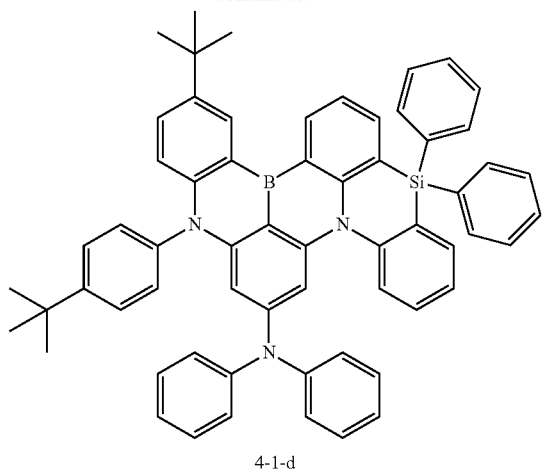

4-1-d

A 1.6 M butyllithium hexane solution (9.3 ml) was added to a flask containing Intermediate 3-2-d (12.2 g) and tert-butylpentane (160 ml) at 0° C. under an argon atmosphere. After the completion of dropwise addition, pentane was distilled off by warming the resulting solution to 70° C. and stirring the solution for 4 hours. The resulting solution was cooled to −40° C., boron tribromide (1.6 ml) was added thereto, and the resulting solution was stirred for 4 hours while being warmed to room temperature. Thereafter, the resulting solution was cooled again to 0° C., N,N-diisopropylethylamine (6.6 ml) was added thereto, and the resulting solution was stirred at room temperature, and then stirred at 80° C. for 4 hours. The reaction solution was cooled to room temperature, the liquid was aliquoted by adding water and ethyl acetate thereto, and then the solvent was distilled off under reduced pressure. 3.6 g of an intermediate was obtained by adding acetonitrile thereto.

Next, a flask containing 3.1 g of the intermediate obtained above, diphenylamine (0.9 g, 1.5 mmol), Pd(PtBu$_3$)$_2$ (0.15 g), NaOtBu (1.9 g), and xylene (211 ml) was heated at 130° C. and stirred at 4 hours. The reaction solution was cooled to room temperature, the liquid was aliquoted by adding water and ethyl acetate thereto, and then the solvent was distilled off under reduced pressure. The resulting product was purified with a silica gel column chromatography (eluent: hexane/ethyl acetate=50%/50% (volume ratio)) to obtain 2.6 g of Formula 4-1-d. As a result of measuring the mass spectrum of the obtained solid, a peak was confirmed at M/Z=880.

[Synthesis Example 6] Synthesis of Formula 4-1-e

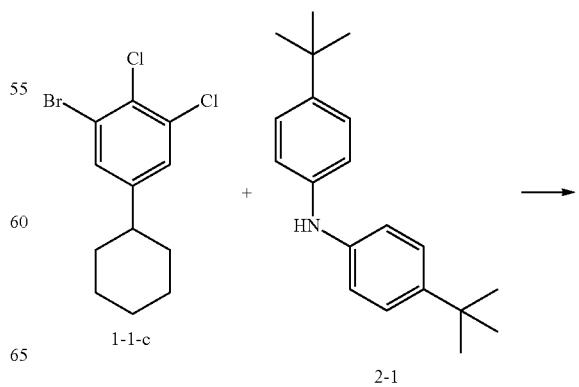

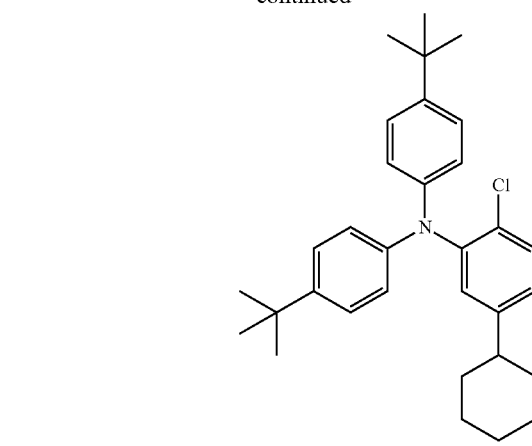

3-1-c

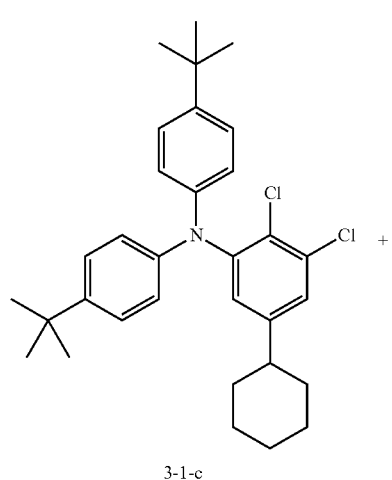

3-1-c +

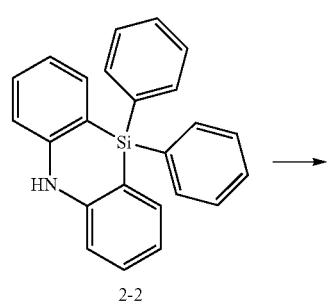

2-2

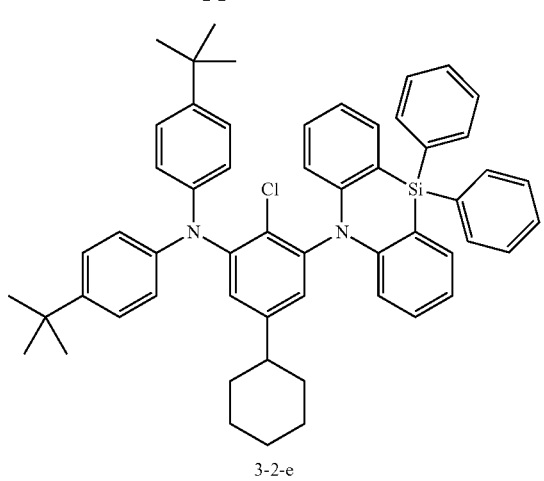

3-2-e

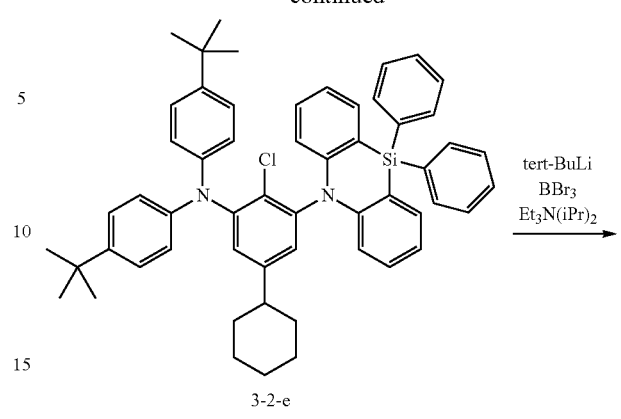

3-2-e

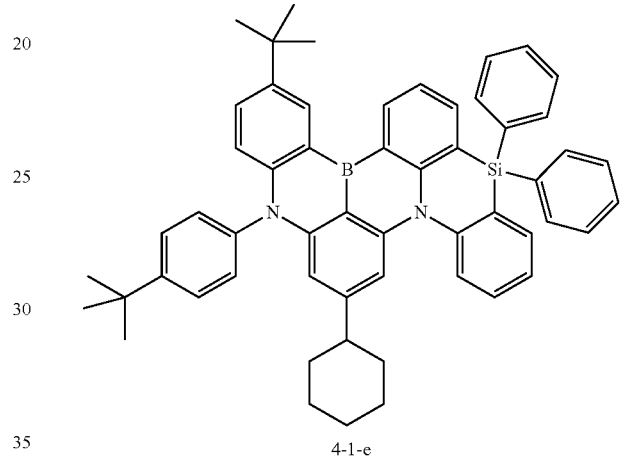

4-1-e

Intermediate 3-1-c (16.8 g) was obtained in the same manner as in the synthesis of Intermediate 3-1, except that Intermediate 1-1-c (30.8 g) was used instead of Intermediate 1-1.

Next, Intermediate 3-2-e (24.2 g) was obtained in the same manner as in the synthesis of Intermediate 3-2, except that Intermediate 3-1-c (50.9 g) was used instead of Intermediate 3-1.

Next, Formula 4-1-e (2.6 g) was obtained in the same manner as in the synthesis of Formula 4-1, except that Intermediate 3-2-e (12.2 g) was used instead of Intermediate 3-2. As a result of measuring the mass spectrum of the obtained solid, a peak was confirmed at M/Z=795.

[Synthesis Example 7] Synthesis of Formula 4-1-f

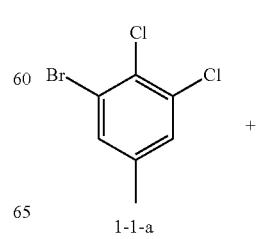

1-1-a

133
-continued

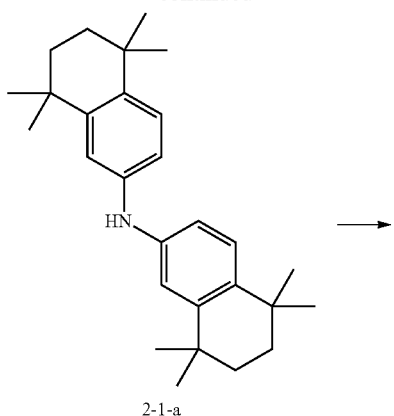

2-1-a

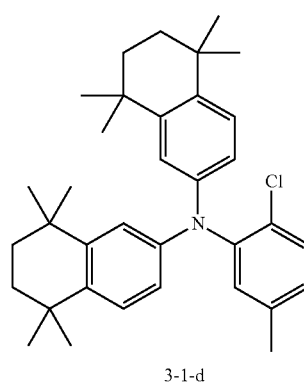

3-1-d

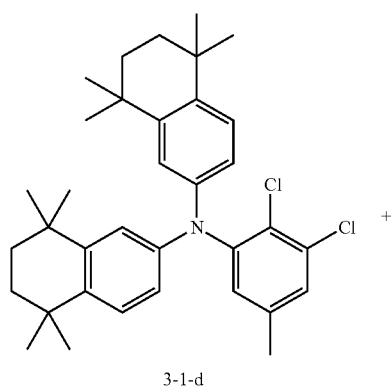

3-1-d     +

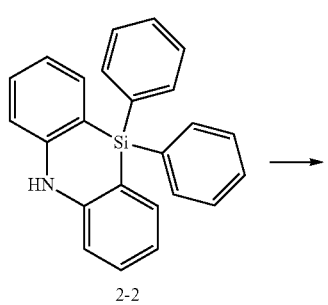

2-2

134
-continued

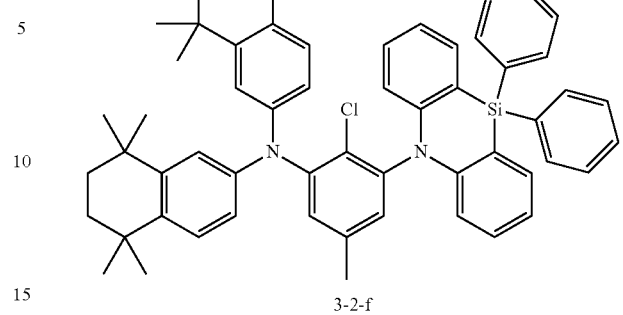

3-2-f

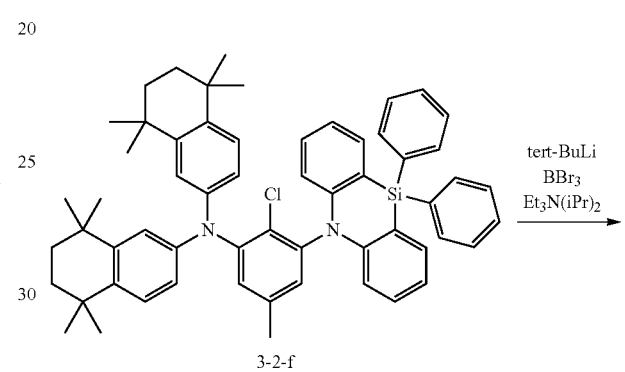

3-2-f

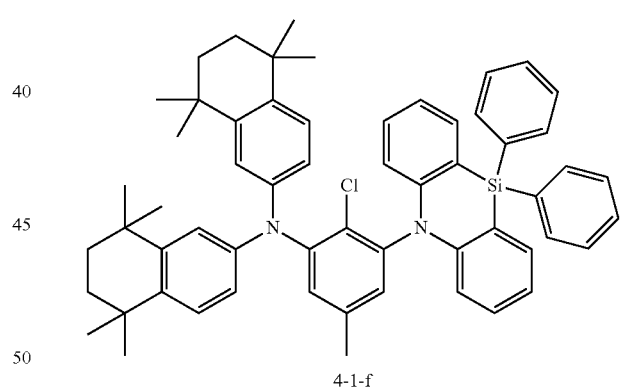

4-1-f

Intermediate 3-1-d (19.8 g) was obtained in the same manner as in the synthesis of Intermediate 3-1-a, except that Intermediate 2-1-a (39.0 g) was used instead of Intermediate 2-1.

Next, Intermediate 3-2-f (26.2 g) was obtained in the same manner as in the synthesis of Intermediate 3-2-a, except that Intermediate 3-1-d (54.9 g) was used instead of Intermediate 3-1-a.

Next, Formula 4-1-f (3.0 g) was obtained in the same manner as in the synthesis of Formula 4-1-a, except that Intermediate 3-2-f (12.6 g) was used instead of Intermediate 3-2-a. As a result of measuring the mass spectrum of the obtained solid, a peak was confirmed at M/Z=835.

[Synthesis Example 8] Synthesis of Formula 4-1-g
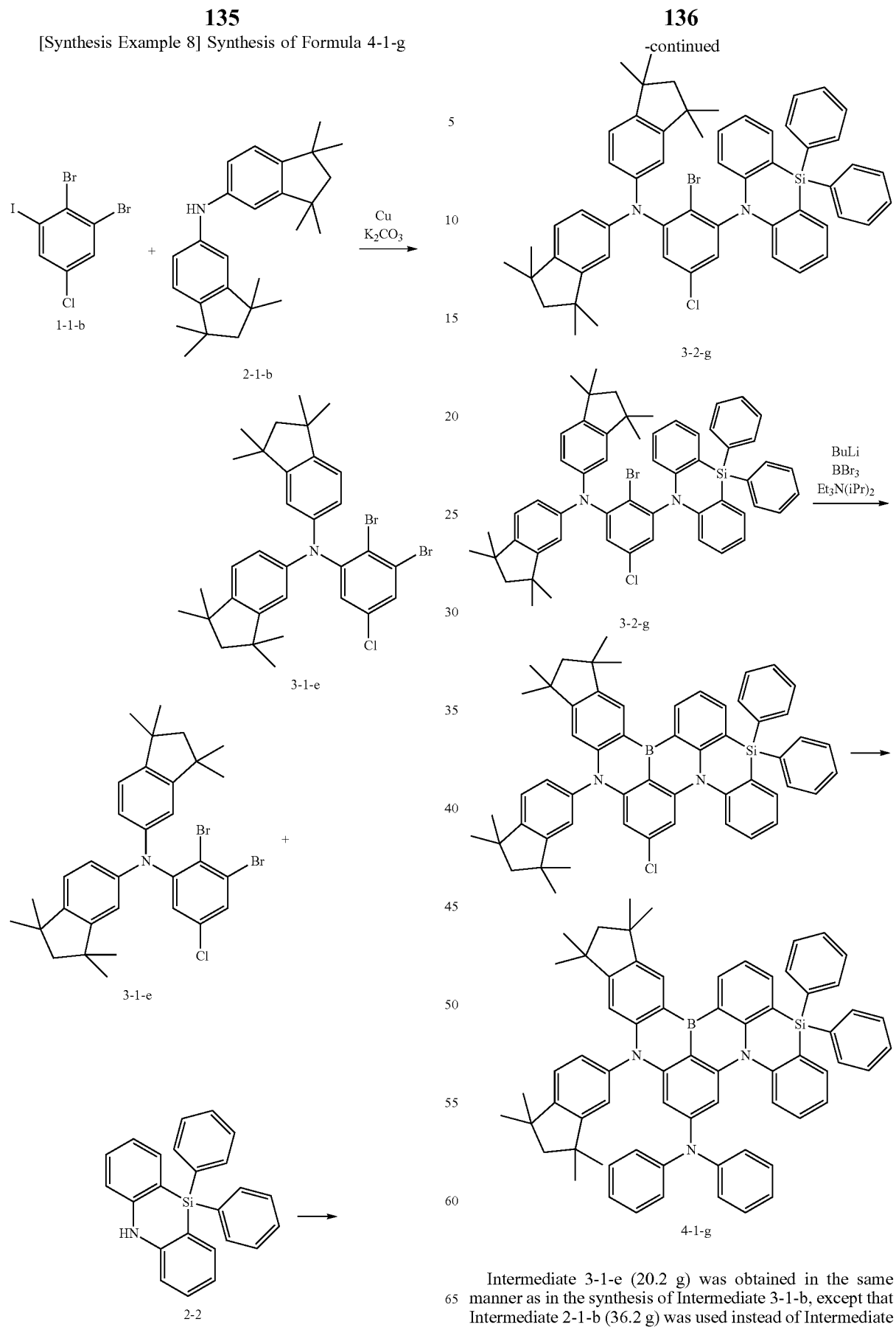
Intermediate 3-1-e (20.2 g) was obtained in the same manner as in the synthesis of Intermediate 3-1-b, except that Intermediate 2-1-b (36.2 g) was used instead of Intermediate 2-1.

Next, Intermediate 3-2-g (28.4 g) was obtained in the same manner as in the synthesis of Intermediate 3-2-d, except that Intermediate 3-1-e (63.0 g) was used instead of Intermediate 3-1-b.

Next, Formula 4-1-g (3.4 g) was obtained in the same manner as in the synthesis of Formula 4-1-d, except that Intermediate 3-2-g (13.4 g) was used instead of Intermediate 3-2-d. As a result of measuring the mass spectrum of the obtained solid, a peak was confirmed at M/Z=960.

[Synthesis Example 9] Synthesis of Formula 4-1-h

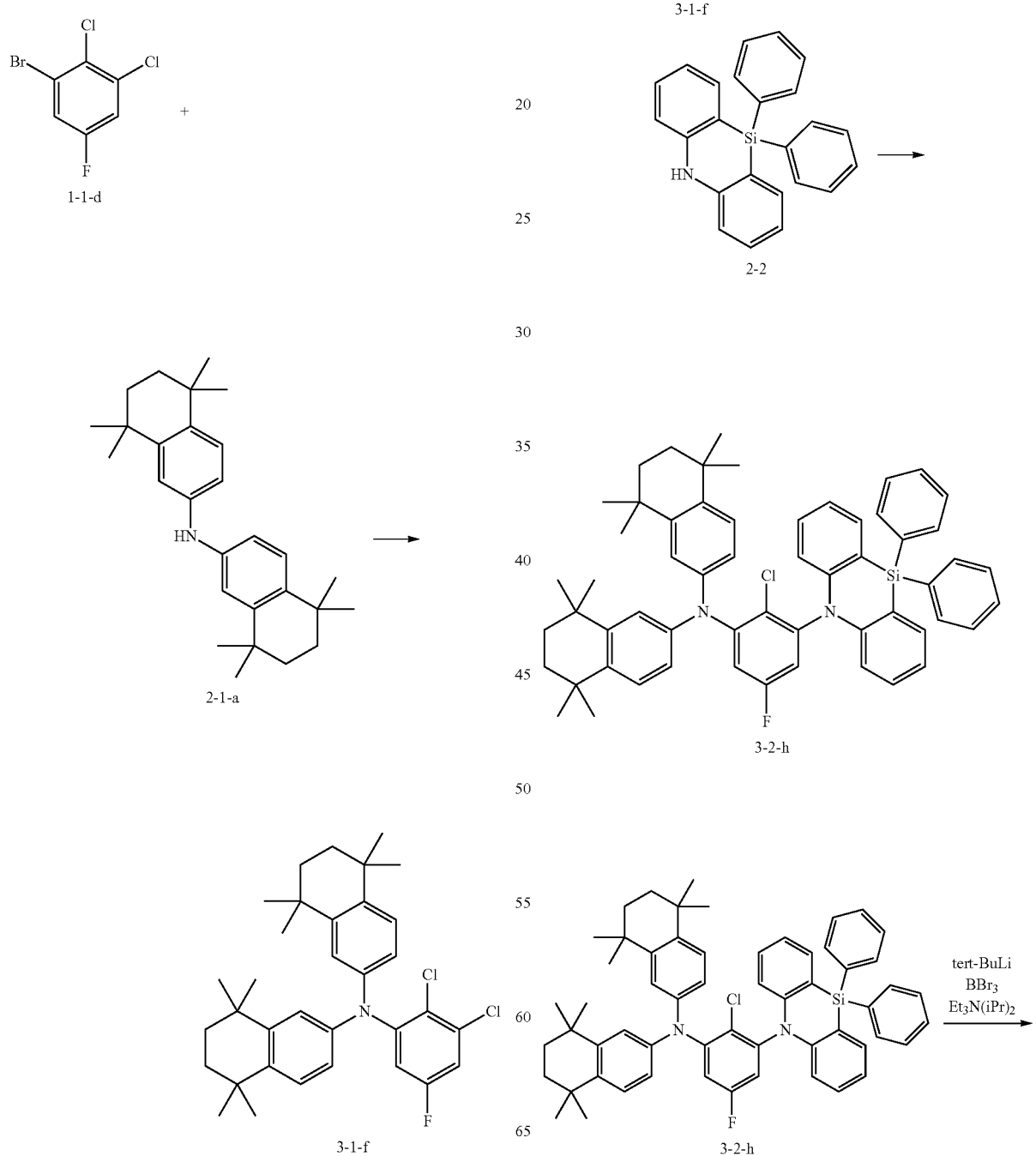

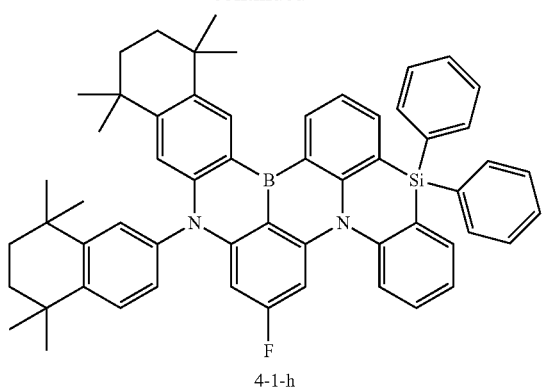

4-1-h

Intermediate 3-1-f (20.2 g) was obtained in the same manner as in the synthesis of Intermediate 3-1-a, except that Intermediate 1-1-d (24.4 g) was used instead of Intermediate 1-1-a, and Intermediate 2-1-a (39.0 g) was used instead of Intermediate 2-1.

Next, Intermediate 3-2-h (26.8 g) was obtained in the same manner as in the synthesis of Intermediate 3-2-a, except that Intermediate 3-1-f (55.3 g) was used instead of Intermediate 3-1-a.

Next, Formula 4-1-h (3.2 g) was obtained in the same manner as in the synthesis of Formula 4-1-a, except that Intermediate 3-2-h (12.9 g) was used instead of Intermediate 3-2-a. As a result of measuring the mass spectrum of the obtained solid, a peak was confirmed at M/Z=839.

[Synthesis Example 10] Synthesis of Formula 4-1-i

A. Synthesis of Intermediate 3-1-g

Bromo-2,3-dichloro-5-methylbenzene 1-1-a (9.6 g, 40 mmol) was dissolved in 100 mL of diethyl ether, and the resulting solution was cooled to −78° C. under a nitrogen condition. Next, a 1.6 M n-BuLi hexane solution (26 mL, 40 mmol) was slowly added dropwise hereto, and the resulting solution was stirred at −78° C. for 2 hours. Triphenylchlorosilane 2-1-c (11.8 g, 40 mmol) was put thereinto, and the resulting solution was stirred while being slowly warmed to room temperature for 10 hours. The reaction was terminated by putting distilled water thereinto, 100 mL of diethyl ether was further put thereinto for extraction, and the extract was dried over anhydrous sodium sulfate. The resulting product was purified with a silica gel column chromatography (eluent: hexane/ethyl acetate=50%/50% (volume ratio)) to obtain Intermediate 3-1-g (10.0 g).

B. Synthesis of Intermediate 3-2-i

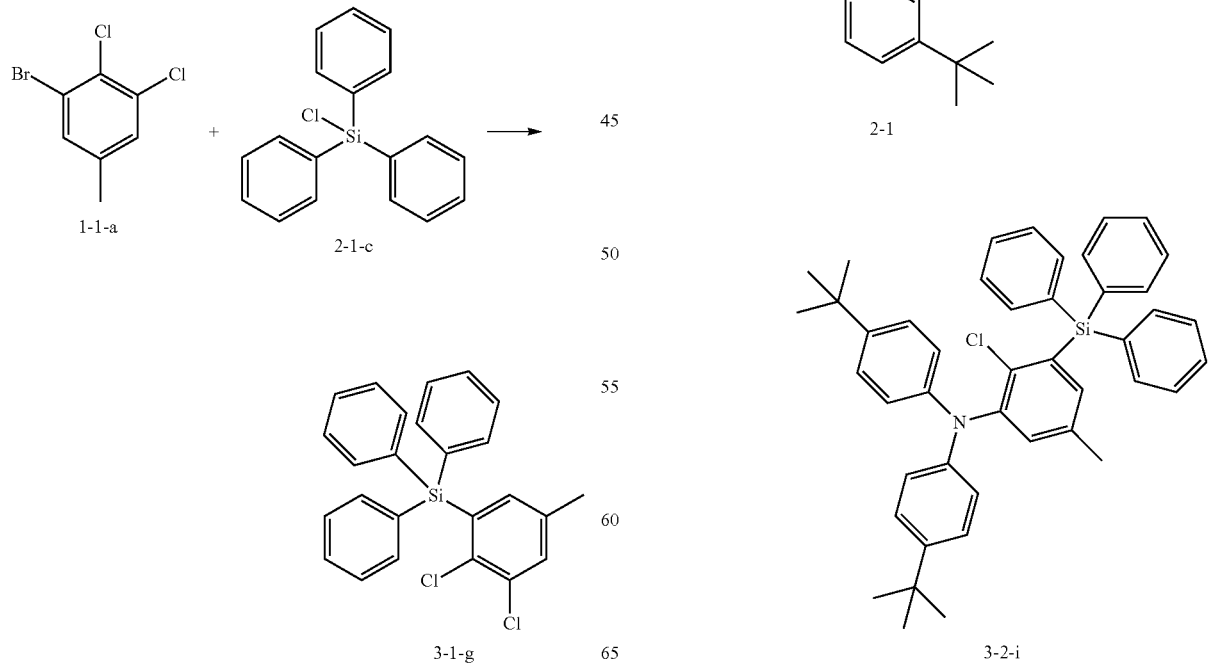

Intermediate 3-2-i (28.8 g) was obtained in the same manner as in the synthesis of Intermediate 3-1-a, except that Intermediate 3-1-g (41.9 g) was used instead of Intermediate 1-1-a.

C. Synthesis of Formula 4-1-i

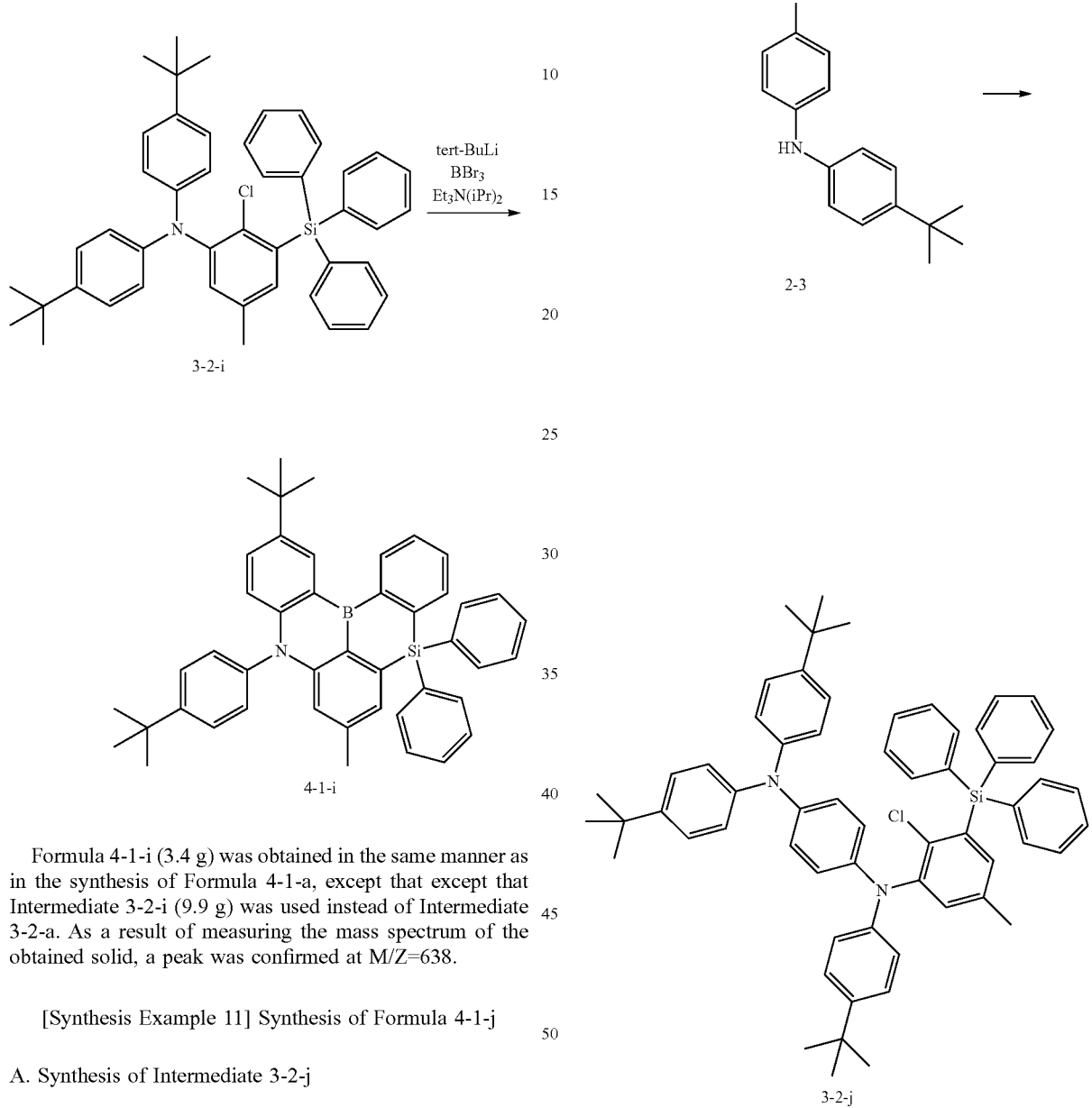

Formula 4-1-i (3.4 g) was obtained in the same manner as in the synthesis of Formula 4-1-a, except that except that Intermediate 3-2-i (9.9 g) was used instead of Intermediate 3-2-a. As a result of measuring the mass spectrum of the obtained solid, a peak was confirmed at M/Z=638.

[Synthesis Example 11] Synthesis of Formula 4-1-j

A. Synthesis of Intermediate 3-2-j

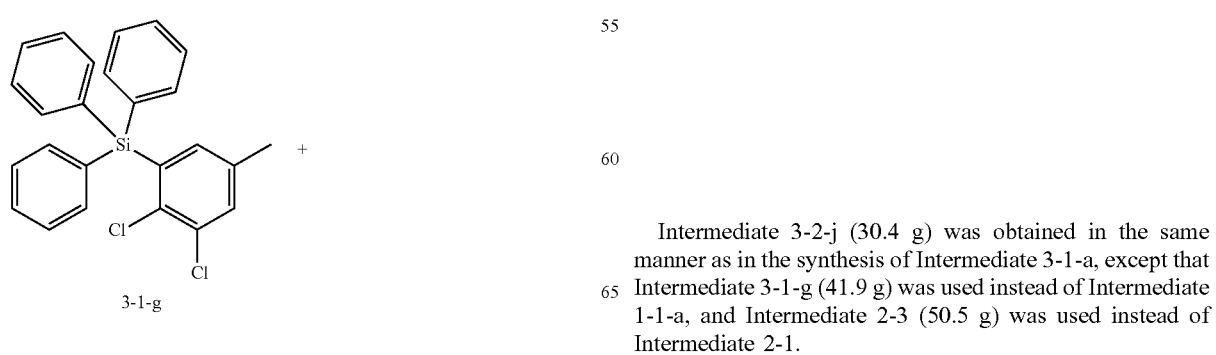

Intermediate 3-2-j (30.4 g) was obtained in the same manner as in the synthesis of Intermediate 3-1-a, except that Intermediate 3-1-g (41.9 g) was used instead of Intermediate 1-1-a, and Intermediate 2-3 (50.5 g) was used instead of Intermediate 2-1.

B. Synthesis of Formula 4-1-j

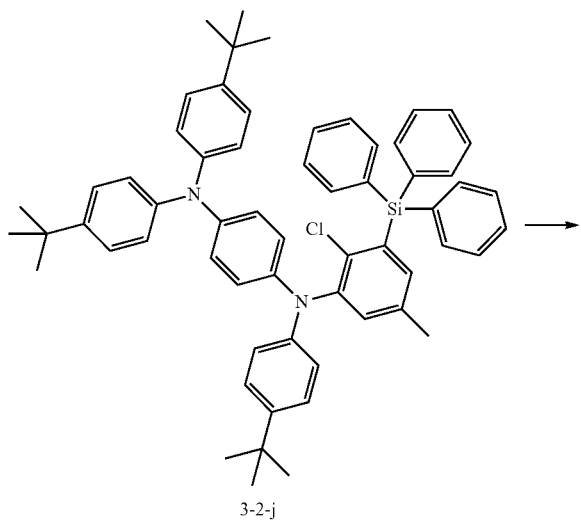

3-2-j

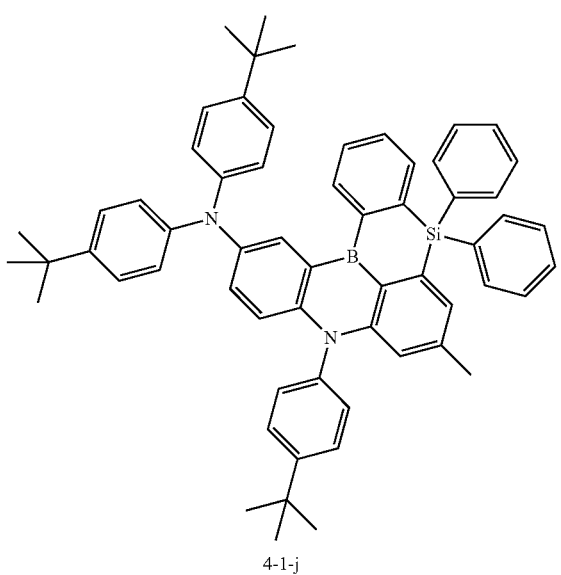

4-1-j

Formula 4-1-j (3.6 g) was obtained in the same manner as in the synthesis of Formula 4-1-a, except that Intermediate 3-2-j (12.4 g) was used instead of Intermediate 3-2-a. As a result of measuring the mass spectrum of the obtained solid, a peak was confirmed at M/Z=861.

EXPERIMENTAL EXAMPLE 1

Example 1

A glass substrate thinly coated with indium tin oxide (ITO) to have a thickness of 1,300 Å was put into distilled water in which a detergent was dissolved, and ultrasonically washed. In this case, a product manufactured by Fischer Co., was used as the detergent, and distilled water, which had been filtered twice with a filter manufactured by Millipore Co., was used as the distilled water. After the ITO was washed for 30 minutes, ultrasonic washing was repeated twice by using distilled water for 10 minutes. After the washing using distilled water was completed, ultrasonic washing was conducted by using isopropyl alcohol, acetone, and methanol solvents, and the resulting product was dried and then transported to a plasma washing machine. Furthermore, the substrate was cleaned by using oxygen plasma for 5 minutes, and then was transported to a vacuum deposition machine.

The following compound HAT was thermally vacuum-deposited to have a thickness of 50 Å on the ITO transparent electrode thus prepared, thereby forming a hole injection layer. The following compound HT-A was vacuum-deposited as a first hole transport layer to have a thickness of 1,000 Å thereon, and subsequently, the following compound HT-B was deposited to have a thickness of 100 Å as a second hole transport layer. A host BH-A and a dopant Compound 4-1-d were vacuum-deposited at a weight ratio of 95:5, thereby forming a light emitting layer having a thickness of 200 Å.

Next, the following compound ET-A and the following compound Liq were deposited as a layer which simultaneously injects and transports electrons to have a thickness of 300 Å at a ratio of 1:1, and lithium fluoride (LiF) and aluminum were deposited thereon to have a thickness of 10 Å and 1,000 Å, respectively, to form a negative electrode, thereby an organic light emitting device.

In the aforementioned procedure, the deposition rate of the organic materials were maintained at 0.4 to 2.0 Å/sec, the deposition rates of lithium fluoride and aluminum of the negative electrode were maintained at 0.3 Å/sec, and at 2 Å/sec, respectively, and the degree of vacuum during the deposition was maintained at $5 \times 10^{-8}$ to $1 \times 10^{-7}$ torr, thereby manufacturing an organic light emitting device.

HAT

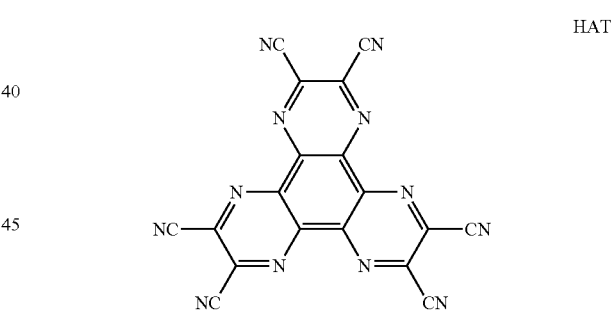

HT-A

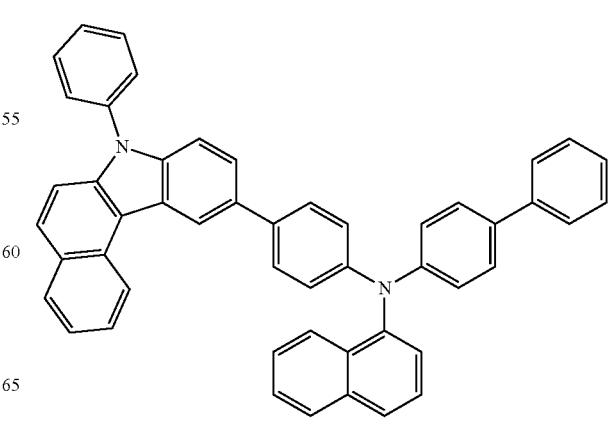

HT-B
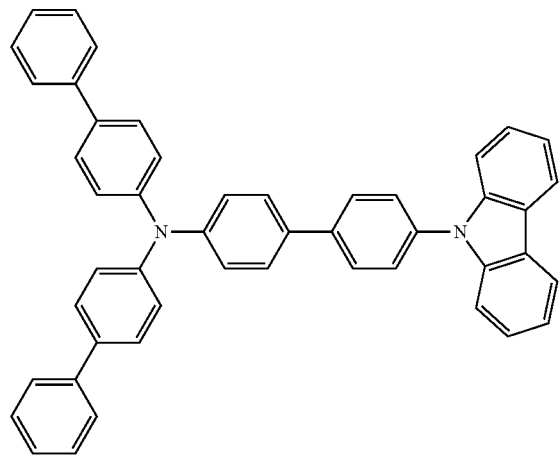
4-1-d
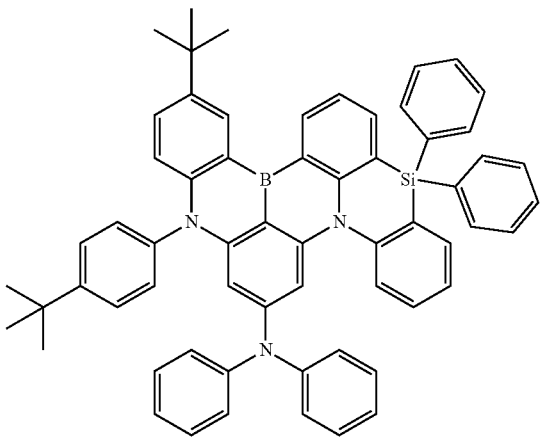
BH-A
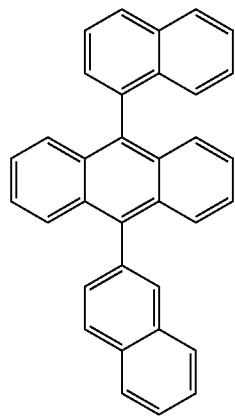
Liq
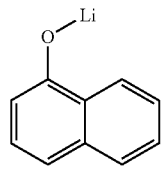
Examples 2 to 6
Organic light emitting devices were manufactured in the same manner as in Example 1, except that the dopant compounds described in the following Table 1 were used as materials for a light emitting layer in Example 1.
ET-A
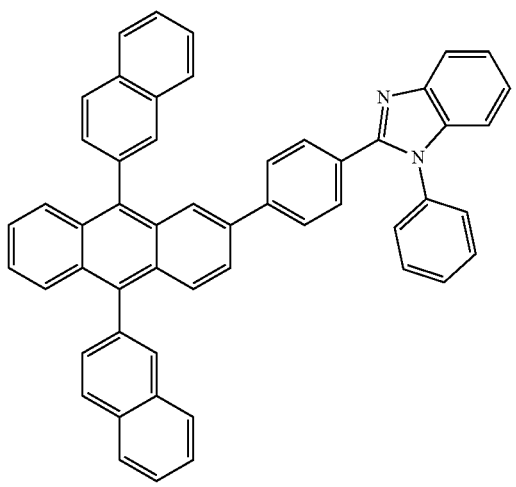
4-1-e
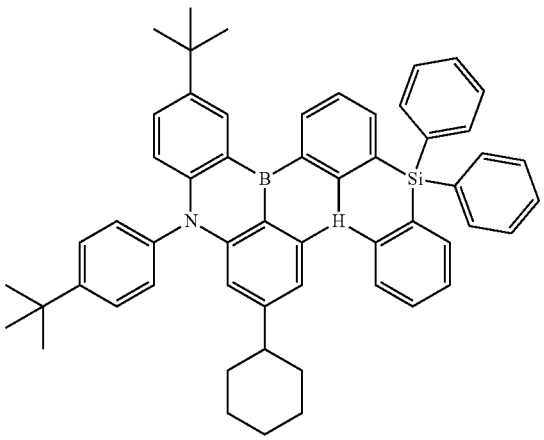

4-1-g
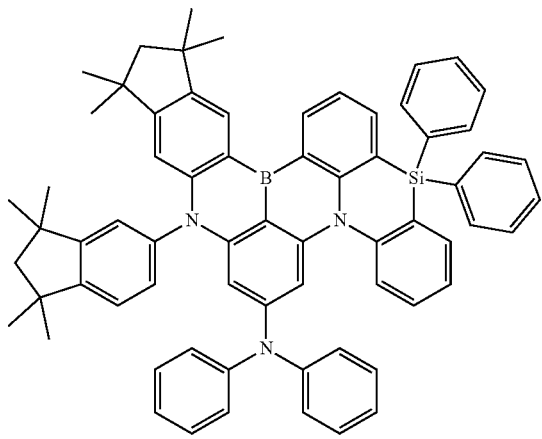
4-1-h
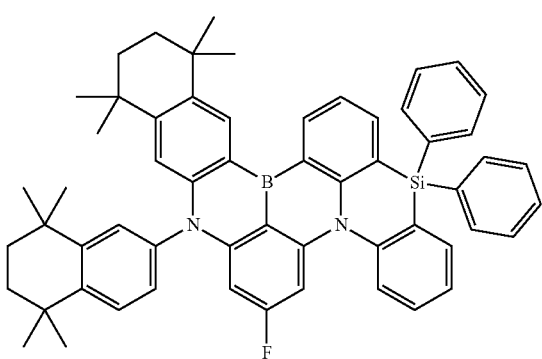
4-1-i
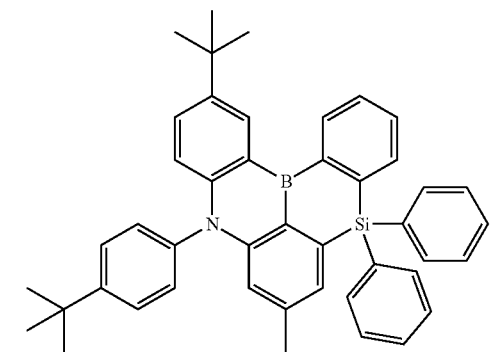
4-1-j
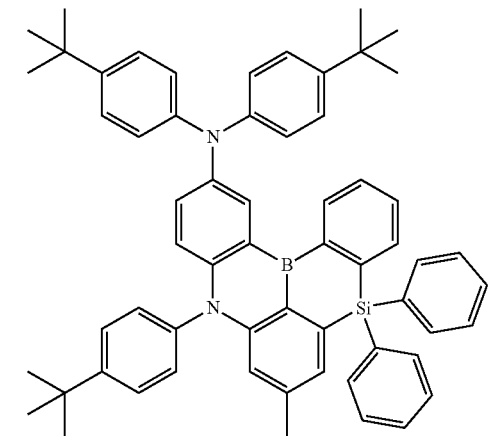
Comparative Examples 1 to 4
Organic light emitting devices were manufactured in the same manner as in Example 1, except that the dopant compounds described in the following Table 1 were used as materials for a light emitting layer in Example 1.
BD-1
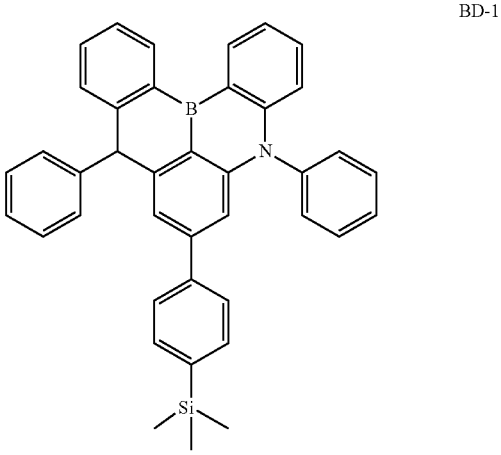
BD-2
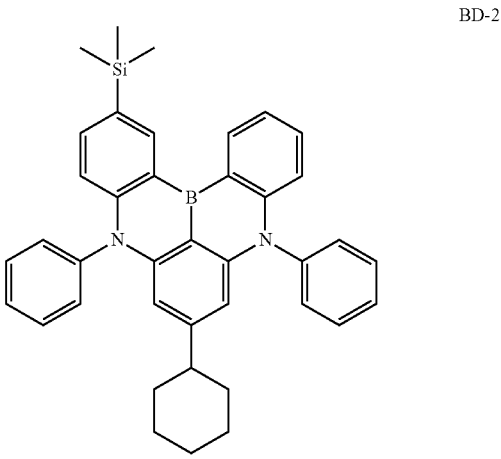
BD-3
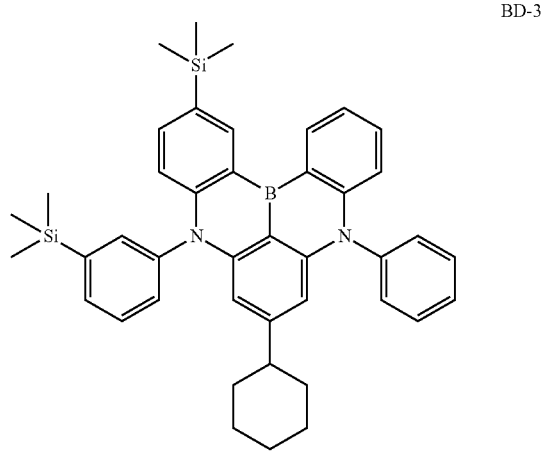

-continued

BD-4

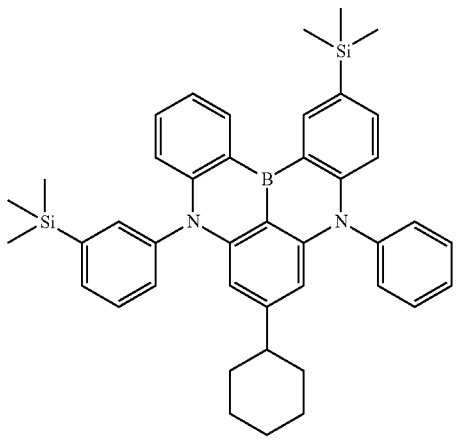

For each of the organic light emitting devices manufactured by Examples 1 to 6 and Comparative Examples 1 to 4, the driving voltage, the efficiency, and the maximum peak position of the EL spectrum were measured at a current density of 10 mA/cm², and the results are shown in the following Table 1.

TABLE 1

| | | 10 mA/cm² | | |
|---|---|---|---|---|
| | Dopant (Light emitting layer) | EL max peak (nm) | Driving voltage (V) | Light emitting efficiency (Cd/A) |
| Example 1 | 4-1-d | 461 | 4.4 | 6.7 |
| Example 2 | 4-1-e | 464 | 4.1 | 6.3 |
| Example 3 | 4-1-g | 462 | 4.3 | 6.4 |
| Example 4 | 4-1-h | 466 | 4.3 | 6.1 |
| Example 5 | 4-1-i | 460 | 4.2 | 6.5 |
| Example 6 | 4-1-j | 459 | 4.4 | 6.6 |
| Comparative Example 1 | BD-1 | 465 | 4.5 | 6.2 |
| Comparative Example 2 | BD-2 | 464 | 4.4 | 6.0 |
| Comparative Example 3 | BD-3 | 463 | 4.6 | 6.1 |
| Comparative Example 4 | BD-4 | 463 | 4.6 | 6.0 |

As observed in Table 1, the devices in Examples 1 to 6, in which the compound having the structure of Formula 1 is used, have characteristics of lower voltage, higher efficiency, and darker blue than those of the devices in Comparative Examples 1 to 4.

The invention claimed is:
1. A compound of Formula 2:

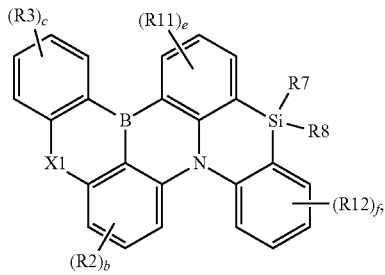

wherein in Formula 2:
X1 is NR, O, SiR'R", S, or CR5R6,
R2 and R3 are each independently hydrogen, deuterium, a halogen group, a substituted or unsubstituted alkyl group, a substituted or unsubstituted cycloalkyl group, a substituted or unsubstituted amine group, a substituted or unsubstituted aryl group, or a substituted or unsubstituted heterocyclic group, or are each independently bonded to an adjacent group to form a substituted or unsubstituted ring;
R, R', and R" are each independently a substituted or unsubstituted alkyl group, a substituted or unsubstituted aryl group, or a substituted or unsubstituted heterocyclic group, or are each independently bonded to an adjacent group to form a substituted or unsubstituted ring;
R5 and R6 are each independently a substituted or unsubstituted aryl group, or are each independently bonded to an adjacent group to form a substituted or unsubstituted ring;
R7 and R8 are each independently a substituted or unsubstituted alkyl group; a substituted or unsubstituted aryl group; or a substituted or unsubstituted heterocyclic group, or optionally bonded to an adjacent group to form a substituted or unsubstituted ring;
R11 and R12 are each independently hydrogen; deuterium; a halogen group; a substituted or unsubstituted alkyl group; a substituted or unsubstituted cycloalkyl group; a substituted or unsubstituted amine group; a substituted or unsubstituted aryl group; or a substituted or unsubstituted heterocyclic group, or optionally bonded to an adjacent group to form a substituted or unsubstituted ring;
b and e are each independently an integer from 0 to 3;
c and f each independently is an integer from 0 to 4;
wherein when b, c, e, or f are each independently an integer of 2 or higher, substituents in parentheses are the same as or different from each other.

2. The compound of claim 1, wherein when any of R2, R3, R5-R8, R11, R12, R, R', and R" are each independently bonded to an adjacent group to form a substituted or unsubstituted ring, the substituted or unsubstituted ring is any one selected from among:

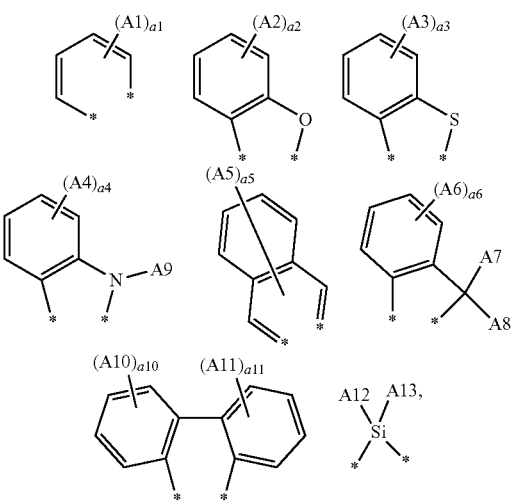

wherein:

A1 to A8 and A10 to A13 are each independently hydrogen, deuterium; a halogen group, a substituted or unsubstituted alkyl group, a substituted or unsubstituted cycloalkyl group, a substituted or unsubstituted amine group, a substituted or unsubstituted aryl group, or a substituted or unsubstituted heterocyclic group;

A9 is hydrogen, deuterium, a halogen group, a substituted or unsubstituted alkyl group, a substituted or unsubstituted cycloalkyl group, a substituted or unsubstituted aryl group, or a substituted or unsubstituted heterocyclic group;

a1 to a4, a6, a10, and a11 are each an integer from 0 to 4, a5 is an integer from 0 to 6, and \* denotes a position of a substituent.

3. The compound of claim 1, wherein the compound is any one compound selected from among:

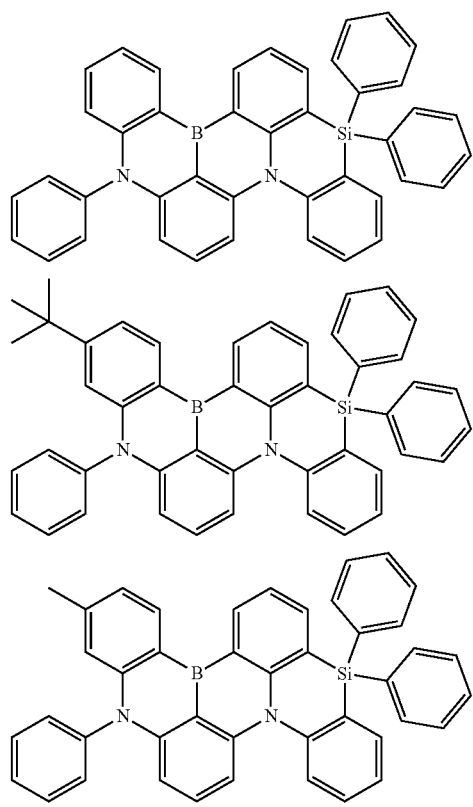

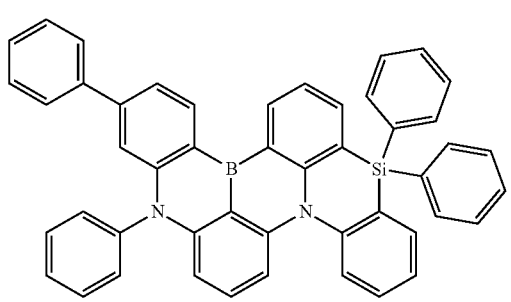

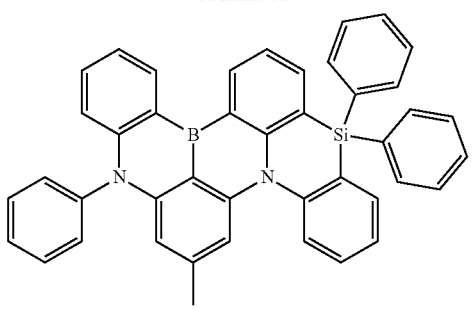

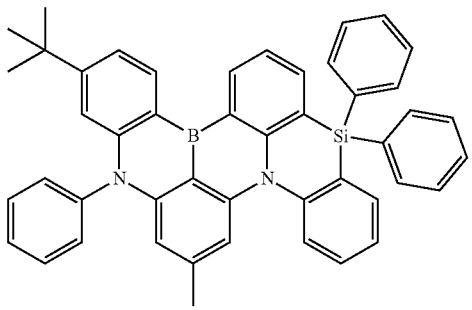

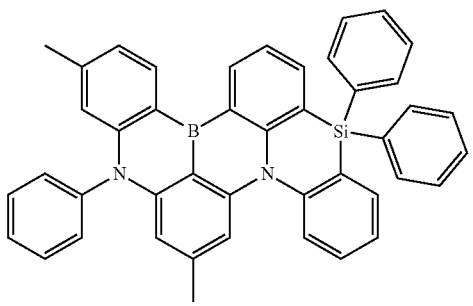

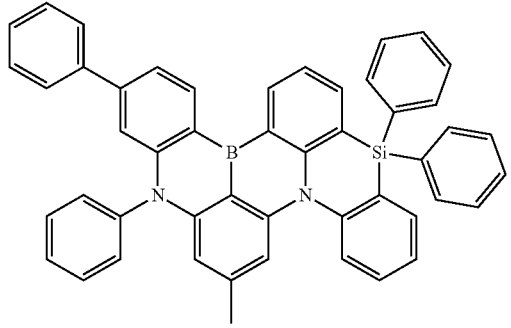

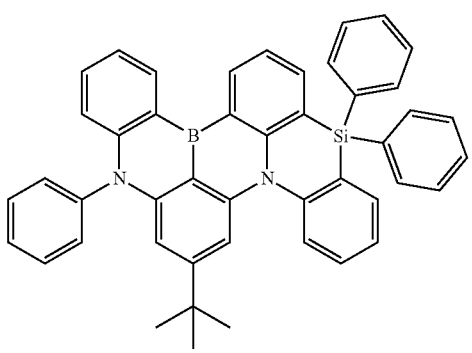

153
-continued
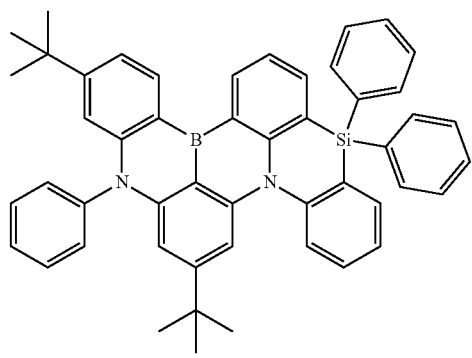
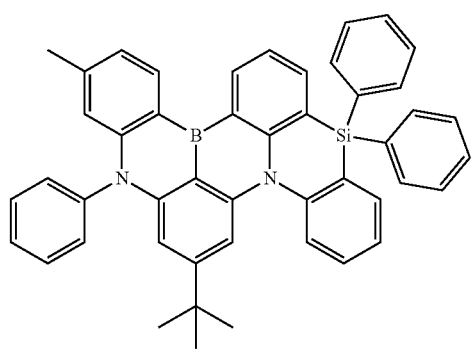
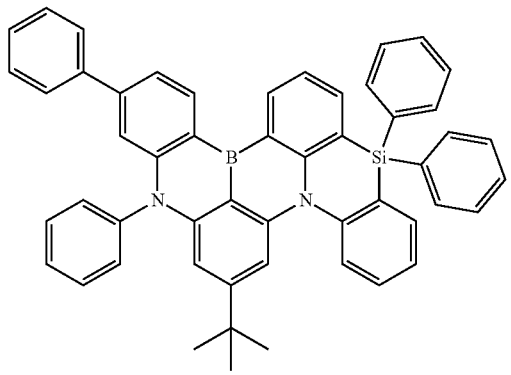
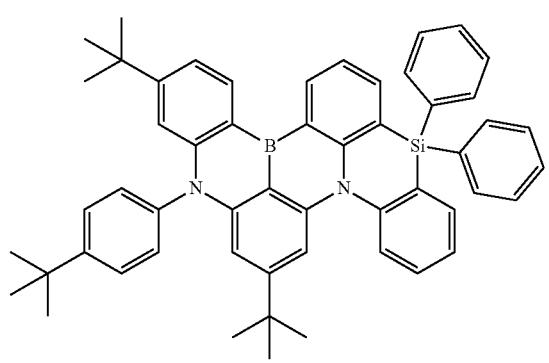
154
-continued
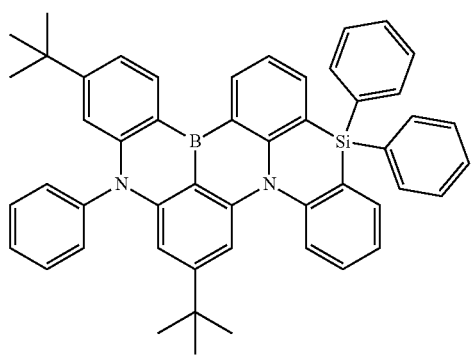
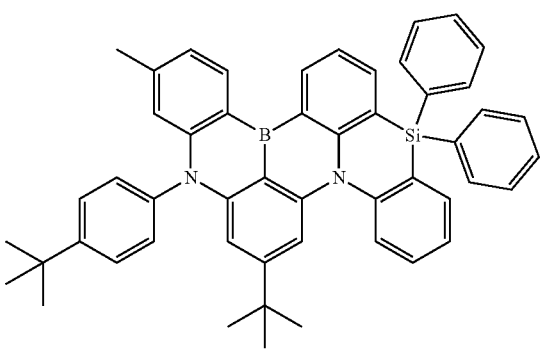
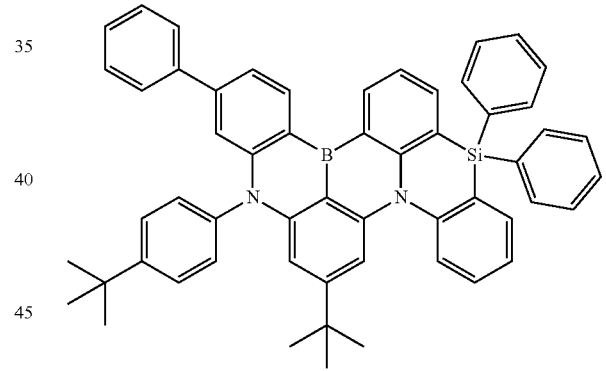
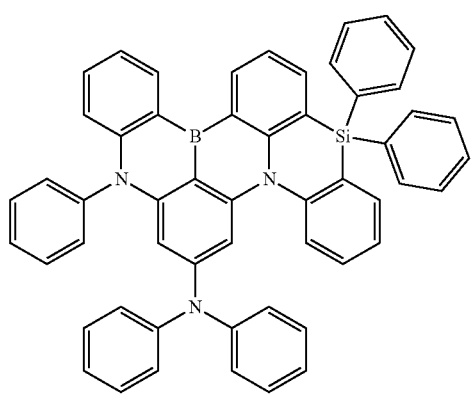

155
-continued
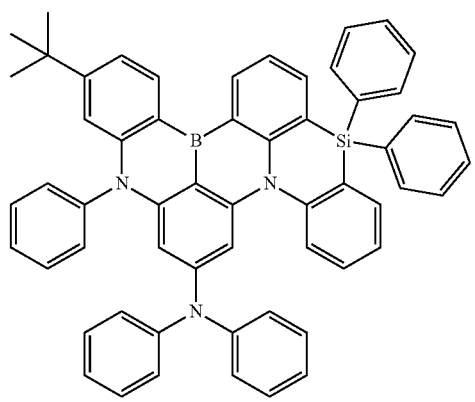
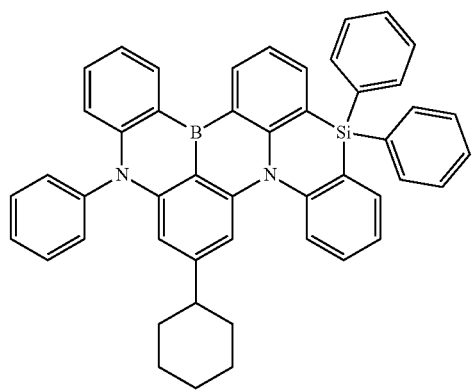
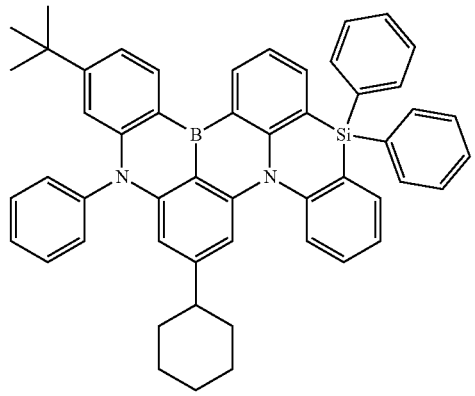
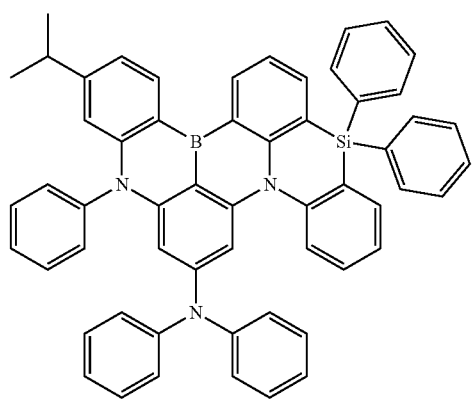
156
-continued
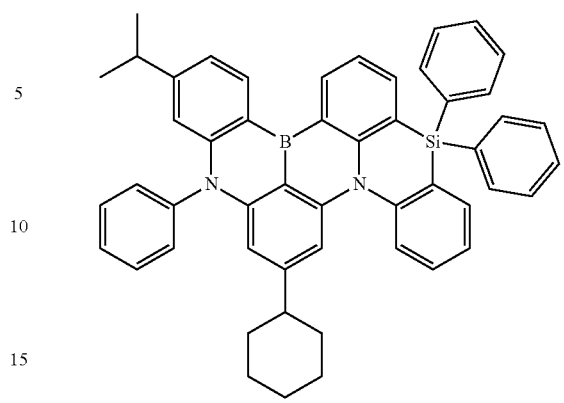
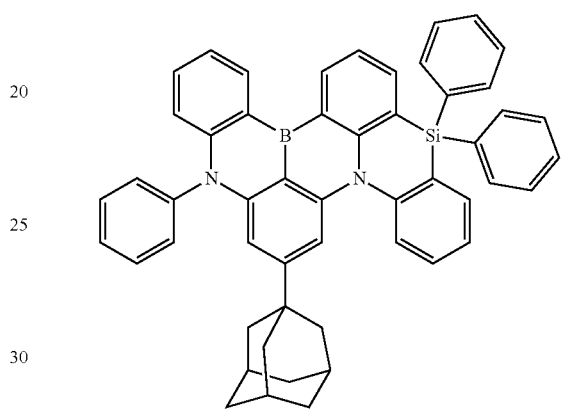
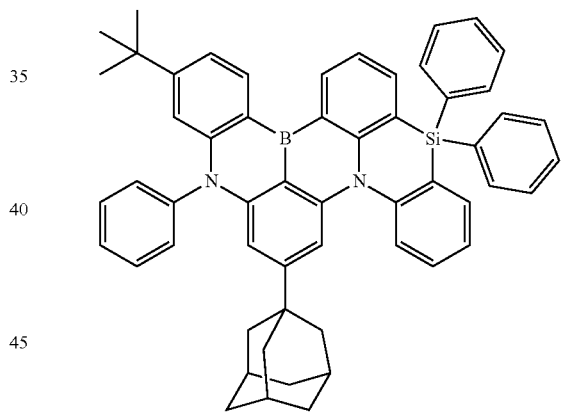
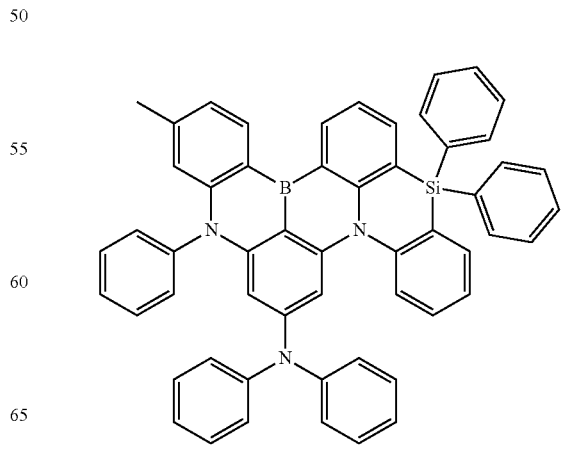

157
-continued
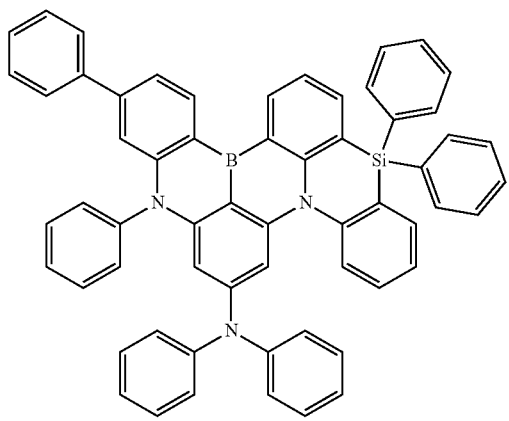
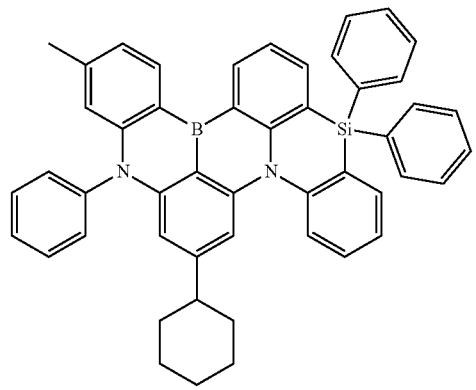
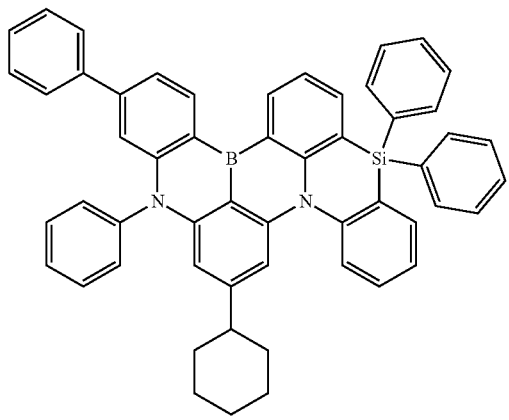
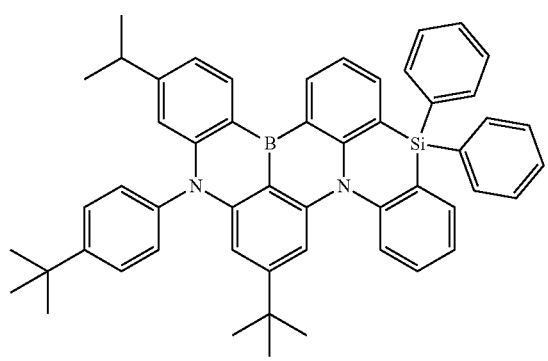
158
-continued
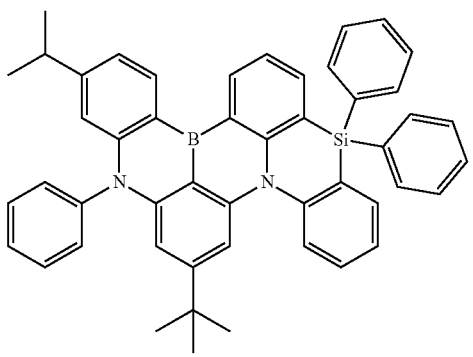
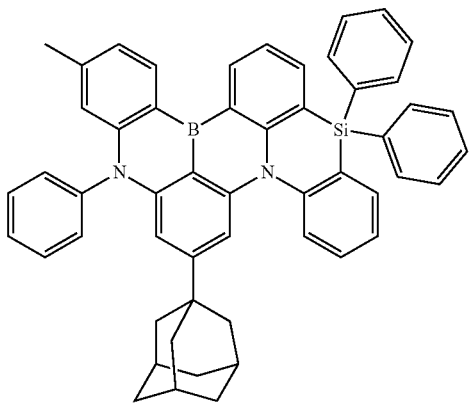
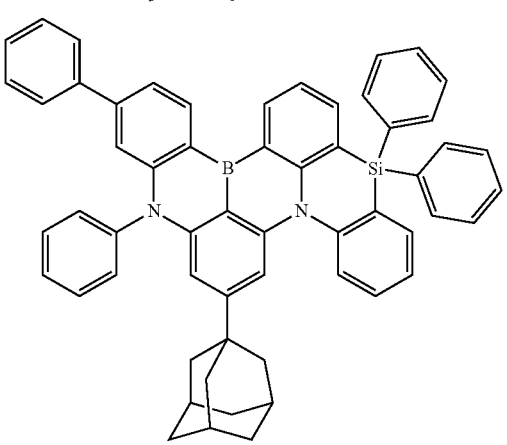
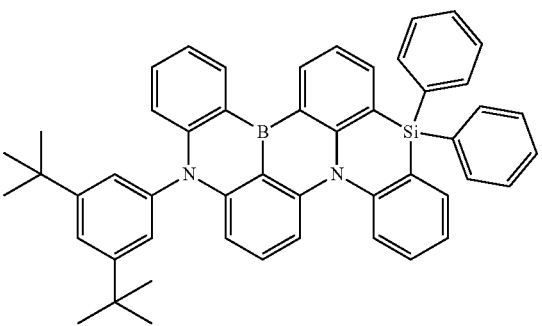

159
-continued
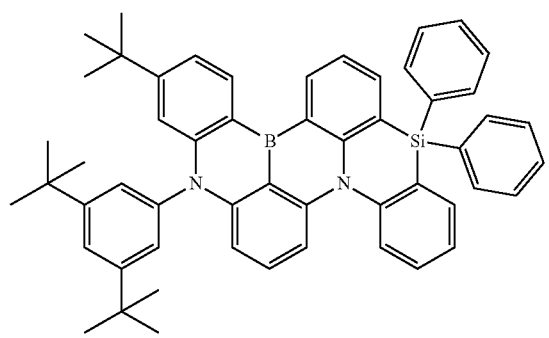
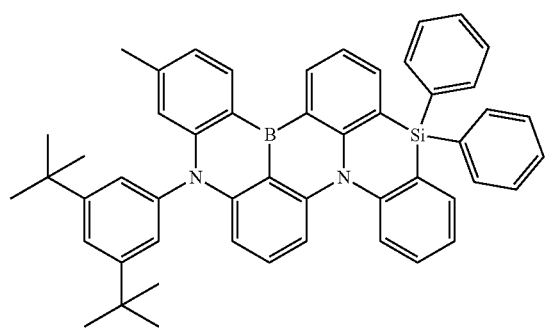
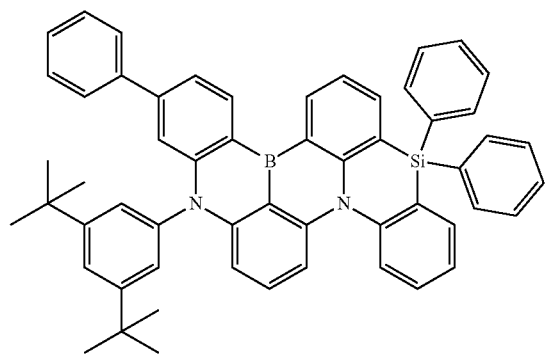
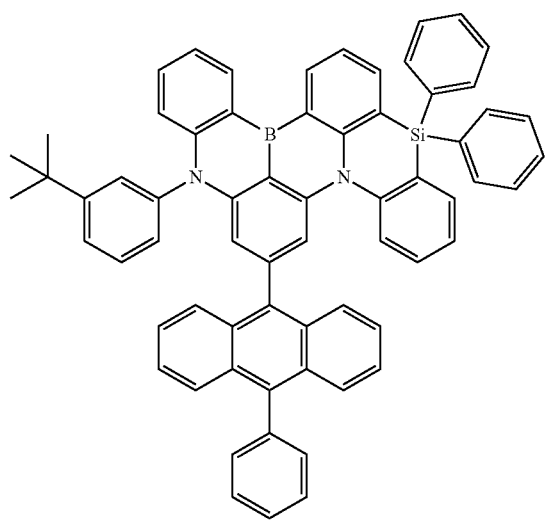
160
-continued
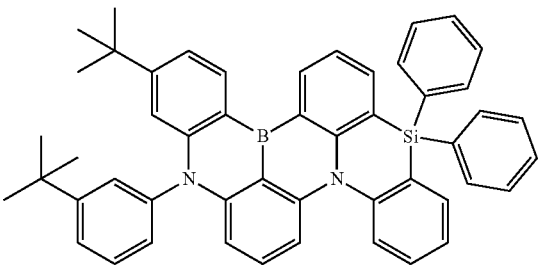
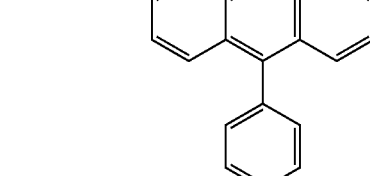
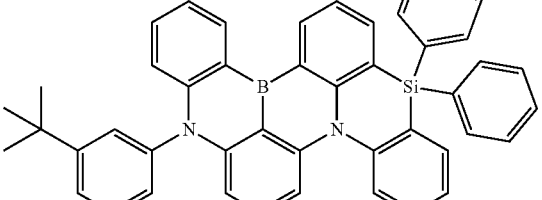
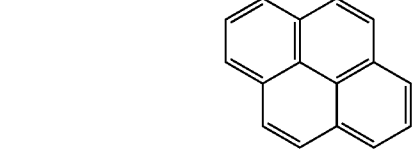
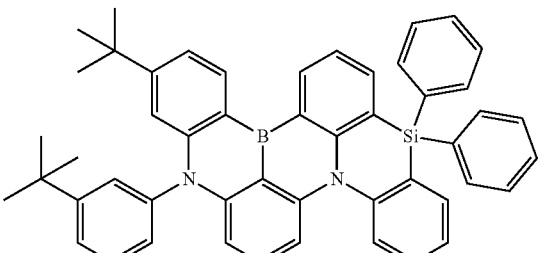
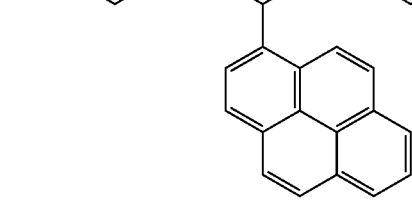

161
-continued
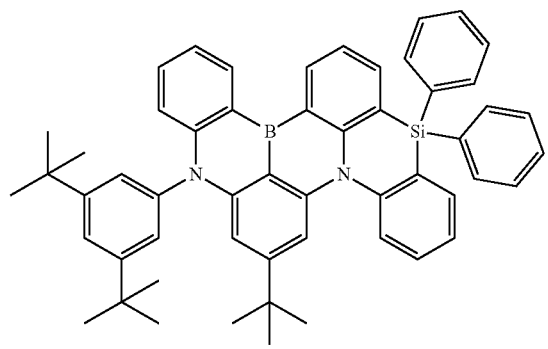
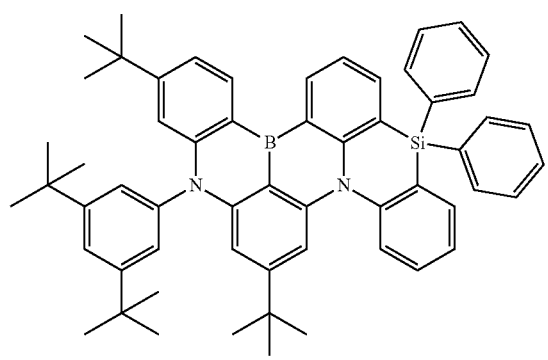
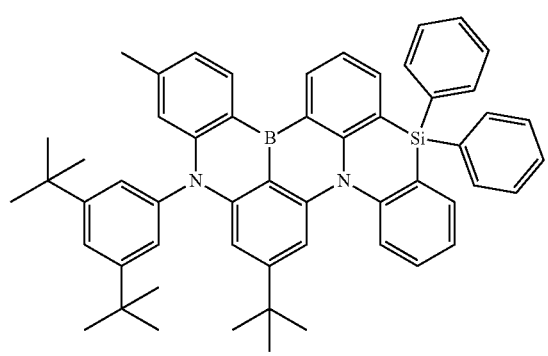
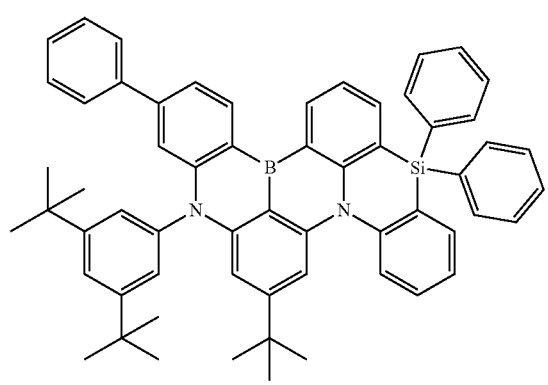
162
-continued
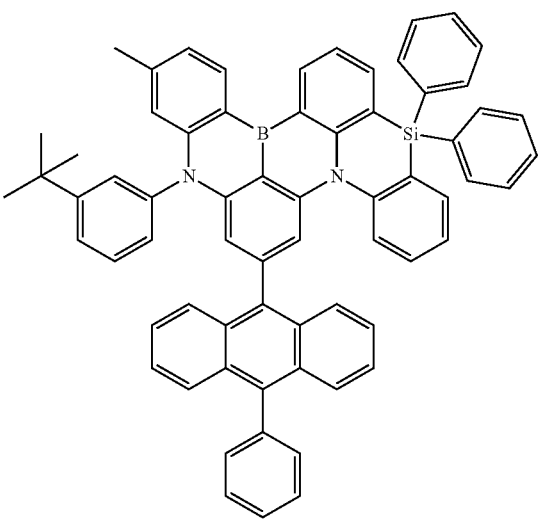
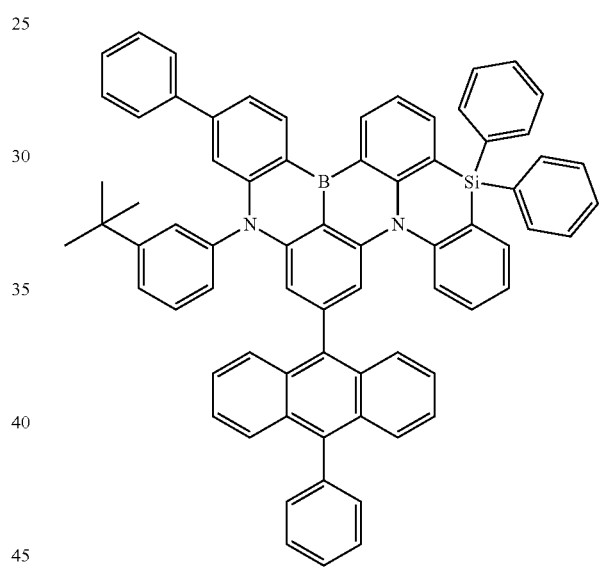
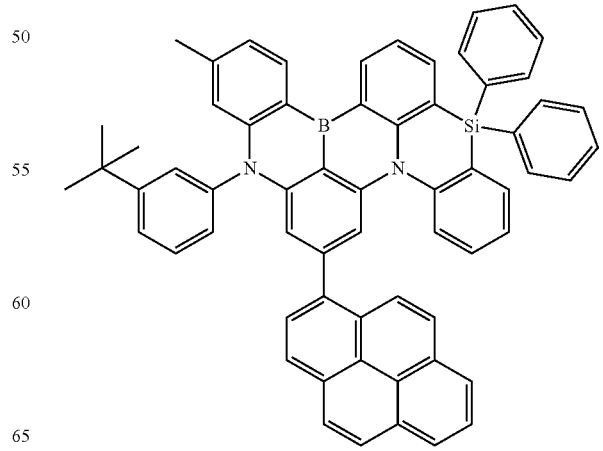

163
-continued
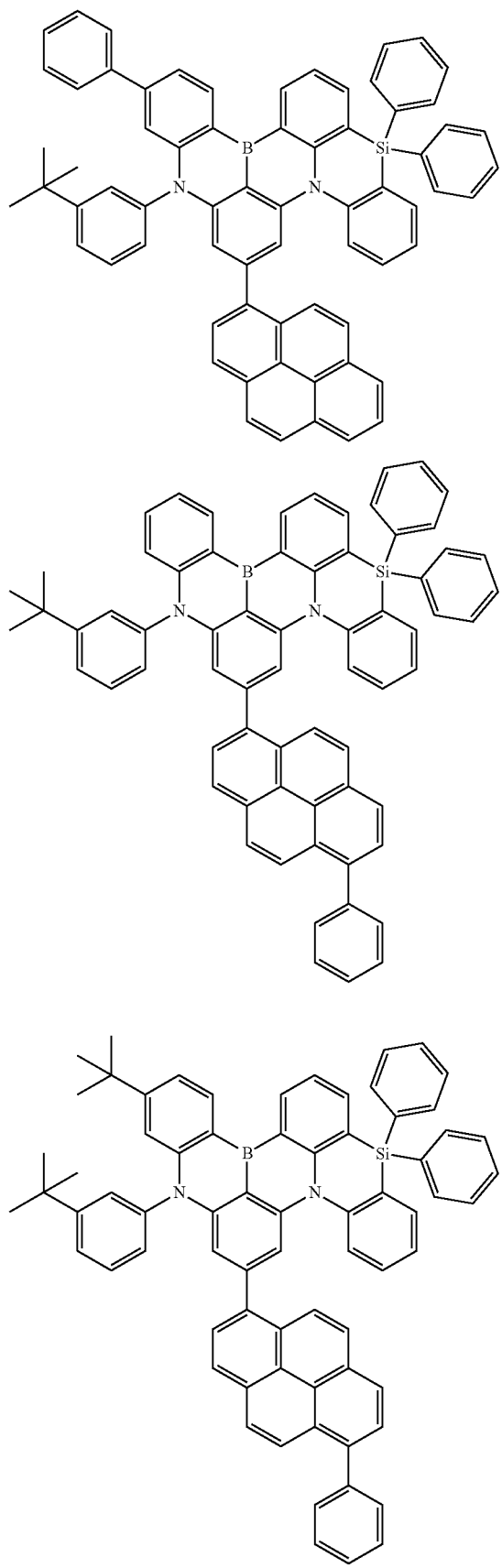
164
-continued
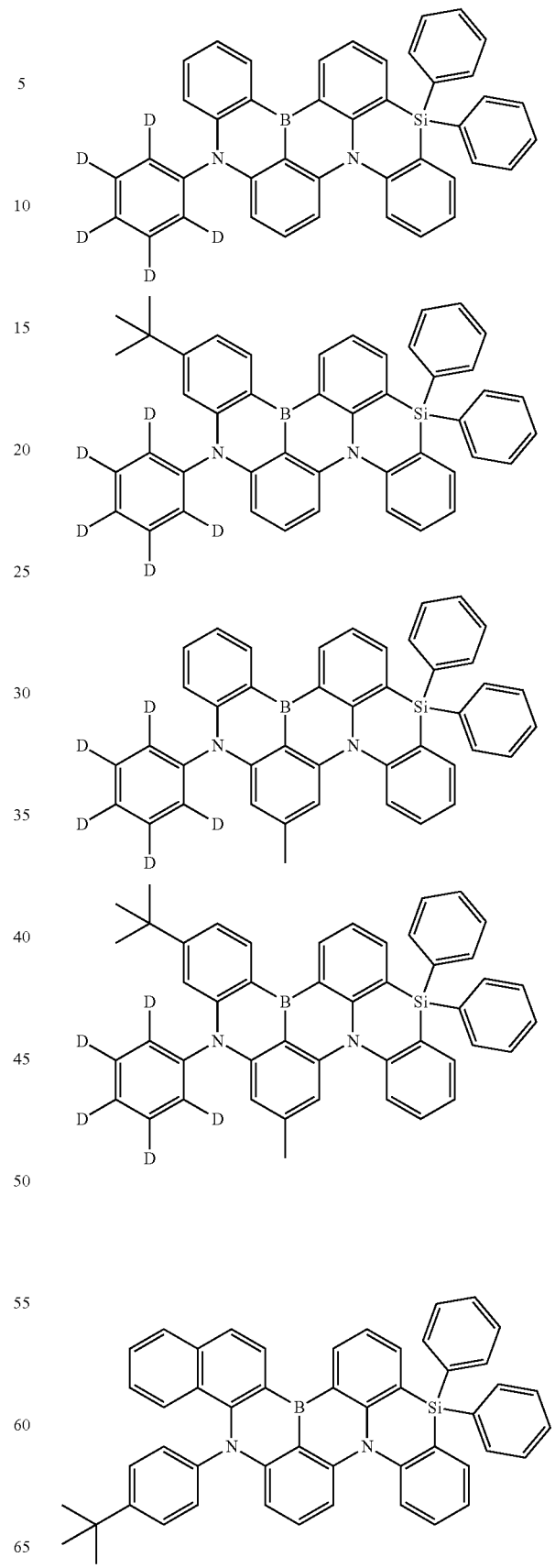

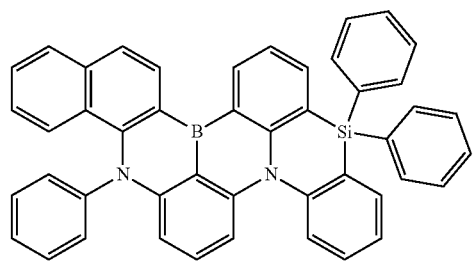
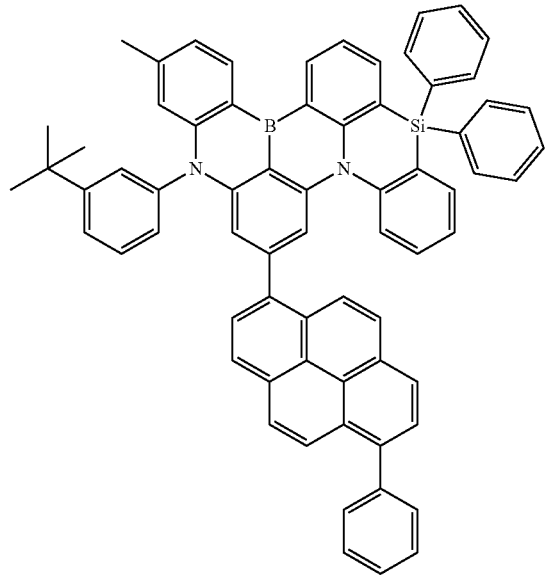
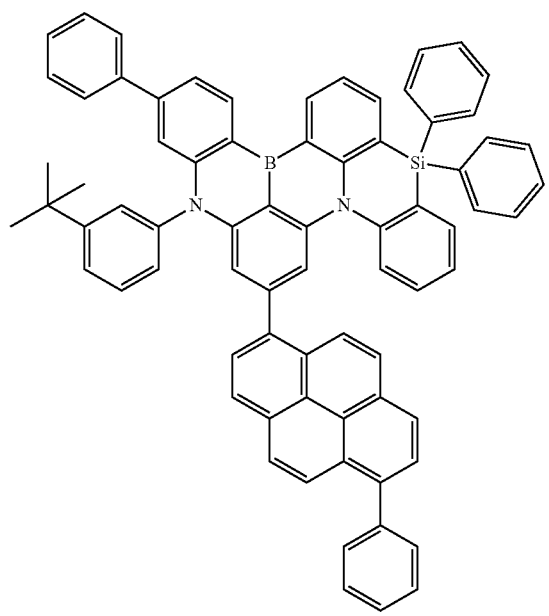
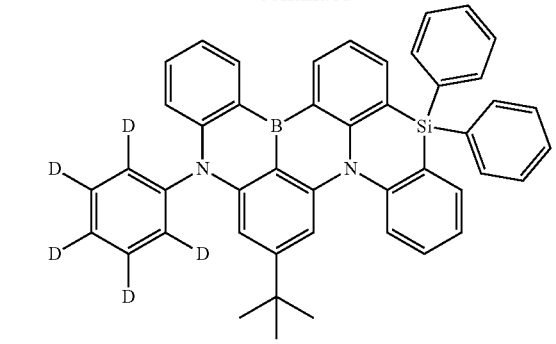
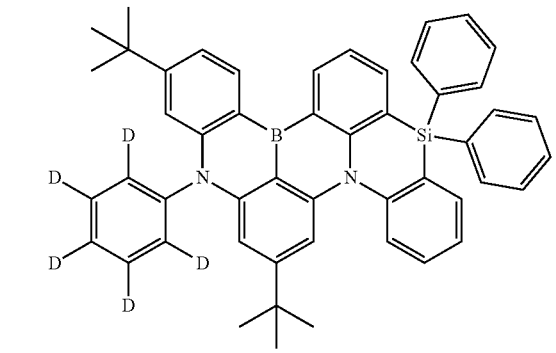
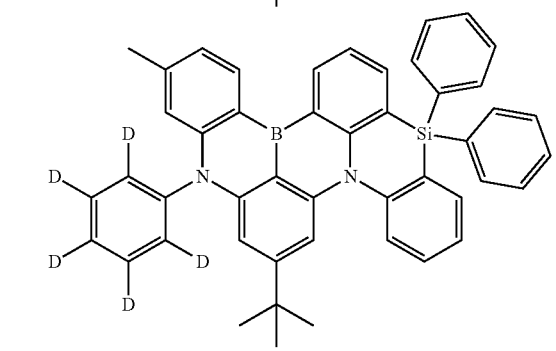
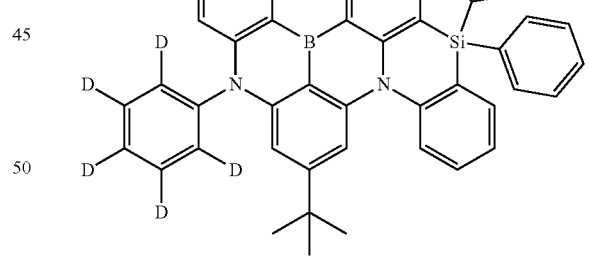
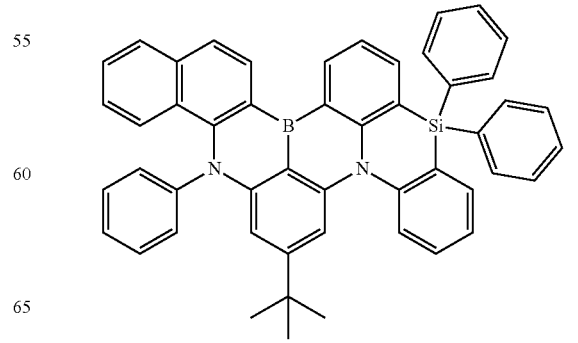

167
-continued
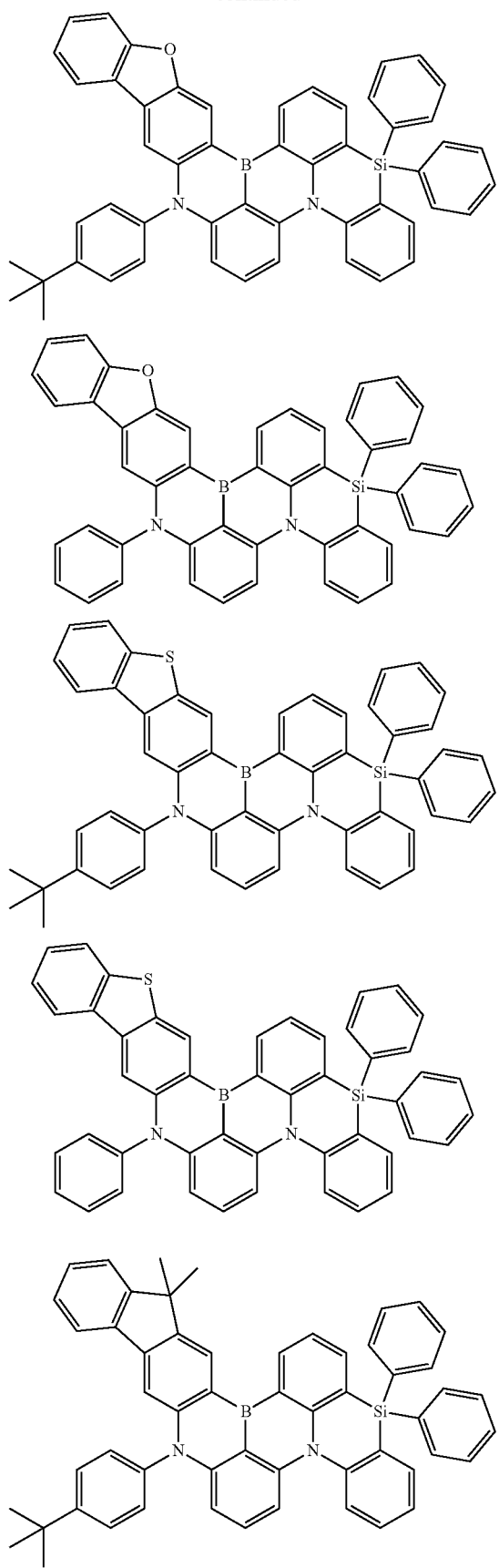
168
-continued
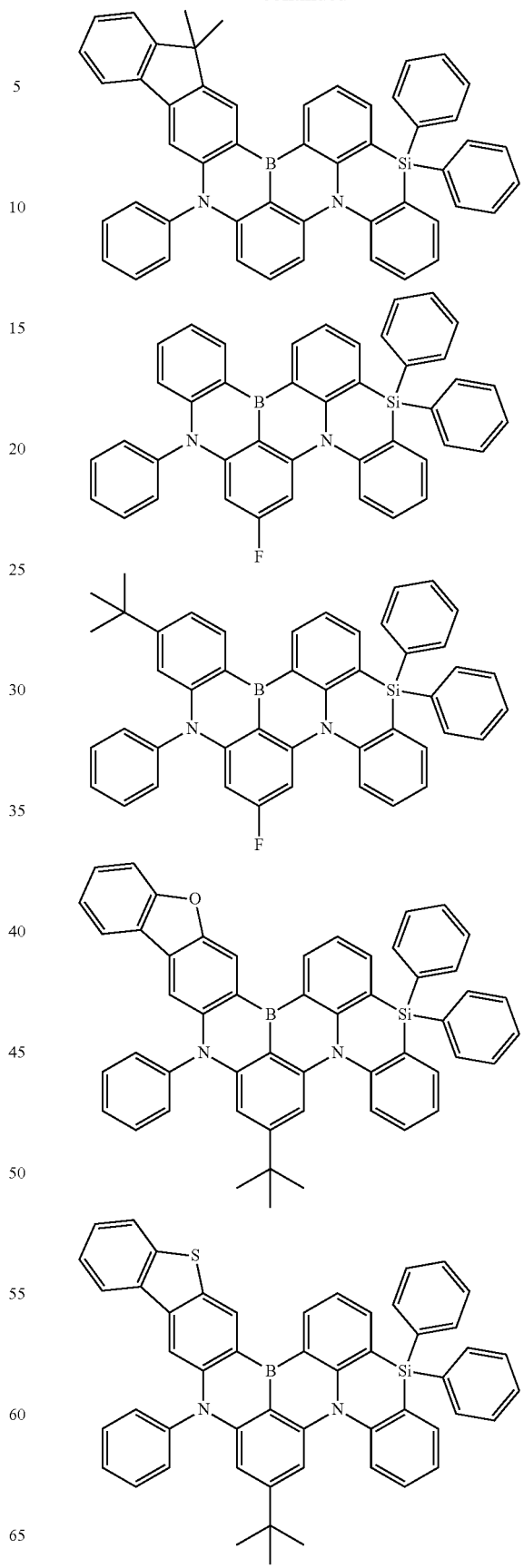

169
-continued
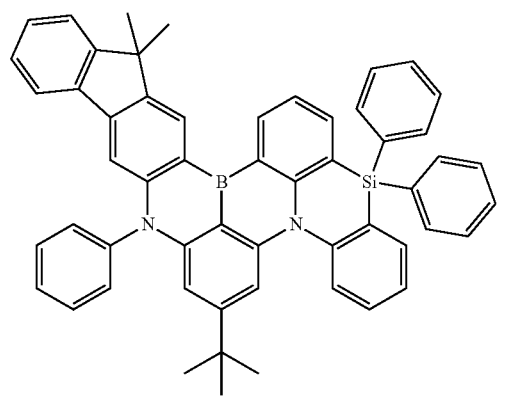
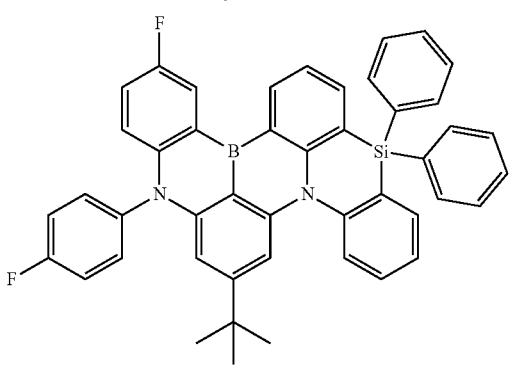
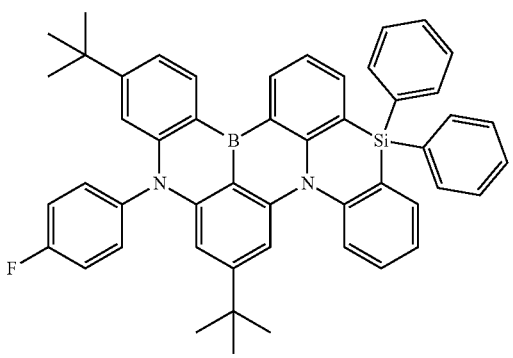
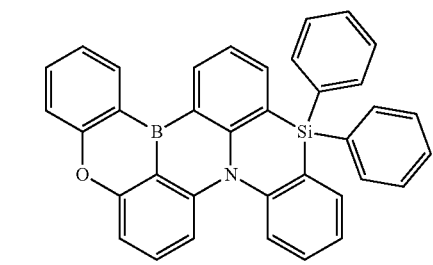
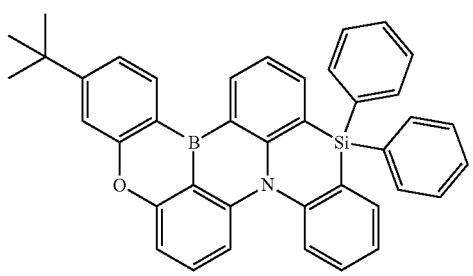
170
-continued
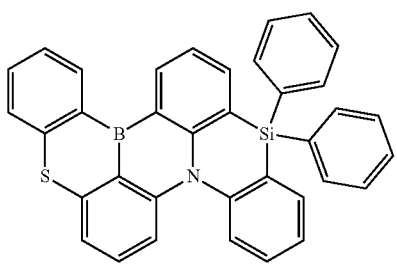
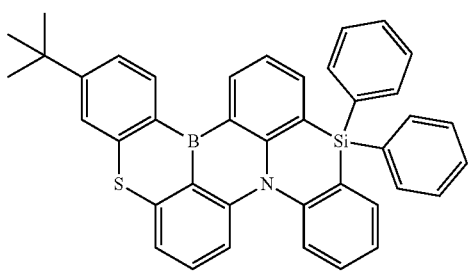
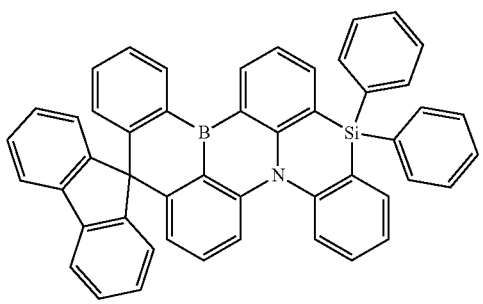
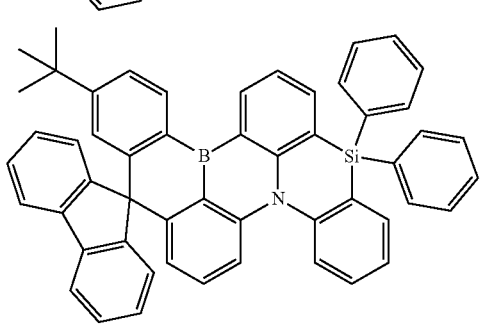
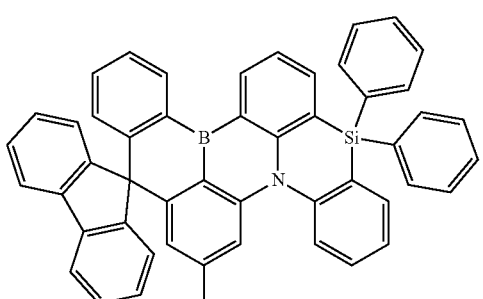
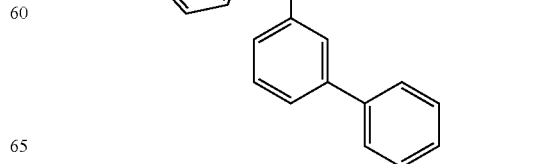

171
-continued
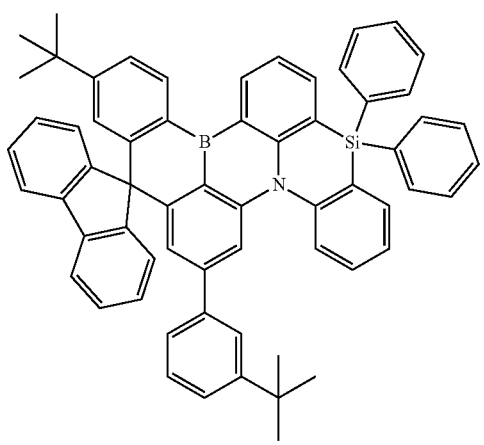
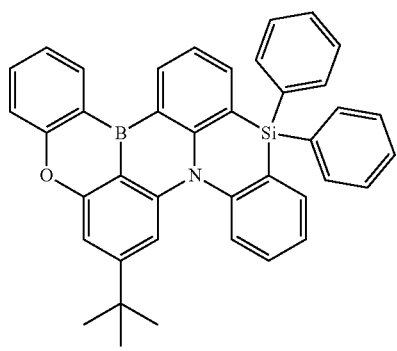
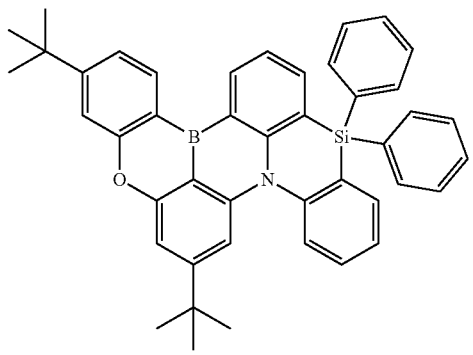
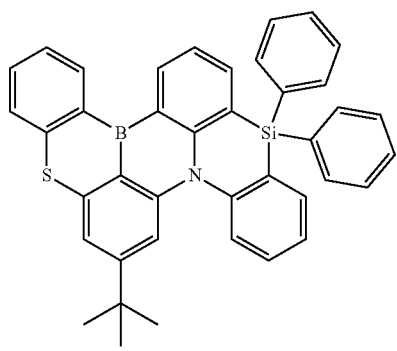
172
-continued
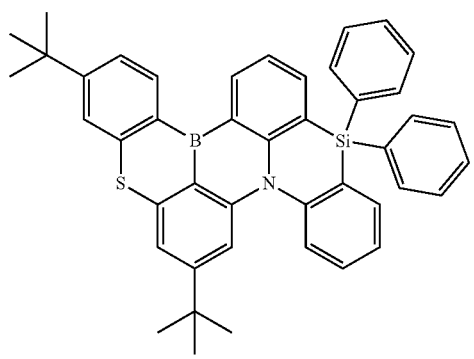
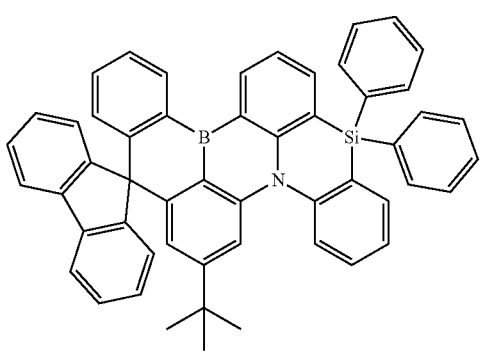
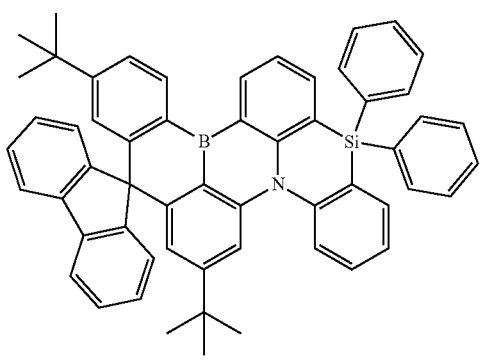
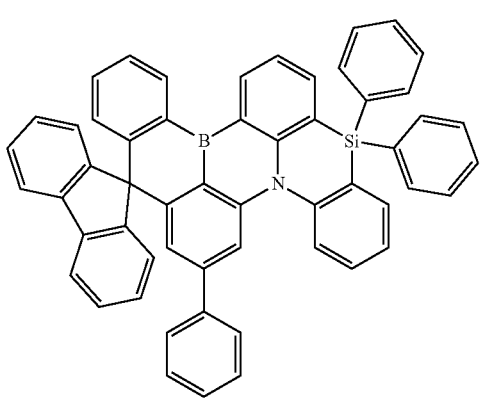

173
-continued
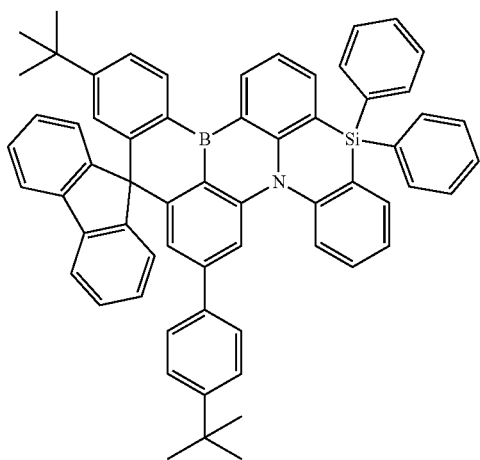
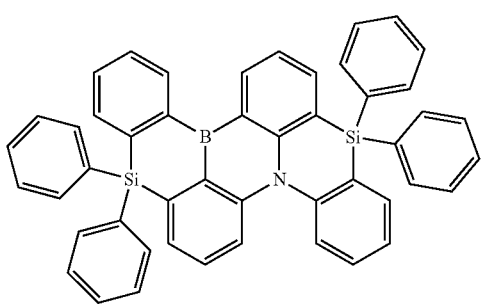
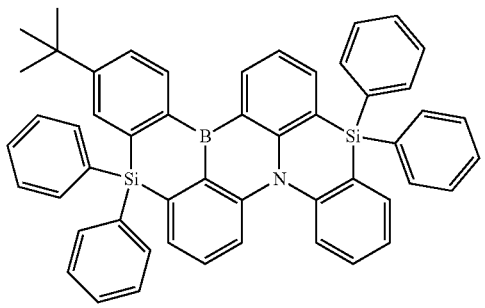
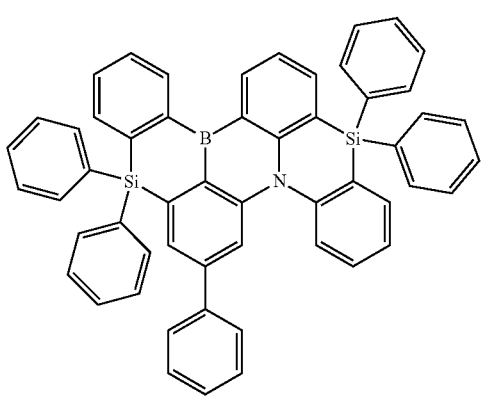
174
-continued
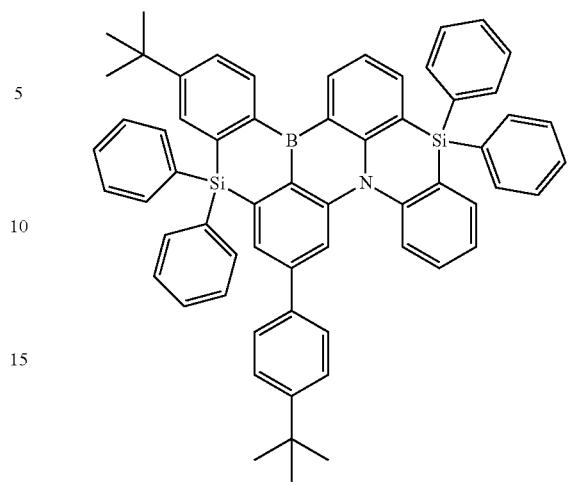
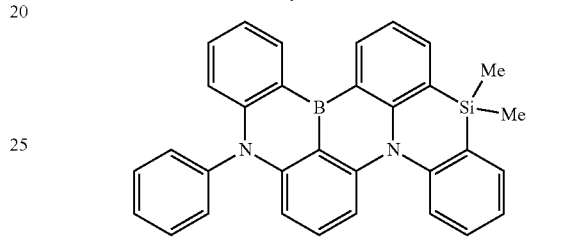
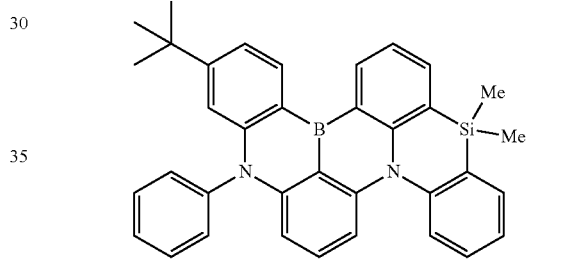
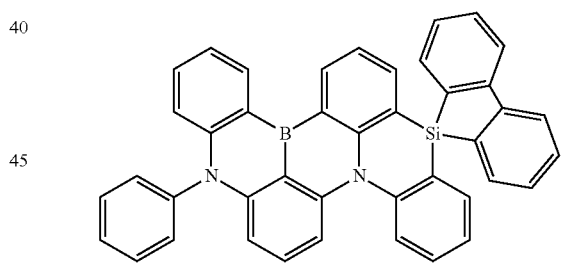
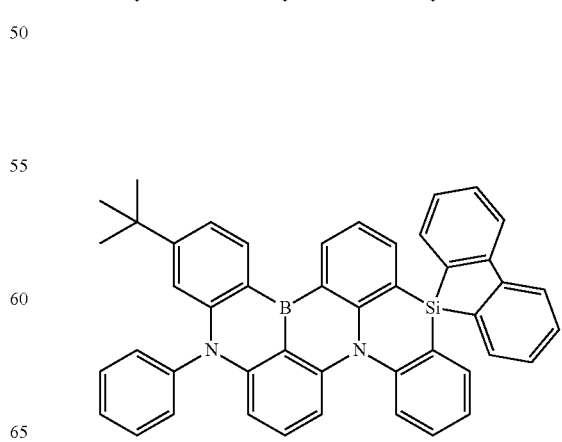

175
-continued
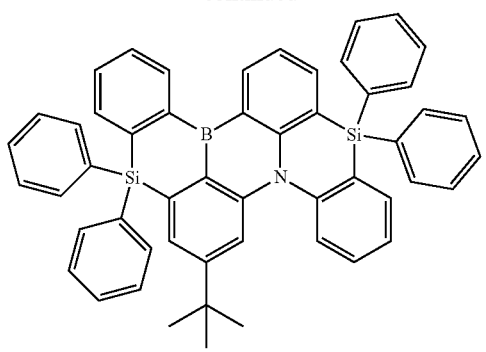
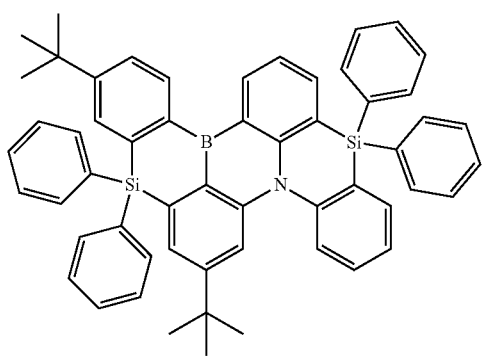
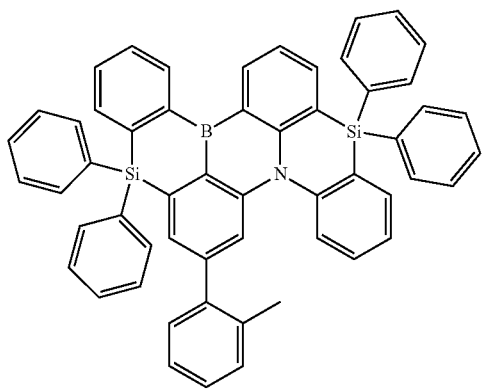
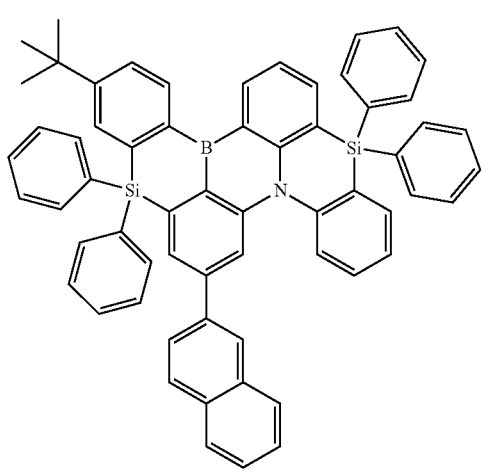
176
-continued
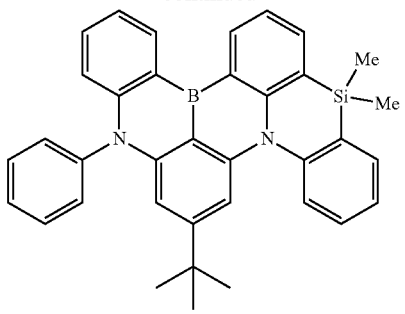
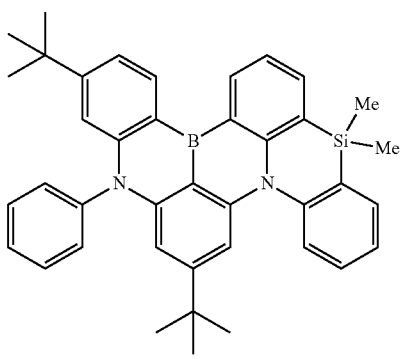
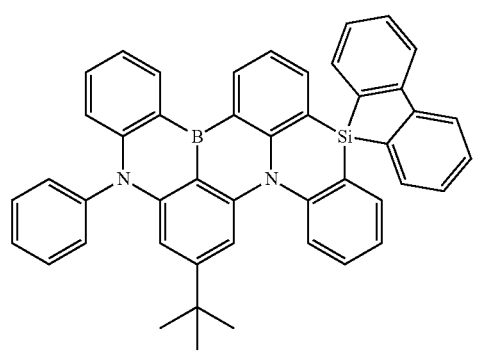
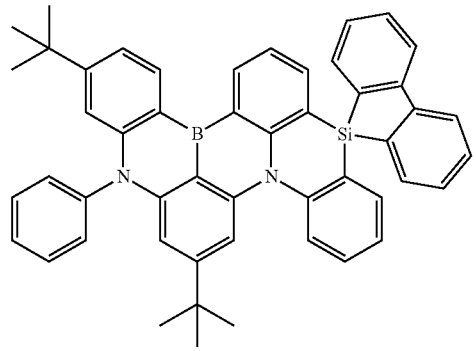
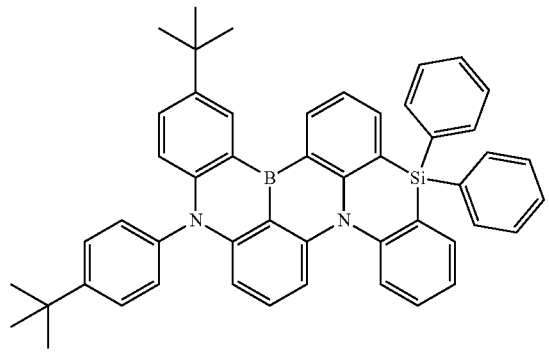

177
-continued
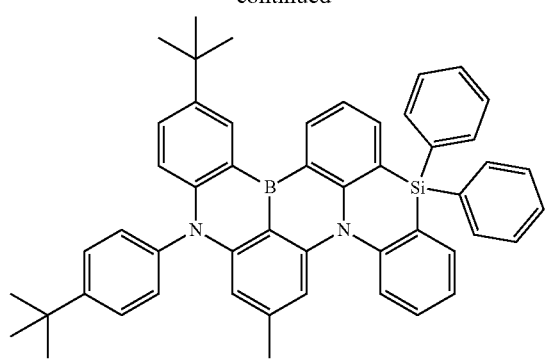
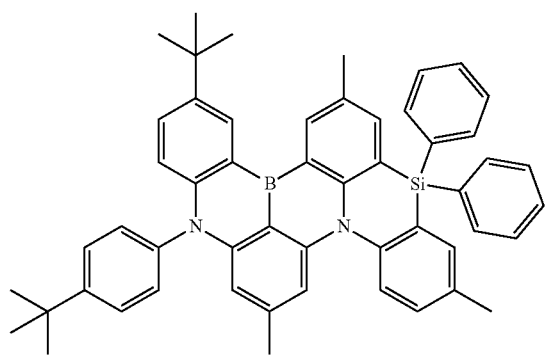
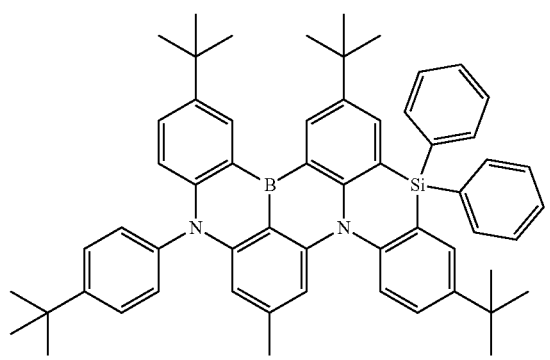
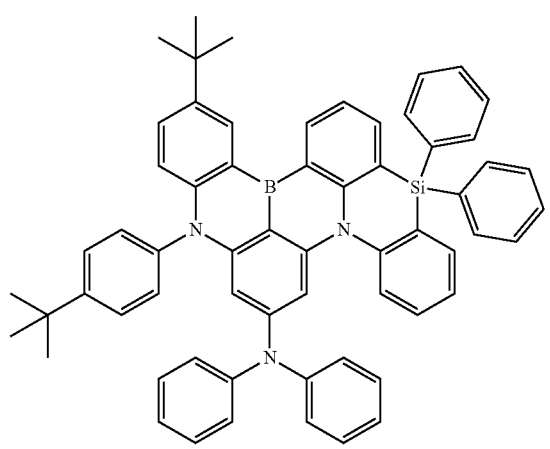
178
-continued
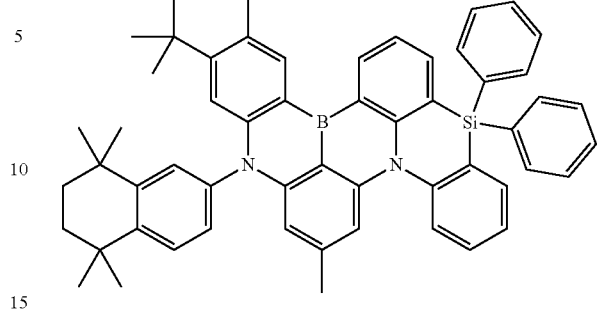
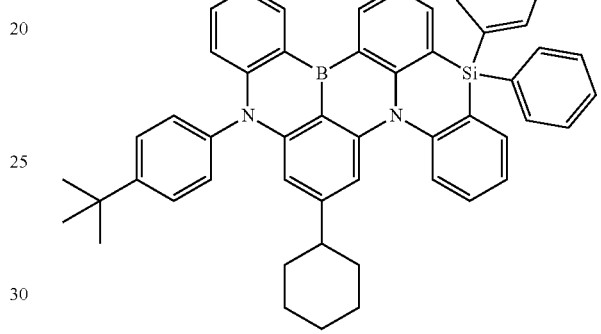
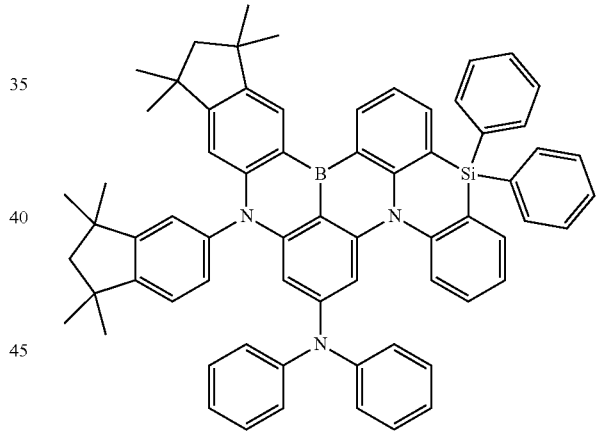
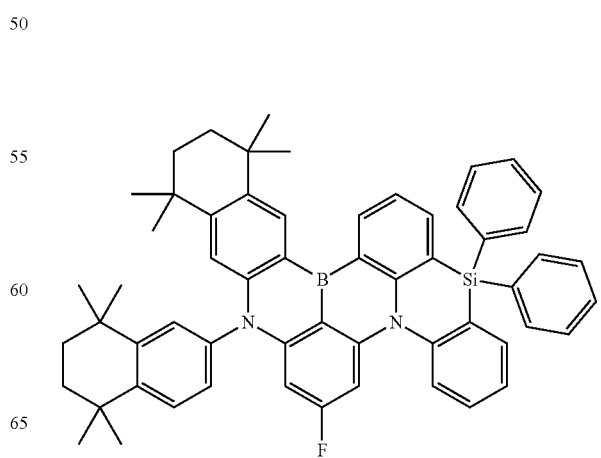

-continued

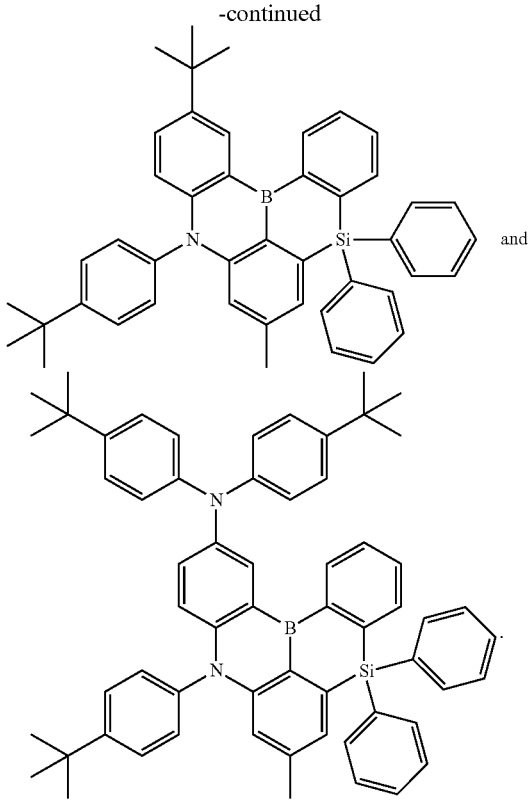 and

4. An organic light emitting device comprising:
a first electrode;
a second electrode provided to face the first electrode; and
an organic material layer having one or more layers provided between the first electrode and the second electrode,
wherein one or more of the one or more layers of the organic material layer comprise the compound of Formula 1 according to claim 1.

5. The organic light emitting device of claim 4, wherein the organic material layer comprises a hole transport layer or a hole injection layer, and the hole transport layer or the hole injection layer comprises the compound of Formula 1.

6. The organic light emitting device of claim 4, wherein the organic material layer comprises an electron transport layer or an electron injection layer, and the electron transport layer or the electron injection layer comprises the compound of Formula 1.

7. The organic light emitting device of claim 4, wherein the organic material layer comprises a light emitting layer, and the light emitting layer comprises the compound of Formula 1.

8. The organic light emitting device of claim 4, wherein the organic material layer comprises a light emitting layer, wherein the light emitting layer comprises a dopant, and wherein the dopant is a compound of Formula 1.

9. The organic light emitting device of claim 4, wherein one or more of the one or more layers of the organic material layer comprise a host, and wherein the host is a compound of Formula 4:

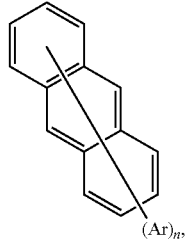

[Formula 4]

wherein in Formula 4:
Ar is a substituted or unsubstituted aryl group; or a substituted or unsubstituted heterocyclic group, and
n is an integer from 1 to 10.

* * * * *